(12) United States Patent
Ogura et al.

(10) Patent No.: US 7,382,662 B2
(45) Date of Patent: Jun. 3, 2008

(54) TWIN INSULATOR CHARGE STORAGE DEVICE OPERATION AND ITS FABRICATION METHOD

(75) Inventors: Seiki Ogura, Wappingers Falls, NY (US); Kimihiro Satoh, Hopewell Junction, NY (US); Tomoya Saito, Beacon, NY (US)

(73) Assignee: Halo LSI, Inc., Hillsboro, OR (US)

( * ) Notice: Subject to any disclaimer, the term of this patent is extended or adjusted under 35 U.S.C. 154(b) by 244 days.

(21) Appl. No.: 11/409,247

(22) Filed: Apr. 21, 2006

(65) Prior Publication Data

US 2006/0203562 A1 Sep. 14, 2006

Related U.S. Application Data

(62) Division of application No. 11/059,080, filed on Feb. 16, 2005, now Pat. No. 7,046,556, which is a division of application No. 10/685,873, filed on Oct. 15, 2003, now Pat. No. 6,900,098.

(60) Provisional application No. 60/418,454, filed on Oct. 15, 2002, provisional application No. 60/436,129, filed on Dec. 23, 2002.

(51) Int. Cl.
*G11C 11/34* (2006.01)
*H01L 23/58* (2006.01)

(52) U.S. Cl. .......................... 365/185.29; 365/185.33; 257/270; 257/640

(58) Field of Classification Search ........... 365/185.29, 365/185.33
See application file for complete search history.

(56) References Cited

U.S. PATENT DOCUMENTS

| | | | |
|---|---|---|---|
| 5,408,115 A | 4/1995 | Chang | |
| 6,040,995 A | 3/2000 | Reisinger et al. | |
| 6,255,166 B1 | 7/2001 | Ogura et al. | |
| 6,356,482 B1 | 3/2002 | Derhacobian et al. | |
| 6,469,935 B2 | 10/2002 | Hayashi | |
| 6,498,377 B1 | 12/2002 | Lin et al. | |
| 6,531,350 B2 | 3/2003 | Satoh et al. | |
| 6,756,271 B1 | 6/2004 | Satoh et al. | |
| 7,139,193 B2 * | 11/2006 | Kanai | 365/185.05 |

(Continued)

OTHER PUBLICATIONS

"A Novel MONOS Nonvolatile Memory Device Ensuring 10-Year, Data Retention after 10th Erase/Write Cycles," Shin-inch. Minami et al., IEEE Trans. on Electron Devices, vol. 40, No. 11, Nov. 1993, pp. 2011-2017.

"Hole and Electron Current Transport in Metal-Oxide-Nitride-Oxide-Silicon Memory Structures," by Eichi Suzuki et al., IEEE Trans. on Electron Dev., vol. 36, No. 6, Jun. 1989, pp. 1145-1149.

(Continued)

*Primary Examiner*—Lý Duy Pham
(74) *Attorney, Agent, or Firm*—Saile Ackerman LLC; Stephen B. Ackerman; Rosemary L. S. Pike

(57) ABSTRACT

The invention proposes am improved twin MONOS memory device and its fabrication. The ONO layer is self-aligned to the control gate horizontally. The vertical insulator between the control gate and the word gate does not include a nitride layer. This prevents the problem of electron trapping. The device can be fabricated to pull the electrons out through either the top or the bottom oxide layer of the ONO insulator. The device also incorporates a raised memory bit diffusion between the control gates to reduce bit resistance. The twin MONOS memory array can be embedded into a standard CMOS circuit by the process of the present invention.

3 Claims, 44 Drawing Sheets

U.S. PATENT DOCUMENTS

2002/0067641 A1* 6/2002 Ogura et al. ........... 365/185.29
2005/0020013 A1* 1/2005 Moriya et al. .............. 438/262

OTHER PUBLICATIONS

"A True Single-Transistor Oxide-Nitride-Oxide EEPROM Device," by T.Y. Chan et al., IEEE Electron Device Letters, vol. EDL-8, No. 3, Mar. 1987, pp. 93-95.

"Flash Memories," by Paulo Cappelletti et al., Kluwer Academic Publishers 1999, pp. 217-223.

K.T. Chang et al., "A New SONOS Memory Using Source-Side Injection for Programming," IEEE Electron Device Letters, vol. 19, No. 7, Jul. 1998, pp. 253-255.

B. Eitan et al., Inter national Conf. on Solid State Devices and Materials 1999, p. 522.

* cited by examiner

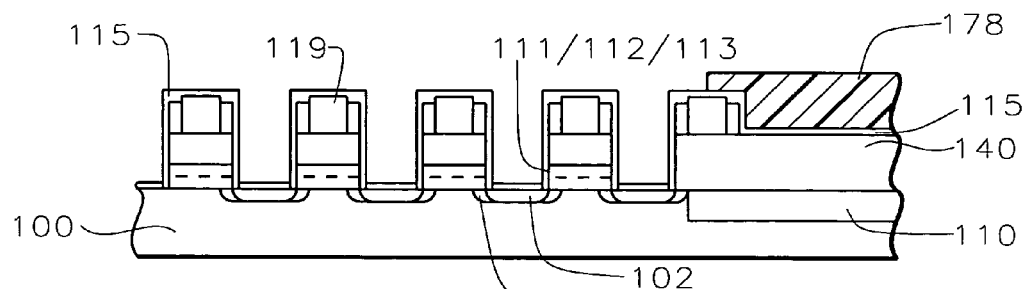
FIG. 12B1
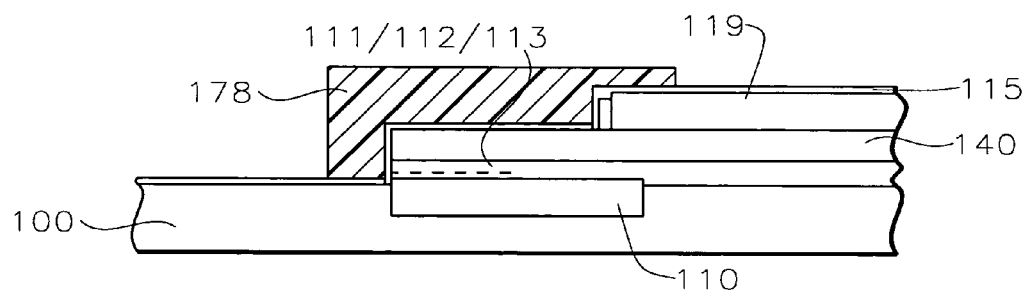
FIG. 12C1
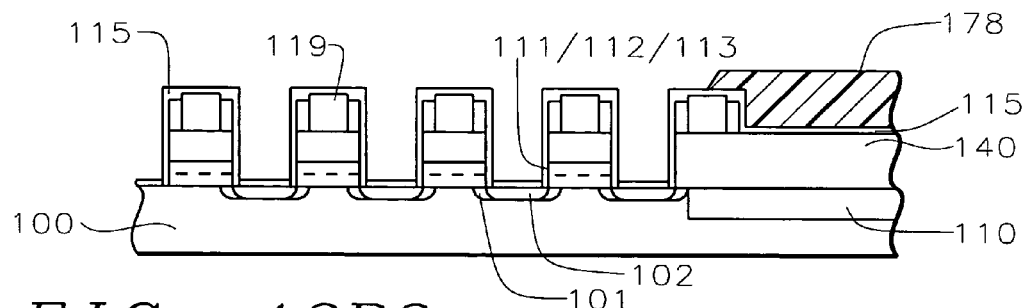
FIG. 12B2
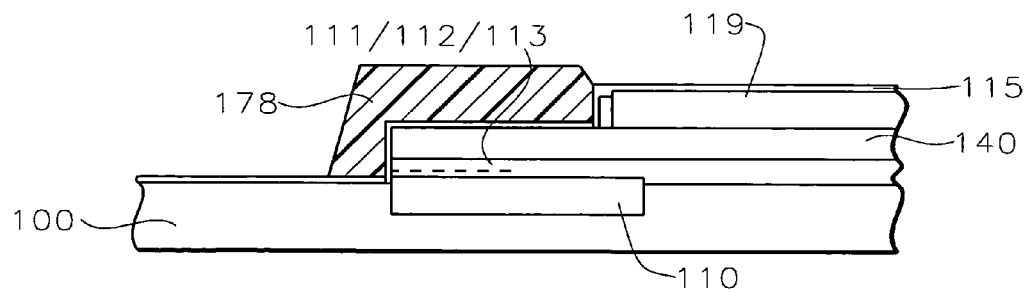
FIG. 12C2

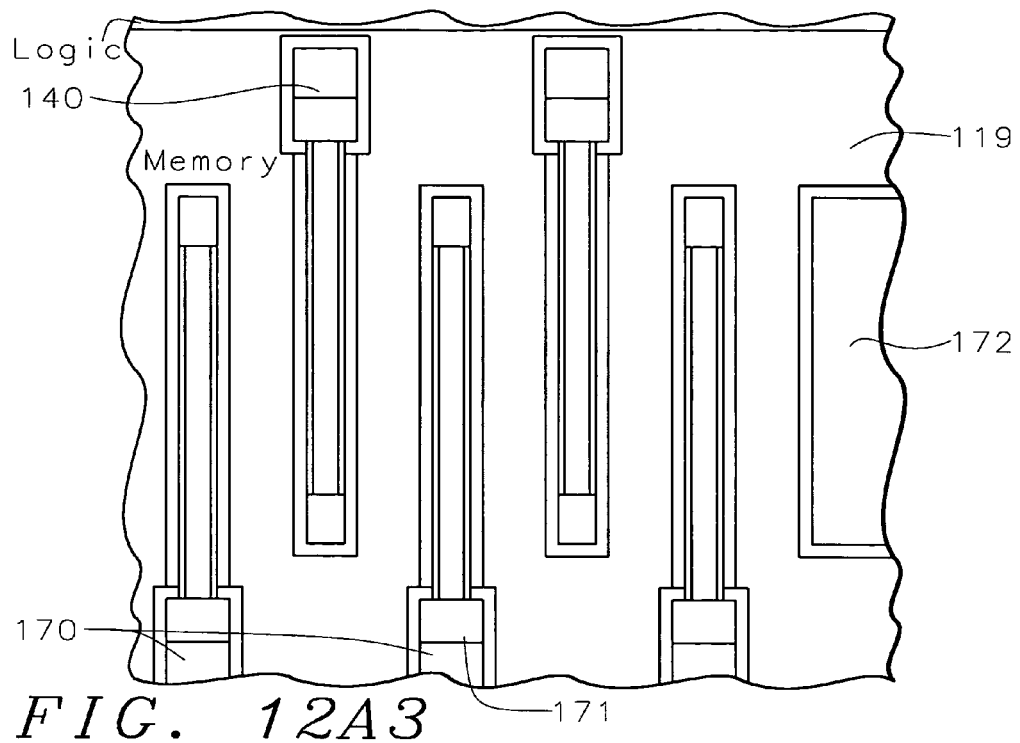
FIG. 12A3
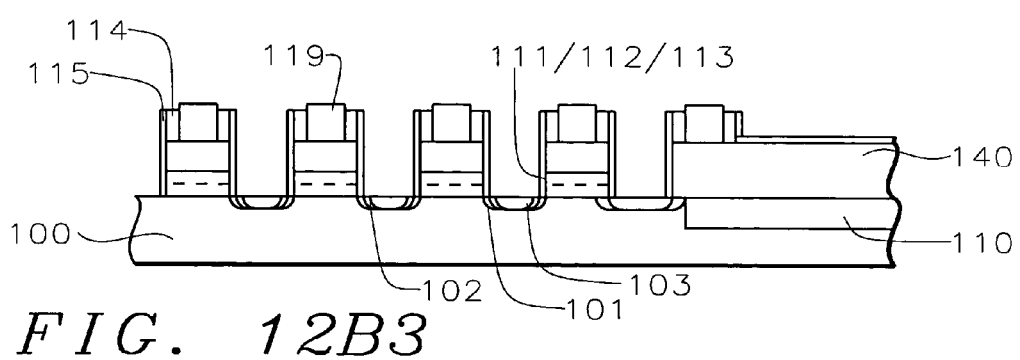
FIG. 12B3
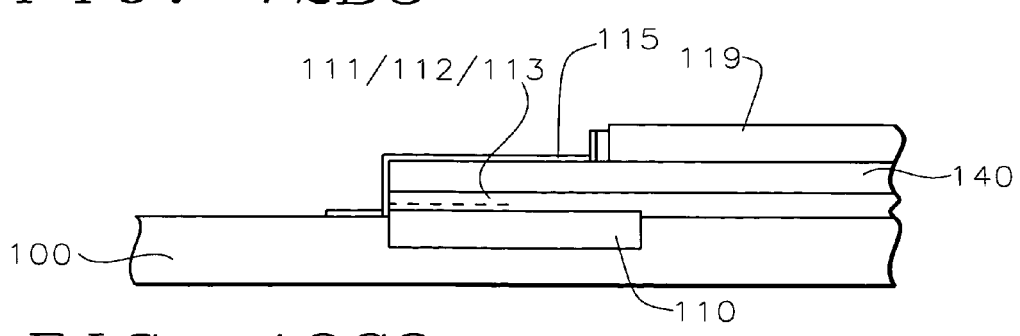
FIG. 12C3

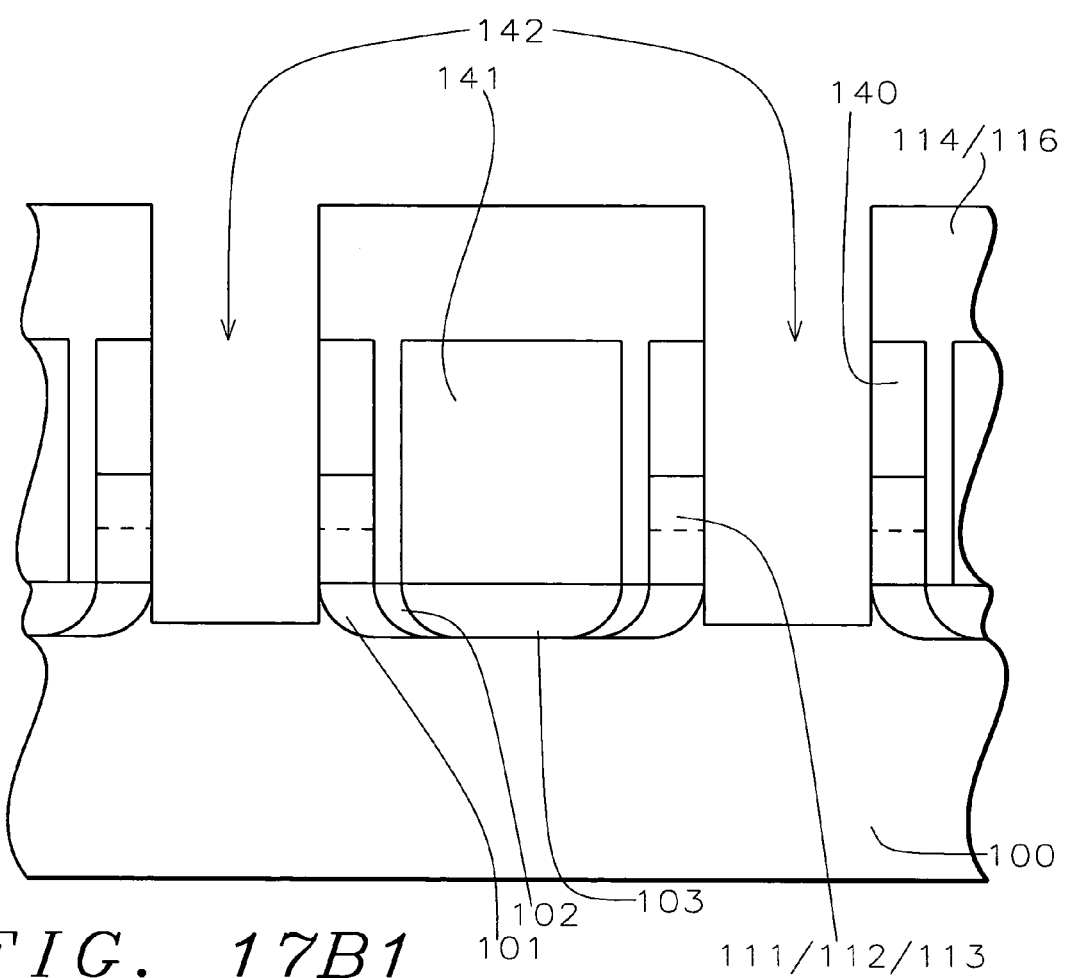
FIG. 17B1

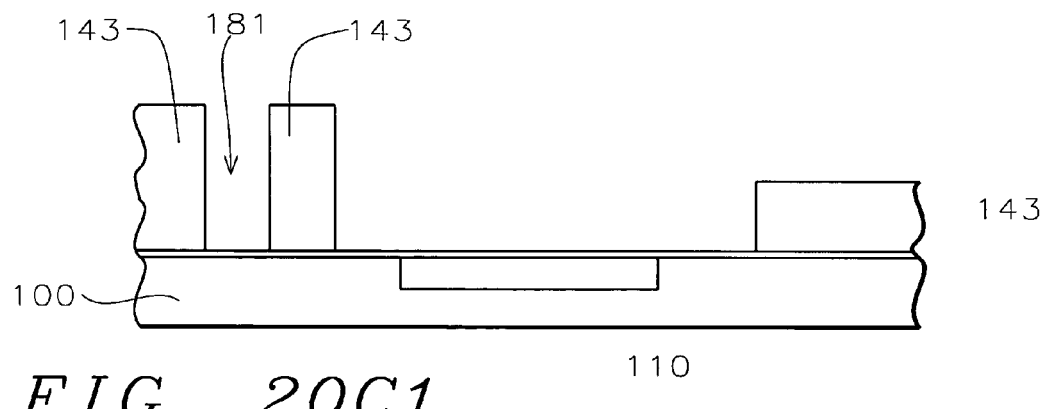
FIG. 20C1
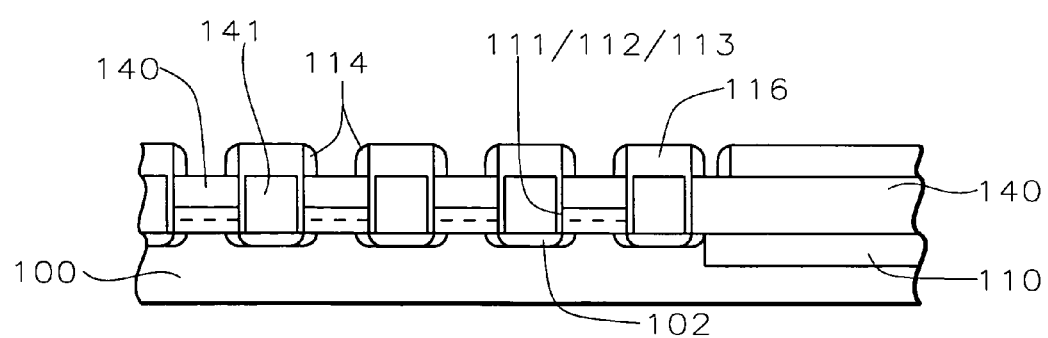
FIG. 21

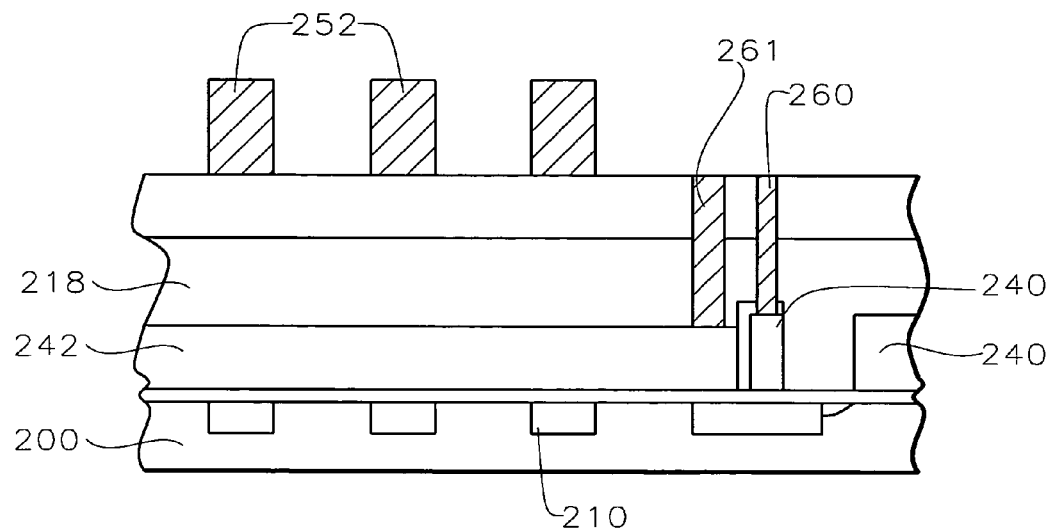
FIG. 29C
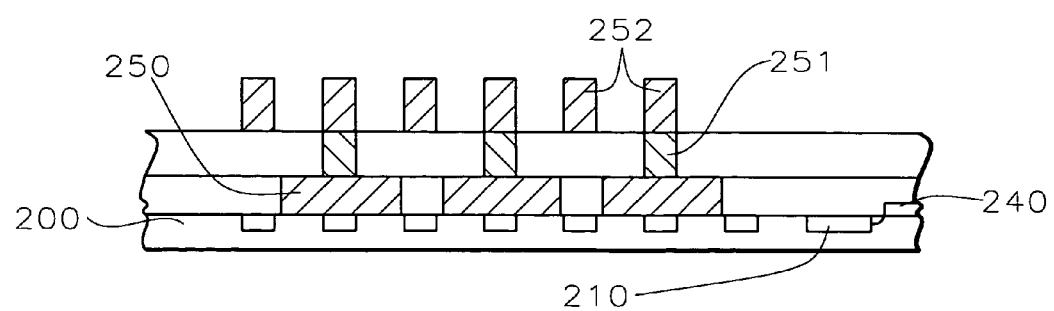
FIG. 29C1

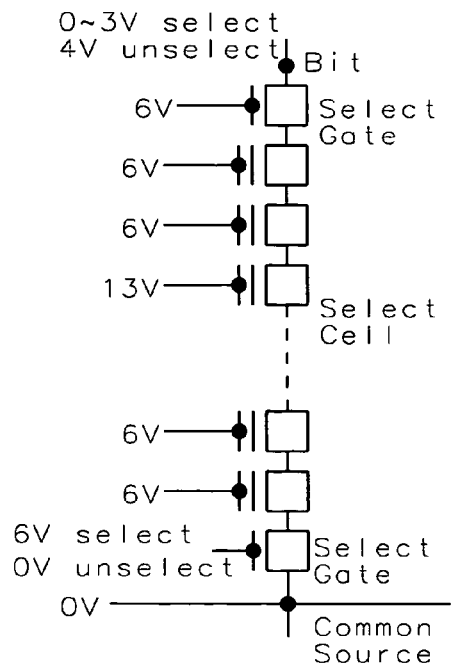
*FIG. 32A1*
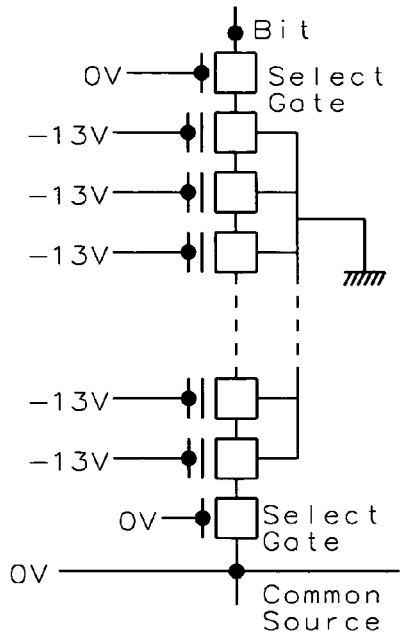
*FIG. 32A2*
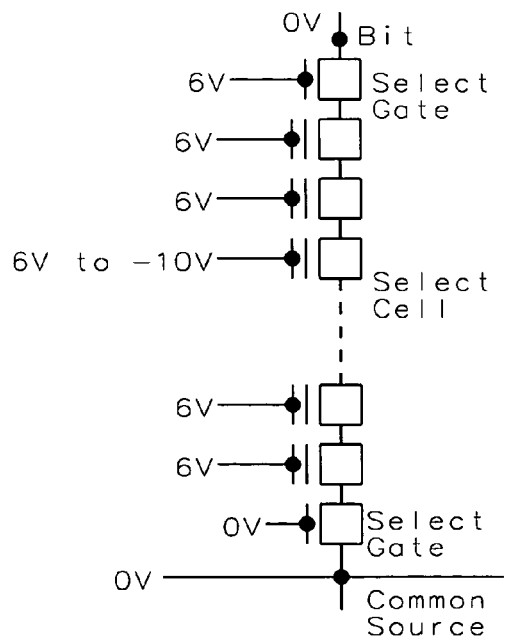
*FIG. 32B1*
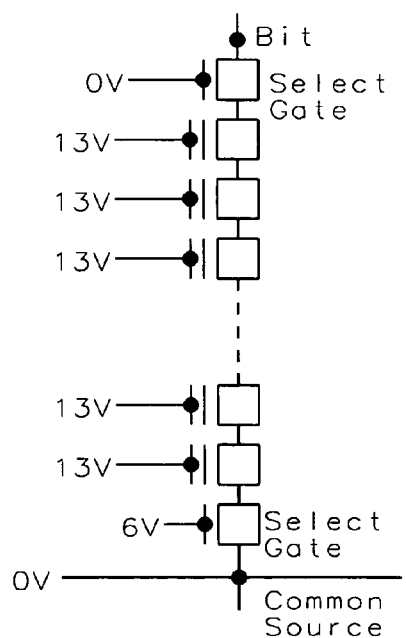
*FIG. 32B2*

TWIN INSULATOR CHARGE STORAGE DEVICE OPERATION AND ITS FABRICATION METHOD

This is a Divisional application of U.S. patent application Ser. No. 11/059,080, filed on Feb. 16, 2005, now issued as U.S. Patent No. 7,046,556 which is herein incorporated by reference in its entirety and assigned to a common assignee, and which is a divisional application of U.S. patent application Ser. No. 10/685,873, filed on Oct. 15, 2003, now issued as U.S. Pat. No. 6,900,098, which claims priority to U.S. Provisional Patent application Ser. No. 60/418,454 filed on Oct. 15, 2002 and U.S. Provisional Patent Application Ser. No. 60/436,129 filed on Dec. 23, 2002.

BACKGROUND OF THE INVENTION

(1) Field of the Invention

The Invention relates to a high-density non-volatile memory device using Twin-MONOS structure, and its fabrication method.

(2) Description of the Prior Art

An insulator charge storage device is a type of non-volatile memory in which charge is stored within the traps of an insulator material. Electrons may be injected into the insulator by either channel hot electron (CHE) or tunneling. Electrons are usually eliminated via some type of hole injection mechanism in a MONOS device contrasting to FN ejection in a floating gate silicon device. In a MONOS device, nitride is the storage element. When the bottom oxide is as thin as or less than 23 Angstroms, holes are injected by a direct tunneling mechanism (S. Minami et. al., "A Novel MONOS Nonvolatile Memory Device Ensuring 10-Year Data Retention after $10^7$ Erase/Write Cycles", *IEEE Transactions on Electron Device*, VOL. 40, No. 11, November 1993, p.p. 2011-2017 and E. Suzuki, Y. Hayashi et. al., "Hole and Electron Current Transport in Metal-Oxide-Nitride-Oxide-Silicon Memory Structures", *IEEE Transactions on Electron Device*, VOL. 36, No. 6, June 1989, p.p. 1145-1149) and the electron negative charge is neutralized by the holes. When the bottom oxide is thicker than 30 Angstroms, high energy hot holes are generated by band to band or avalanche breakdown; these holes are injected into the storage area and recombine with the electrons to neutralize the charge. (T. Y. Chan, Chenming Hu et. al. "A True Single-Transistor Oxide-Nitride-Oxide EEPROM Device" *IEEE Electron Device Letters*, VOL. EDL-8, No. 3, March 1987, p.p. 93-95).

Hot hole injection is notorious for damaging oxide through injection because its effective mass is three times larger than an electron's (Paulo Cappelletti et. al. "Flash Memories" Kluwer Academic Publishers 1999, p.p. 217-223). This damaged oxide creates traps and reduces retention time. The retention time degradation increases as program/erase by hole cycle increases. (FIG. 1)

In his paper, K. T. Chang et. al. "A New SONOS Memory Using Source-Side Injection for Programming" IEEE Electron Device Letters, VOL. 19, No. 7, July 1998, p.p. 253-255, the author uses a split gate in an attempt to eliminate the trapped electrons by electric field applying positive bias on the top polysilicon gate (FN erase) instead of hole injection and to avoid hole damage and to improve retention time. However this approach in sidewall split gate structure where the nitride layer is sandwiched between two polysilicon gates encounters the following problem.

FIG. 2 illustrates word gate 20 and control gate 22. Horizontal and vertical components of the ONO nitride 21 are designated as a storage element and an insulator between the two polysilicon gates. The corner component is off the control gate and is less controlled by the gate. A small number of electrons accumulate at the gap nitride 22 between the two-polysilicon gates 20 and 24 at every program erase cycle. In order to eject the electrons trapped in the SiN, a positive bias is applied on the control gate polysilicon 22 while the substrate silicon 10 is grounded. Since the electric field at the gap is weaker compared to the area immediately under the control gate, it is difficult to eject the electrons trapped at the gap. FIG. 4 shows electrons 29 trapped in the nitride 21. Thus the erased state threshold shifts up as the number of program/erase cycles increase, and the window between program and erase states gets smaller. There is a reliability issue associated with the split gate approach. This is illustrated graphically in FIG. 3 where lines 31 and 33 show threshold voltages of programmed and erased cells, respectively, as a function of number of cycles.

U.S. Pat. No. 6,498,377 to Lin et al describes a MONOS cell structure where nitride storage lies under sidewall spacers. U.S. Pat. No. 6,356,482 to Derhacobian et al teaches applying a negative gate erase voltage to improve erase after many program-erase cycles. U.S. Pat. No. 6,040,995 to Reisinger et al discloses F-N tunneling erase of nitride through a thick oxide layer. U.S. Pat. No. 5,408,115 to Chang shows F-N tunneling erasure through the top oxide wherein the bottom oxide is thick.

A Twin MONOS individual cell structure splitting the gate into one word gate and two control gates on the word gate sidewalls was introduced in U.S. Pat. No. 6,255,166, by Seiki Ogura. Its fabrication method is described in U.S. Pat. No. 6,531,350 by K. Satoh et al. This invention also refers to an array structure of 4bit-1 contact described in U.S. Pat. No. 6,469,935 by Y. Hayashi et al, where 4 memory storage cells share one contact. This invention still also refers to a simplified fabrication method described in U.S. Provisional Patent Application Ser. No. 60/363,448, filed on Mar. 12, 2002, by K. Satoh et al.

The diffusion bit TWIN-MONOS array provided in U.S. Pat. No. 6,255,166 contains two serious concerns. The ONO composite film is deposited after defining the memory word gate followed by the control gate process. Vertical ONO along the word gate sidewall and horizontal ONO overlying the substrate form the L-shaped ONO. There is a gap at the corner of the L-shape between the control gate and the nitride edge. This may make it more difficult to pull the electrons stored in the corner. The electrons stored in the corner nitride are accumulated during program and erase cycles so that the operation window gets narrower as time goes on.

Another concern is the negative slope opening for defining the word line. The word line mask 28 is patterned over the polysilicon line 26' overlying the polysilicon line 20' as shown in FIG. 5A. The polysilicon 26' and 20' not covered by the word line mask 28 should be etched out. The line 26' has a positive slope but it becomes a negative opening for etching as shown in FIG. 5B. It is difficult to etch out the polysilicon under the negative opening, as shown by poly residuals 23. It would easily cause word line to word line short and word line to control gate short.

SUMMARY OF THE INVENTION

The present invention provides a cell structure and array architecture of Twin-MONOS memory for high-density application and its device operation to achieve this endurance of program-erase cycle to more than 100,000 cycles and following retention time to longer than 10 years at 85° C. The fabrication methods of the cell are also provided with solutions for concerns in the prior arts.

The first embodiment of this invention is a device operation for L-shaped ONO to utilize hot hole erase in addition to F-N (Fowler-Nordheim) erase in order to improve the endurance. Holes generated by band to band can be injected into the gap region as long as the control gate (CG) channel length is within the several hole mean free path by applying a negative bias on the word gate (see U.S. patent application Ser. No. 09/810,122—Halo 00-004—Word gate negative hole injection). Thus if hot hole damage is tolerable up to 1K cycles and hot hole injection is required after 100 F-N erasures, then the endurance cycle providing the proper operating threshold voltage (Vt) window extends to 100× 1K=100 K cycles. However, this Hot Hole and CHE combination approach is still limited by Hot Hole endurance comparing to CHE-F-N endurance.

The second embodiment of this invention is corner nitride free Twin MONOS. In the cell and array structure of the second embodiment, the width of the storage nitride is coincident with that of the control gate to prevent storing electrodes in the nitride under off-control gate such as seen on a corner of the L-shape. A p-type species is doped in the control gate polysilicon to eliminate electron source through the top oxide during F-N erase through the bottom oxide. An n-type species is lightly doped in the control gate channel to prevent hot hole accumulation during F-N erase. The bit diffusion is raised by filling polysilicon in between the control gates to reduce the bit resistance. The word gate opening is tapered with positive slope to allow word-line patterning. The word gate is stepped down into the underlying channel to prevent short channel punch-through leakage for further advanced technology. The control gate runs along the bit diffusion and across the word line. The diffusion contact is placed at the end of every other bit diffusion alternately in a memory array block, the control gate contact is placed on the extension of the bit contact and/or in-between the bit contacts, and the word gate contact is placed at the end of the word line alternately.

The fabrication method of the $2^{nd}$ embodiment consists of growing the bottom oxide on memory area, depositing nitride on the bottom oxide, and directly oxidizing the nitride with ISSG (Insitu Steam Generation) containing a higher hydrogen concentration than 2% to form the top oxide. The first deposited polysilicon on ONO film is used for the control gate polysilicon. P-type species are implanted into the first polysilicon for F-N erase application. A cap nitride is deposited on the first polysilicon followed by etching with a word gate mask to the first polysilicon. An oxide spacer is formed on the sidewall of the cap nitride as an etching mask to define the control gate and the ONO storage element. The first polysilicon is etched with the oxide spacer mask, followed by the control gate channel implant with angle, LDD implant and dielectric spacer formation in between the control gate and the diffusion. The second polysilicon is plugged in between and recessed to form a raised diffusion to reduce the bit line resistance followed by oxide fill and planarization. The first polysilicon under the cap nitride is exposed by removing the nitride selectively followed by etching the first polysilicon and subsequently the ONO to define the other edge of the control gate and ONO storage as well as a positively tapered opening. The substrate exposed after ONO etching may be etched down for further technology to prevent punch-through leakage due to short channel. The word gate oxide is grown on the substrate and a dielectric spacer is formed on the control gate sidewall for insulation to the word gate. The third polysilicon is deposited and patterned with a word-line mask, followed by the logic process.

The third embodiment is a modification of the second embodiment for bit application described in U.S. Pat. No. 6,469,935. The cell and array structure of the third embodiment contains modifications from the second embodiment as follows. The memory cells are isolated by STI instead of the field implant in the second embodiment and the memory diffusion area is also isolated by STI. The memory diffusion is connected alternately with an upper or lower adjacent diffusion by local wiring to share a contact with 4 memory storages. The control gate runs along the word gate and across the bit line connecting the bit contacts with metal.

The fabrication method of the second embodiment is modified for the third embodiment as follows: the process steps through to the first control polysilicon etching are common with the second embodiment. The word gate formation comes prior to the diffusion formation in the process sequence of the third embodiment. The word gate oxide is grown after the first polysilicon etching. The word gate polysilicon is plugged and recessed in the word gate trench over the word gate oxide followed by cap oxide formation over the polysilicon such as raised diffusion formation in the second embodiment. The polysilicon exposed by stripping the cap nitride is etched down with the second control gate etching to form the memory control gate, where the polysilicon in the logic area is also etched with a photoresist mask simultaneously. This is followed by memory channel implant, LDD implant and logic process, after filling and planarizing oxide over the diffusion area. A local wiring process is allowed to connect the adjacent diffusion. The contact formation and metal process follows.

The fourth embodiment is for higher density NAND application using MONOS memory. The memory cell structure consists of subtracting the word gate from the third embodiment. It is simply replacing the polysilicon floating gate of the conventional NAND cell by nitride. The unit cell along the channel direction consists of a half of source/drain, a control gate with underlying ONO as an memory storage and other half of source/drain. The width of the control gate and underlying ONO is defined by an overlying oxide sidewall mask. The unit cell dimension along the channel can be smaller than the conventional NAND. The direction across the channel is bounded by STI along the channel. The array structure follows NAND only replacing the floating gate by nitride. The bit lines run along the active area isolated by STI lines. The control gate lines are across the bit lines. A block consists of every a certain number of the control gate lines and bit lines. The control gates at both ends of the block are utilized as select gates to define which block is operated. The diffusion area in between the blocks is shared as a bit diffusion connected to a bit line through contact and common ground, alternately. The control gate mask on a sidewall is looped. The looped mask is separated into two lines by cutting it at both ends The control gate contact is also placed at the ends.

The device operation method of the fourth embodiment is designated by F-N program and F-N erase through the top oxide. This is different from the conventional NAND operation access through the tunnel oxide. Even in F-N ejection through the bottom oxide, a small number of hot holes are generated by band to band transition and accumulated at the channel surface. The hot holes are easily injected through the bottom oxide and leave damage in the bottom oxide. This degrades the retention time after program-erase cycles. On the other hand, F-N tunneling through the top oxide may not have a concern about such hot hole generation. The F-N tunneling through the top oxide is considered to be more reliable than tunneling through the bottom oxide. Two device operation methods using F-N tunneling through the top oxide are provided as program/erase defined by electron ejection/injection and injection/ejection.

Multi level program method is also contained in the device operation methods. Multi level program is to provide controllable memory cell threshold voltage Vt at 4 or 8 levels by adjusting operation conditions. A memory cell with 4 level Vt is a two-bit cell so that the density of the two bit cell memory array becomes twice that of the single bit cell memory array. The multi level Vt program is allowed by adjusting the control gate voltage or bit line voltage.

The fabrication method of the fourth embodiment is designated by skipping the word gate polysilicon in the third embodiment. The process steps through to sidewall oxide mask are the same as in the third embodiment. Stripping the cap nitride, only the looped oxide mask remains on the control gate polysilicon. The loop is cut at both ends of a block into two lines. A photoresist mask for the control gate contact cover and logic gate is printed on the polysilicon. The polysilicon is vertically etched out with the sidewall oxide mask and the photoresist mask, followed by clearing ONO. The device impurity profile is defined by a LDD implant, spacer process, and source-drain implant. After oxide deposition and planarization, the common source line and bit contact are formed by a damascene process.

The fifth embodiment in this invention is for NOR application using the same cell structure and fabrication method as the fourth embodiment. The control gate having ONO storage runs across STI (active area). The bit line crosses the control gate. The diffusion area is formed on the active area at both sides of the control gate. The diffusion area on one side is connected to bit line through the bit contact. The diffusion areas on the other side are connected together as a common source line. An individual memory cell is addressed by selecting a bit line and control gate.

The sixth embodiment is a single gate MONOS. The cell structure is of simply replacing the gate oxide of a conventional MOS FET by ONO. The memory cell can have dual memory storage in nitride over the p-n junction. The memory cell structure is close to NROM proposed by B. Eitan et al, SSDM 1999, Proc, p522, but it is different in using a metal bit line instead of a diffusion bit line and STI instead of field implant isolation. The memory cell can be fabricated with only one extra mask compared to a conventional CMOS device. The memory cell is easily embedded into a conventional CMOS platform. The array structure is derived from Twin MONOS metal bit application. The control gate and underlying ONO run crossing the STI and active area. The bit line also crosses the control gate. Every other diffusion area bounded by the STI and the control gate is connected to the bit line through a contact. Program operation adapts electron injection into the nitride with channel hot electron to store the electrons on each side independently. Erase operation is either with hot hole injection or F-N ejection. There arises a concern about enduring the program-erase cycles. The difference of mean free path between an electron and a hole causes mismatch of their injection profile along the channel. A few electrons remain at the middle of the channel without being neutralized by hot holes. These electrons are accumulated with the program-erase cycle so that threshold voltage is going up. It is a common concern with NROM. It is disclosed to inject hot holes from not only one side but also the other side of the channel.

BRIEF DESCRIPTION OF THE DRAWINGS

FIGS. 9A through 20A and 22A show top views of the process flow proposed in the second preferred embodiment of the present invention.

FIGS. 9B through 20B, FIG. 21, and FIG. 22B show cross-sectional views along A-A' of FIG. 9A of the process flow proposed in the second preferred embodiment of this invention.

FIG. 9C to FIG. 20C show cross-sectional views along B-B' of FIG. 9A of the process flow proposed in the second preferred embodiment of this invention.

FIG. 25A through FIG. 29A show top views of the process flow proposed in of the third preferred embodiment of this invention.

FIG. 25B to FIG. 29B show cross-sectional views along D-D' in FIG. 25A of the process flow proposed in the third preferred embodiment of this invention.

FIG. 25C to FIG. 29C show cross-sectional views along E-E' in FIG. 25A of the process flow proposed in the third preferred embodiment of this invention.

FIG. 29C1 shows a cross-sectional view along F-F' in FIG. 29A of the process flow proposed in the third preferred embodiment of this invention.

FIG. 32A1, FIG. 32A2, FIG. 32B1 and FIG. 32B2 are examples of device operation of the fourth embodiment.

FIG. 33A through FIG. 38A show top views of the process flow proposed in of the fourth preferred embodiment of this invention.

FIG. 33B to FIG. 38B show cross-sectional views along A-A' in FIG. 33A of the process flow proposed in the fourth preferred embodiment of this invention.

FIG. 33C to FIG. 38C show cross-sectional views along B-B' in FIG. 33A of the process flow proposed in the fourth preferred embodiment of this invention.

FIG. 39A through FIG. 40A show top views of the process flow proposed in of the fifth preferred embodiment of this invention.

FIG. 39B to FIG. 40B show cross-sectional views along A-A' in FIG. 32A of the process flow proposed in the fifth preferred embodiment of this invention.

FIG. 39C to FIG. 40C show cross-sectional views along B-B' in FIG. 32A of the process flow proposed in the fifth preferred embodiment of this invention.

DETAILED DESCRIPTION OF PREFERRED EMBODIMENTS

Figure 6:
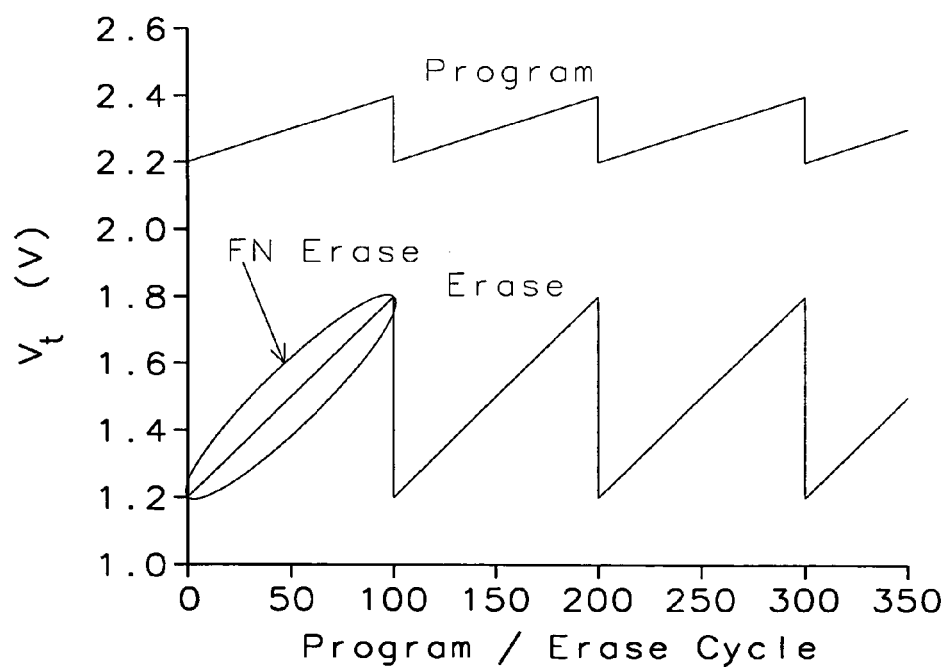
FIG. 6 is a graphical representation of the first preferred embodiment of the present invention in a MONOS device operation.

It is implemented for device operation of the first embodiment to insert one hot hole erasure after every n (100 or 1000) cycles of CHE program and F-N erase as shown in FIG. 6. Hot holes generated by band to band transition can be injected into the nitride portion at the L-shaped corner and neutralize the accumulated electrons there as long as the control gate (CG) channel length is within the several hole mean free path by applying a negative bias on the word gate. (See U.S. patent application Ser. No. 09/810,122—Halo 00-004—Word gate negative hole injection). Therefore if hot hole damage is tolerable up to 1K cycles and hot hole injection is required after 100 F-N erasures, then the endurance cycle providing the proper operating threshold voltage (Vt) window is extended to 100×1K=100K cycles. However, this Hot Hole and CHE combination approach is still limited by Hot Hole endurance comparing to CHE-F-N endurance.

Figure 7:
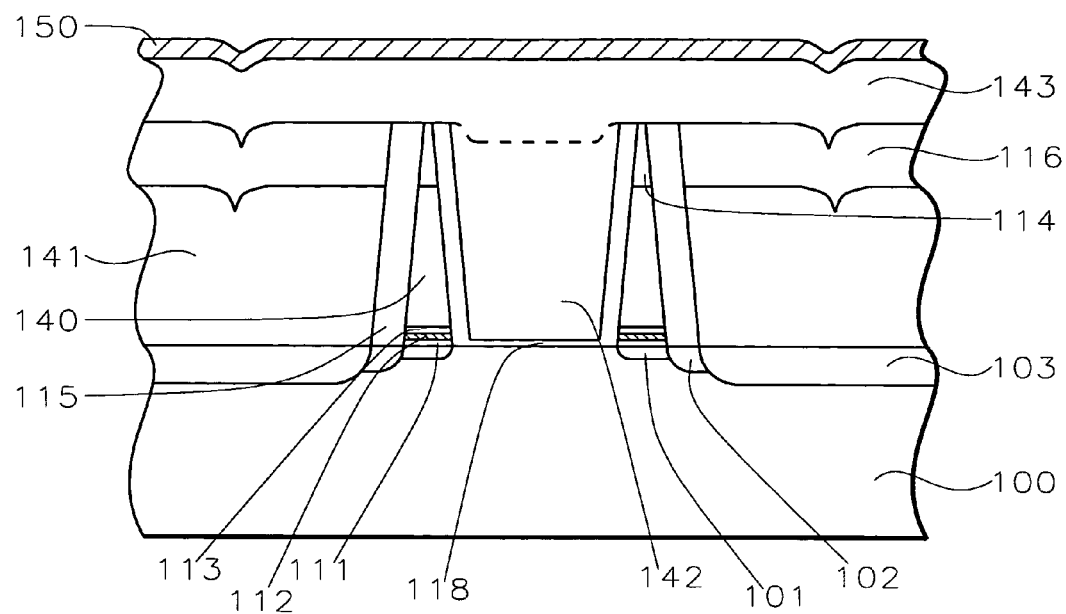
FIG. 7 is a cross-sectional representation of an enlarged portion of the second preferred embodiment cell structure of the present invention.
Figure 8:
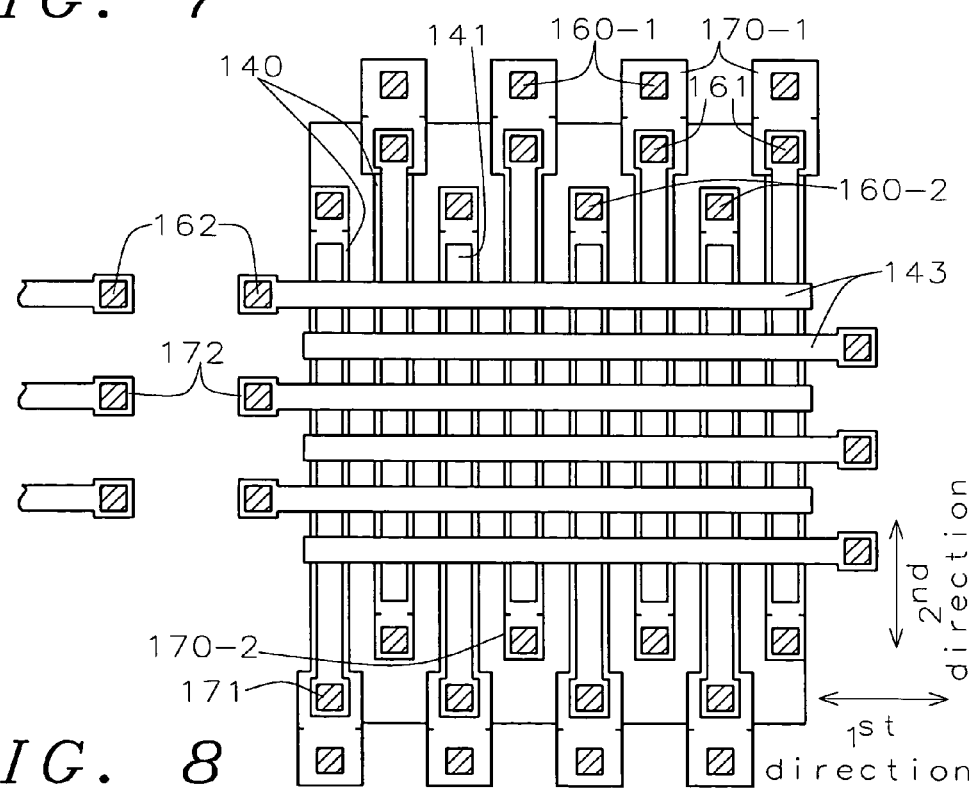
FIG. 8 is a cross-sectional representation of the second preferred embodiment array structure of the present invention.

The device cross-sectional structure of the second embodiment along the $1^{st}$ direction is shown in FIG. 7 as well as the top view of array architecture shown in FIG. 8. The bit diffusion is in between a pair of the control gates partitioned by memory spacer 115. The bit diffusion consists of memory diffusion 103 and overlying raised diffusion 141. The control gate consists of the control gate polysilicon 140, underlying ONO (bottom oxide 111, storage nitride 112 and top oxide 113) and underlying control gate channel 101. The pair of the control gates are connected to each other at the end of diffusion bit. The control gate and the bit diffusion run along the $2^{nd}$ direction crossing the $1^{st}$ direction. Their contacts are placed at the end of the bit diffusion. The word gate consisting of word gate polysilicon 142, underlying word gate oxide 118 and underlying substrate 100 is on the other side of the control gate partitioned by CG-WG isolation dielectrics 118. The word gates are connected by a word line 143 along the first direction. The word line contact is placed at the end of the word line alternately.

Figure 4:
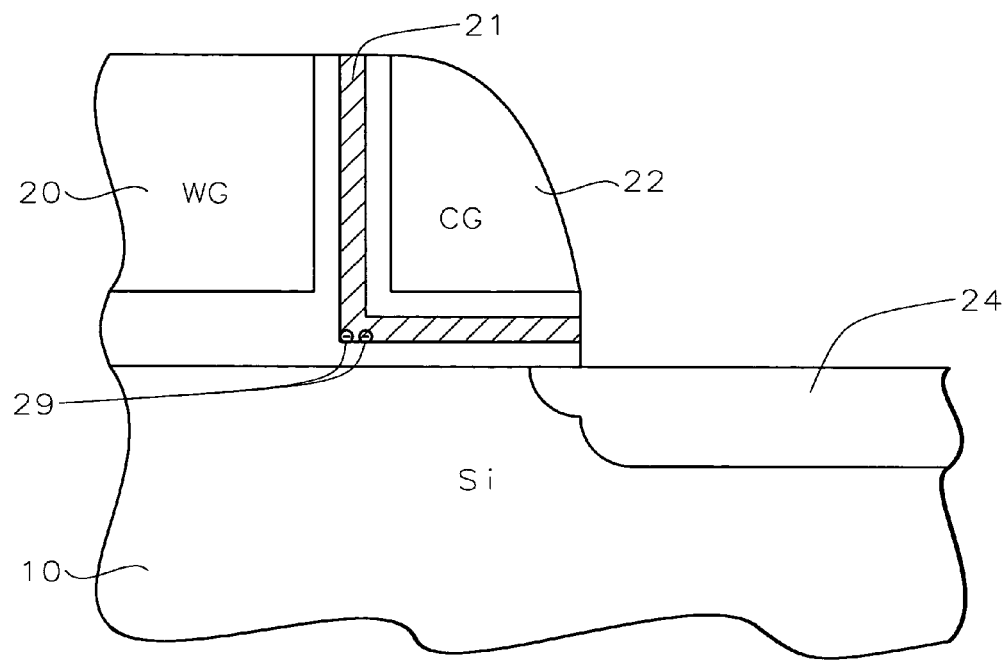
FIG. 4 is an enlarged view of the view in FIG. 2.

The width of storage nitride 112 is coincident with that of the control gate 140. L-shaped nitride 29 in previous art FIG. 4 has off control gate at the corner. The electric field at the corner is weak compared to the area immediately under the control gate so that it is difficult to eject the electrons trapped in the off control gate nitride at the corner with F-N current and electrons remaining at the corner are accumulated with the cycle of program and erase cycle. The threshold voltage of the control gate gets higher with the accumulation. Eliminating the off control gate nitride is promising to improve the endurance for the program-erase cycle.

The control gate polysilicon 140 is doped with p-type species instead of n-type to help F-N ejection through the bottom oxide, where negative voltage is applied on the control gate and positive or 0 voltage on the substrate so that electron ejection through the bottom and electron injection through the top oxide can occur simultaneously with some probability. It makes F-N ejection hard. Since p-doped polysilicon cannot be an electron donor, electrons are not supplied from p-polysilicon of the control gate. and electron injection through the top oxide is cut off.

An n-type species may be lightly counter-doped under the control gate in addition to p-type dopant. Hot holes are generated even under F-N eject conditions. The holes are accumulated along the channel under the control gate and some are injected through the bottom oxide during F-N erase. This damages the bottom oxide and degrades the data retention after cycling. An n-type dopant prevents the hot hole accumulation and injection.

The memory diffusion 103 is shared by adjacent control gate pair 140 and adjacent word gates 142 on both sides as a common bit. The polysilicon 141 plugged in between the control gates immediately over the diffusion defines a raised diffusion. The resistance of the diffusion 103 is too high to work as a common bit line. The diffusion is covered by oxide 116 before the logic (peripheral) gate process. It is difficult to share the salicide process with the logic gate. The raised diffusion 141 by filling polysilicon immediate over the diffusion is devised to lower the bit line resistance.

Figure 5A:
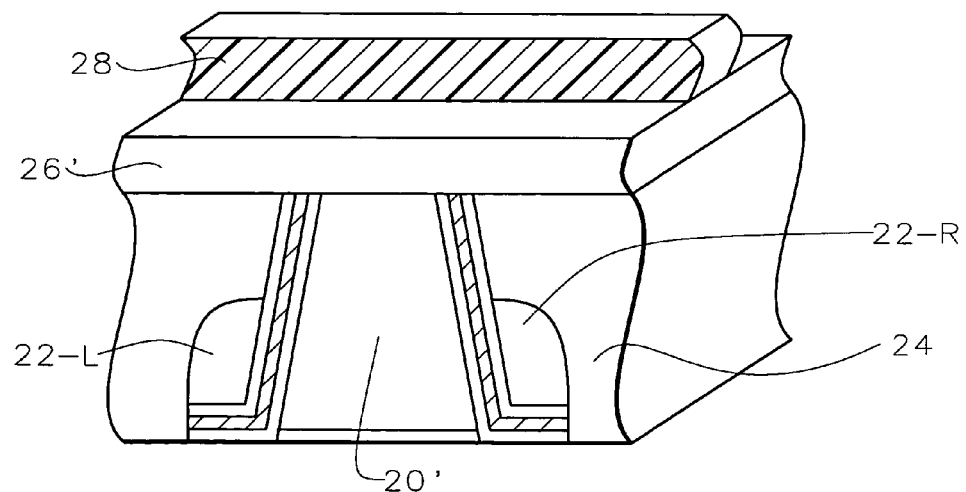
FIGS. 5A and 5B illustrate a problem of polysilicon residues in the prior art.
Figure 5B:
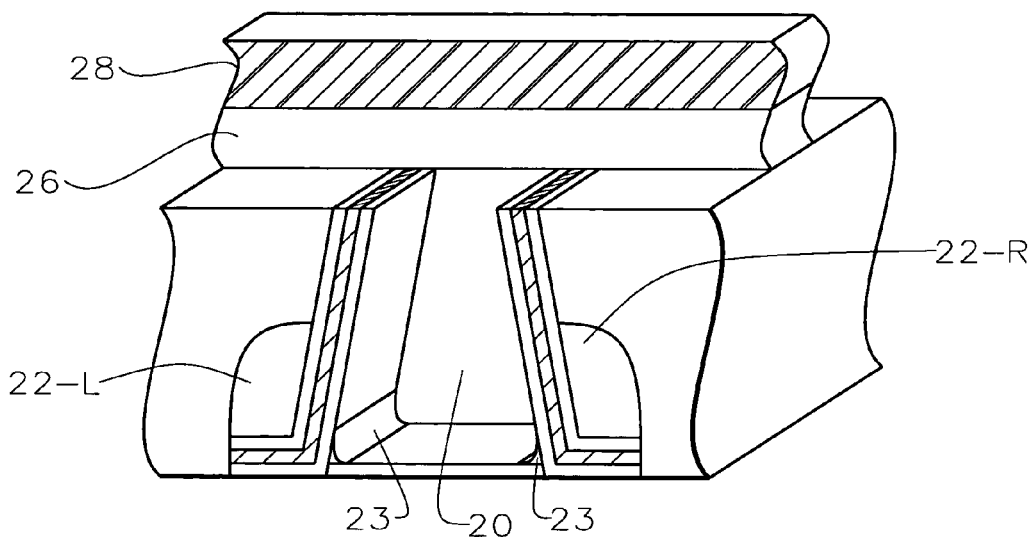

The word gate 142 opening is tapered with a positive slope. The word line is defined by etching polysilicon 26' in FIG. 5A along the first direction as shown in 5B. The negative such as in FIG. 5B would be a mask for etching. It is so hard to etch out the polysilicon inner word gate that poly residuals 23 remains along the word gate corner as shown in FIG. 5B. It may cause word-word short or word-CG short. The negative slope comes from defining the word gate as remained pattern. It is defined by trench pattern with positive slope opening in this embodiment, followed by filling polysilicon and patterning the word line.

The word gate 142 may also be stepped down into the underlying channel. Punch through current due to short channel has recently been garnering serious attention. The channel length of Twin MONOS is figured out by 2× control gate width+word gate width. It has a benefit in short channel because of the 2× control gate width. However, serious problems will occur even in Twin MONOS in the 0.09 um and beyond era. The short channel punch through can be controlled by stepping down the word gate into the channel by a few nm.

The array architecture of the second embodiment is for diffusion bit array organization (U.S. Pat. No. 6,255,166B1). The control gate 140 and bit line 141 run along the $2^{nd}$ direction crossing the word line 143 along the $1^{st}$ direction. in FIG. 7. The diffusion contact 161 is placed at every other end of the bit diffusion 141 alternately in a memory array block, as illustrated in FIG. 8. The control gate contact 160 is placed on an extension of the bit contact (160-1) and/or in-between the bit contacts (160-2). The word gate contact 162 is placed at the end of every other word line alternately.

Figure 9A:
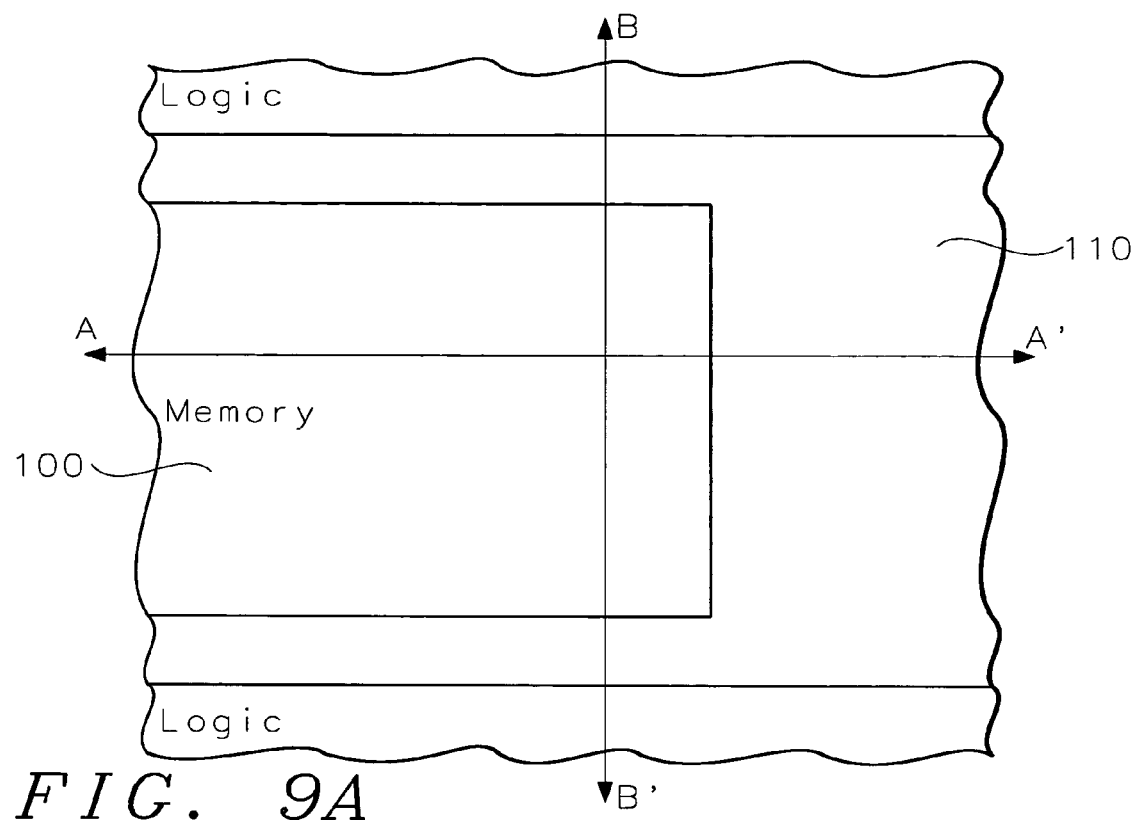
Figure 9B:
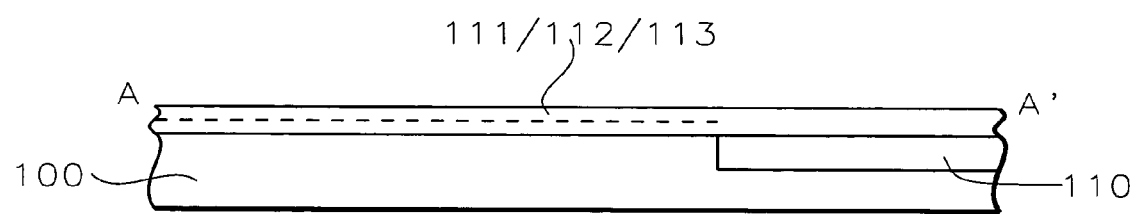
Figure 9C:
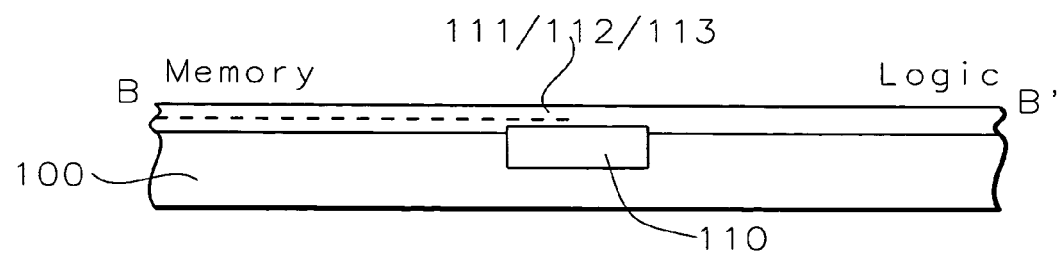

Referring now to FIGS. 9A, 9B, and 9C, shallow trench isolation (STI) 110 is formed within the substrate 100. STI is placed under the planned memory control gate contact and memory word line contact and as logic device isolation. No STI is under the memory cell array. Individual cells are isolated by field implantation after they are defined. An ONO composed film runs under the control gate.

A triple well structure is required in addition to conventional N-Well and P-Well structures to supply negative voltage. After patterning the resist with Deep N-Well mask, Phosphorus is implanted with the energy of between about 1.5 MeV and 3 MeV to twice the depth of the inside P-Well. P-well in the triple well is formed commonly with the standard P-well. The well structure is not shown in the figures.

The $1^{st}$ gate oxidation and $2^{nd}$ gate oxidation processes are subsequently allowed with base CMOS parameters. Logic thick gate oxide is designated as a combination of $1^{st}$ and $2^{nd}$ oxidation. The logic thin gate oxide, memory word gate, and ONO bottom oxide is grown at the $2^{nd}$ oxidation.

An ONO stack film as a memory storage element is composed of the base oxide 111, the storage nitride 112 and the top oxide 113 as shown in FIG. 9B. The base oxide is thermally grown to the thickness of between about 2 to 6 nm together with memory work gate and logic thin gate, followed by standing the wafer in an $NH_3$ ambient at >850° C. to allow nitridation on the surface. Thickness of the logic gate and memory word gate is adjusted in a later process. The nitridation process helps not only to reduce incubation time and deposit nitride uniformly but also to adjust the surface state of the bottom oxide—nitride boundary. As an example, the nitridation time can be prolonged to increase the electron trap sites on the surface. Nitridation time can be adjusted depending on what operation is required. The nitride thickness to be deposited by a conventional chemical vapor deposition (CVD) tool depends on the top oxide formation, either deposition or oxidation of the nitride. The final thickness sandwiched between bottom and top oxides is controlled to be between about 2 and 6 nm. In the case of depositing the top oxide, the nitride thickness is required to be between about 2 and 6 nm. The top oxide is deposited to a thickness of between about 3 to 7 nm by a conventional CVD such as high temperature oxide (HTO). It also has to be followed by a wet oxidation process to stabilize the boundary surface of the top oxide and the nitride. In the other case of oxidizing the nitride, the nitride thickness is figured out as between about 4 and 9 microns to compensate for the thickness loss of the nitride from the oxidation. The thickness of about 3 to 5 nm of nitride turns into 4.5 to 7.5 nm of oxide during the oxidation. An in-situ steam generation (ISSG) tool is preferred as an oxidation tool to a conventional wet oxidation with a furnace to minimize the effect on other than ONO. When ISSG is adopted, nitride oxidation is shared with the logic gate oxidation. The combination of the three thicknesses is carefully chosen considering the operation mode. For example, when electrons stored in the nitride are erased through the bottom oxide, the bottom oxide should be thinner than the top oxide. For erasing through the top oxide, it is vice versa. Hydrogen atoms contained in the process gas improve the data retention. Hydrogen concentration in ISSG is controlled by higher than 2% volume.

There are some options to reduce the F-N erase voltage. $NH_3$ anneal or $N_2O$ anneal at 900° C. over ONO stack can be an option. These anneals may lower work function at the nitride—top oxide boundary. Another option is silicon rich nitride by increasing $SiH_4$ or $SiH_2Cl_2$ flow compared to $NH_3$ flow at nitride deposition. The option works to reduce the deep traps locating both boundaries with top and bottom oxide as well as increase the shallow traps generated in bulk nitride. Another option is NO anneal at 900° C. after nitride deposition or 700° C. $H_2$ anneal after the device is defined. These anneals reduce dangling bonds in the nitride. These options can be added in the preparation of the ONO film during device fabrication to reduce residue electrons and to lower erase state voltage.

The top oxide and nitride of ONO film in the logic area is removed with masking the memory area, followed by logic gate oxidation to adjust logic gate thickness.

Figure 10A:
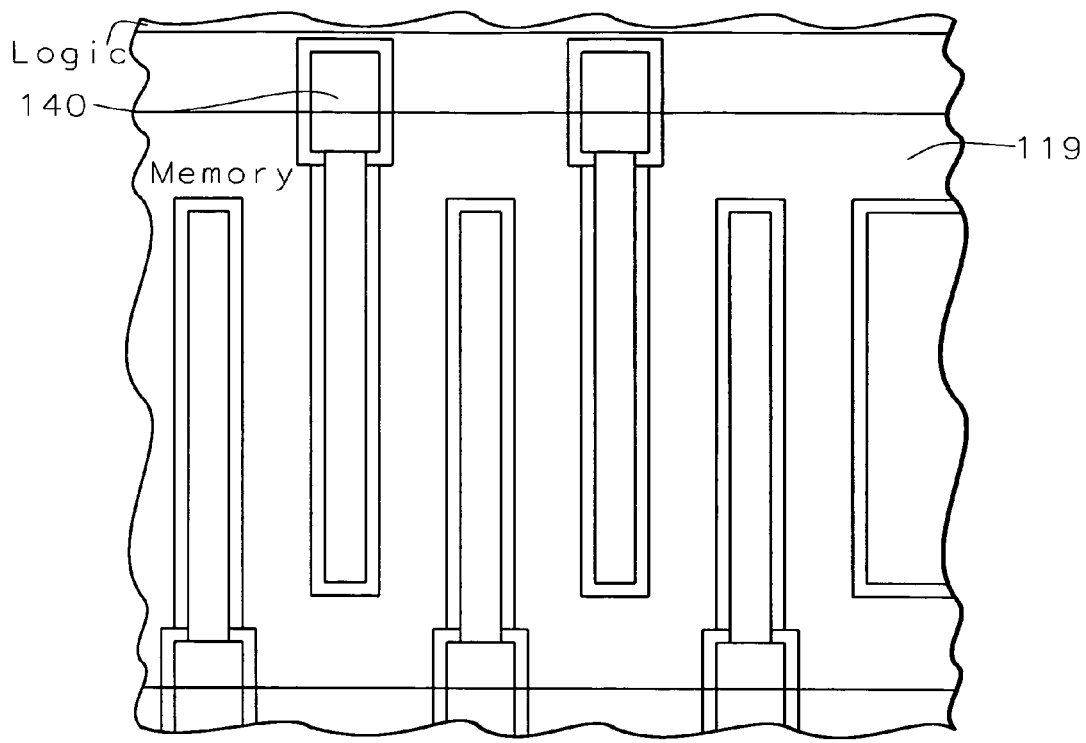
Figure 10B:
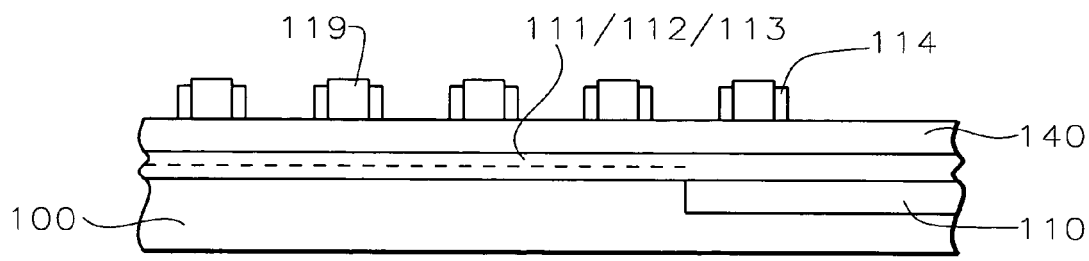
Figure 10C:
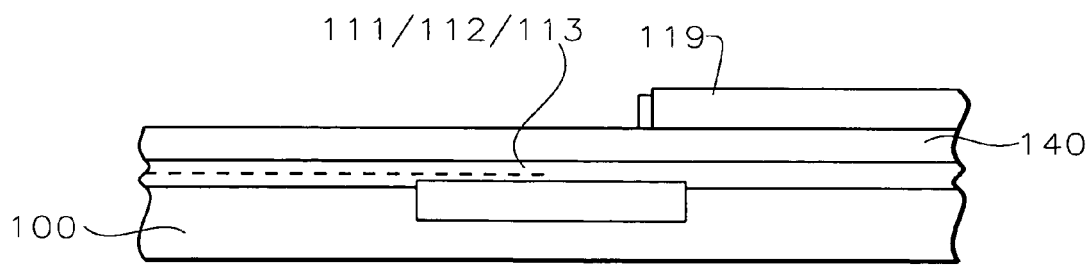

Referring now to FIGS. 10A, 10B, and 10C, polysilicon 140 is deposited to the thickness of between about 100 to 200 nm followed by n-channel polysilicon implantation into memory and N-MOS areas. P-type species may be implanted into the polysilicon in the memory area to allow F-N erase operation. The cap nitride 119 is deposited over the polysilicon 140 surface with resist mask in the memory area. The logic area is covered with a resist mask during etching. The resist mask is stripped. Oxide 114 is deposited to a thickness of between about 20 and 80 nm to define the width of the control gate, then it is vertically etched to the polysilicon to define an oxide control gate mask. The oxide 114 over the logic cap nitride 119 is etched away during the oxide etching.

Figure 11A:
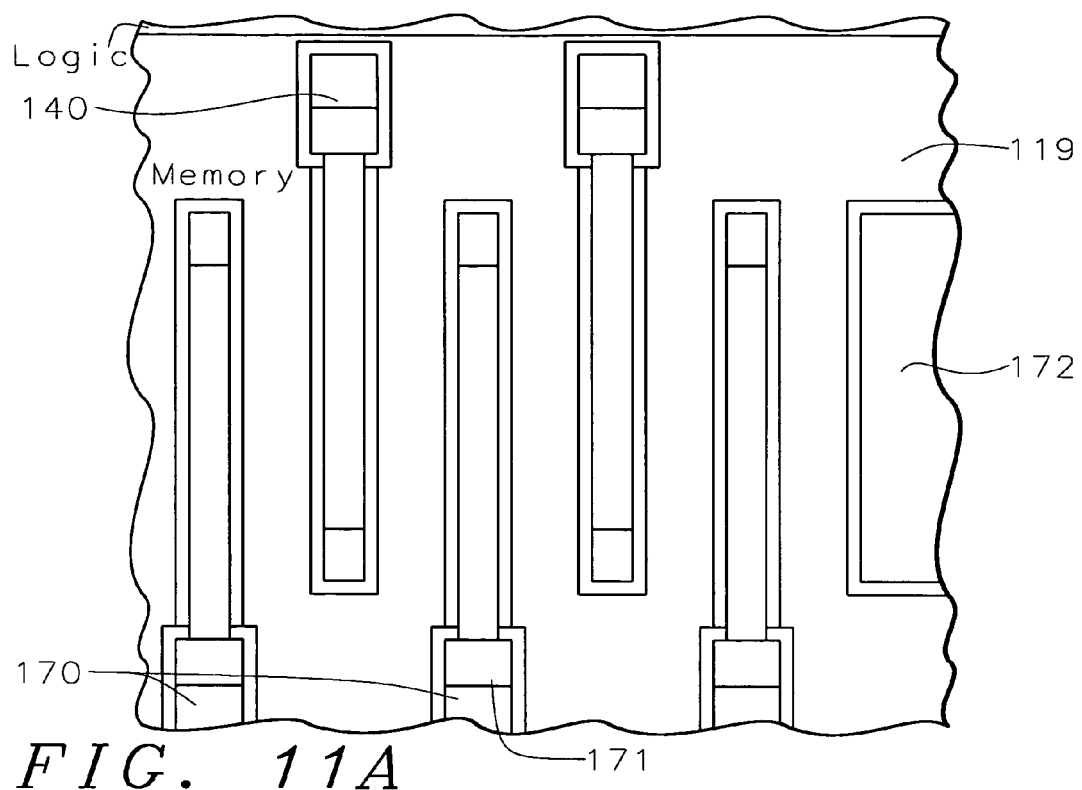
Figure 11B:
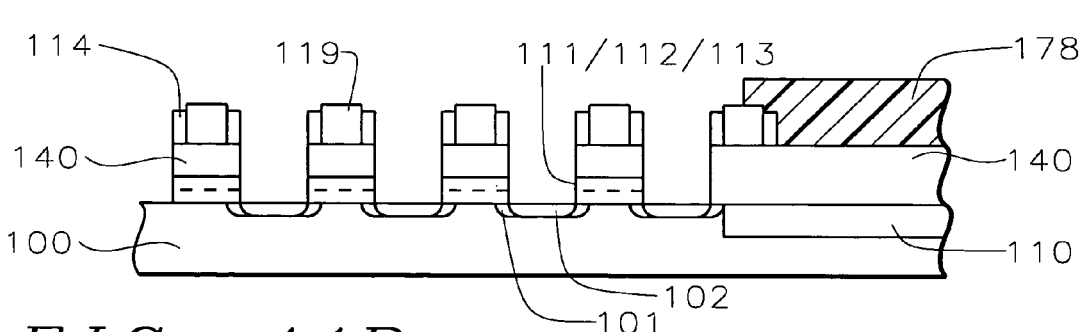
Figure 11C:
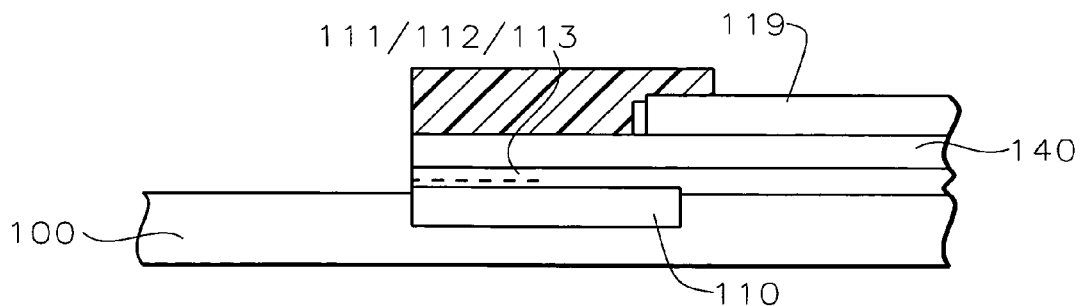

Referring now to FIGS. 11A, 11B, and 11C, polysilicon 140 is etched to the ONO surface using the oxide mask 114. CG contact area 170 and WG contact pad area 172 are masked with photoresist. Removing the ONO gently, Boron or $BF_2$ is implanted with a tilted angle into the substrate under the control gate to form a control gate channel 101. As an option, n-type implantation such as Arsenic may also be added to the channel 101 with a lower dose than p-type. The n-specie works to prevent holt hole accumulation along the CG channel during F-N erase. N-type specie is implanted without a tilt angle to create memory LDD region 102 and PN junction.

Figure 1A:
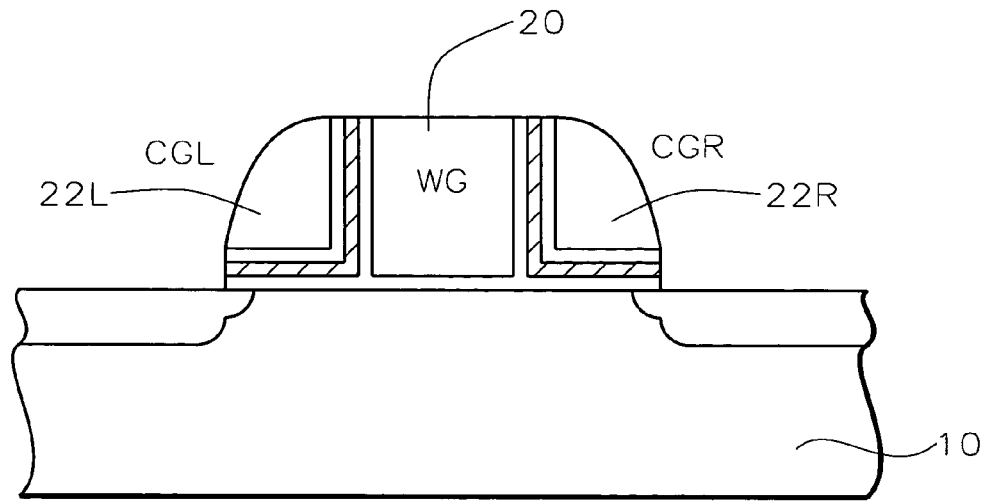
FIG. 1A is a cross-sectional representation of the prior art.
Figure 1B:
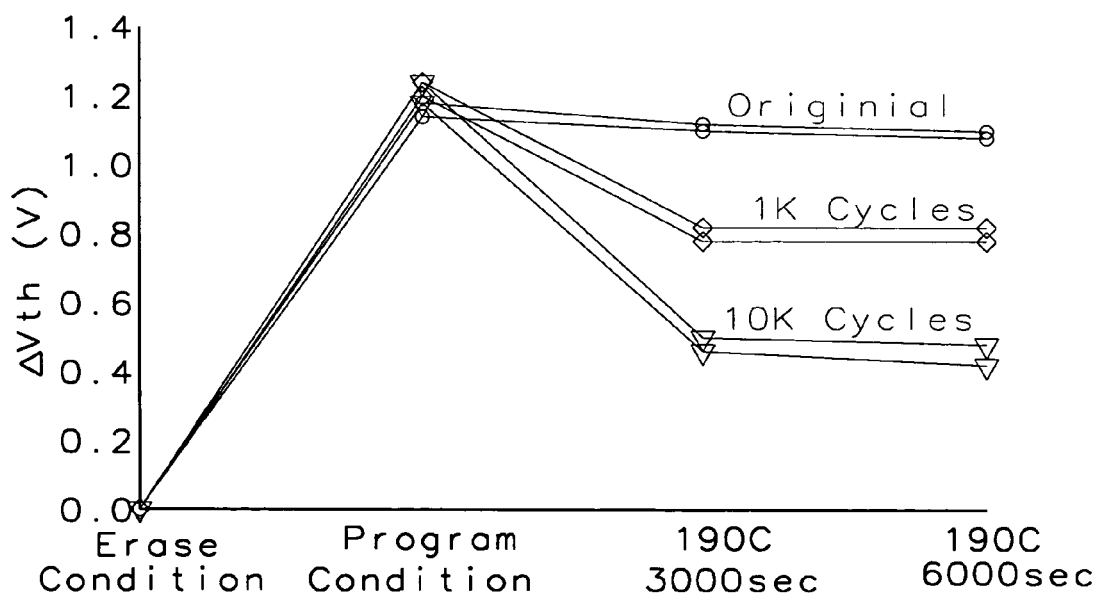
FIG. 1B is a graphical representation of threshold voltage as a function of cycle time in a MONOS device of the prior art such as FIG. 1A.
Figure 2:
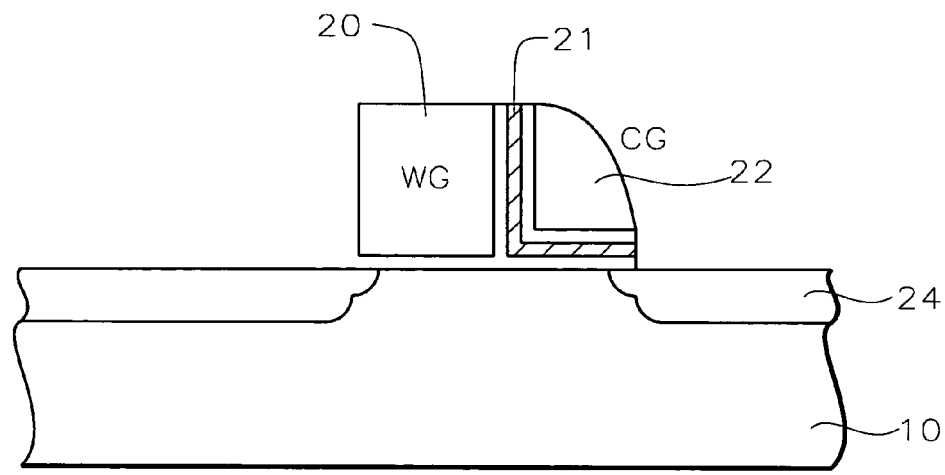
FIG. 2 is a cross-sectional representation of a MONOS memory of the prior art such as described in the paper by K. T. Chang et al.
Figure 3:
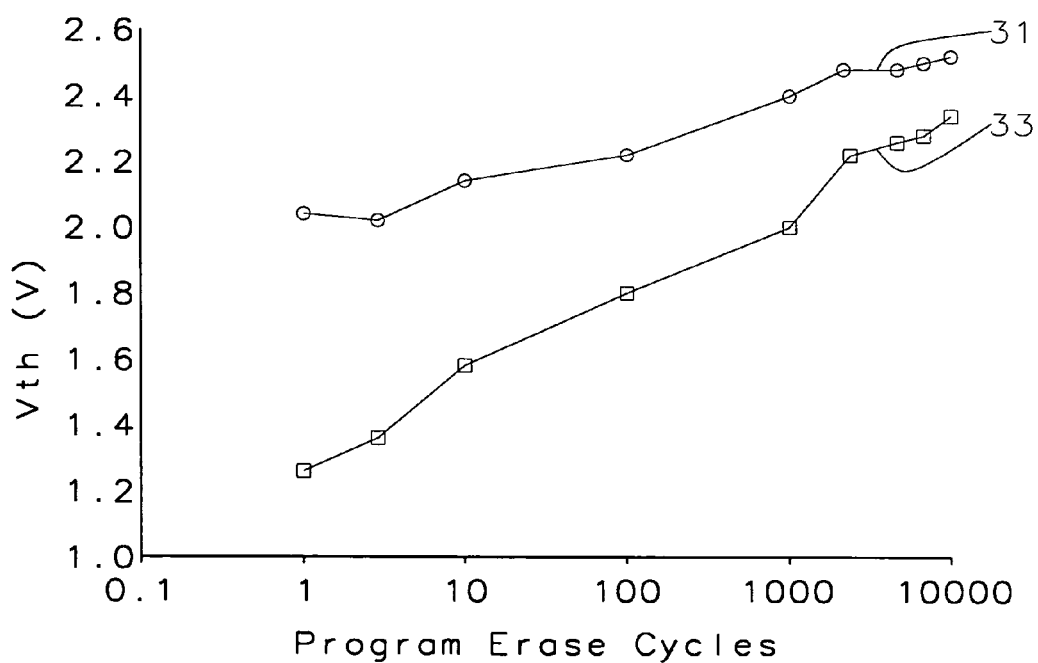
FIG. 3 is a graphical representation of threshold voltage as a function of program erase cycles such as for the device of FIG. 2.
Figure 12A:
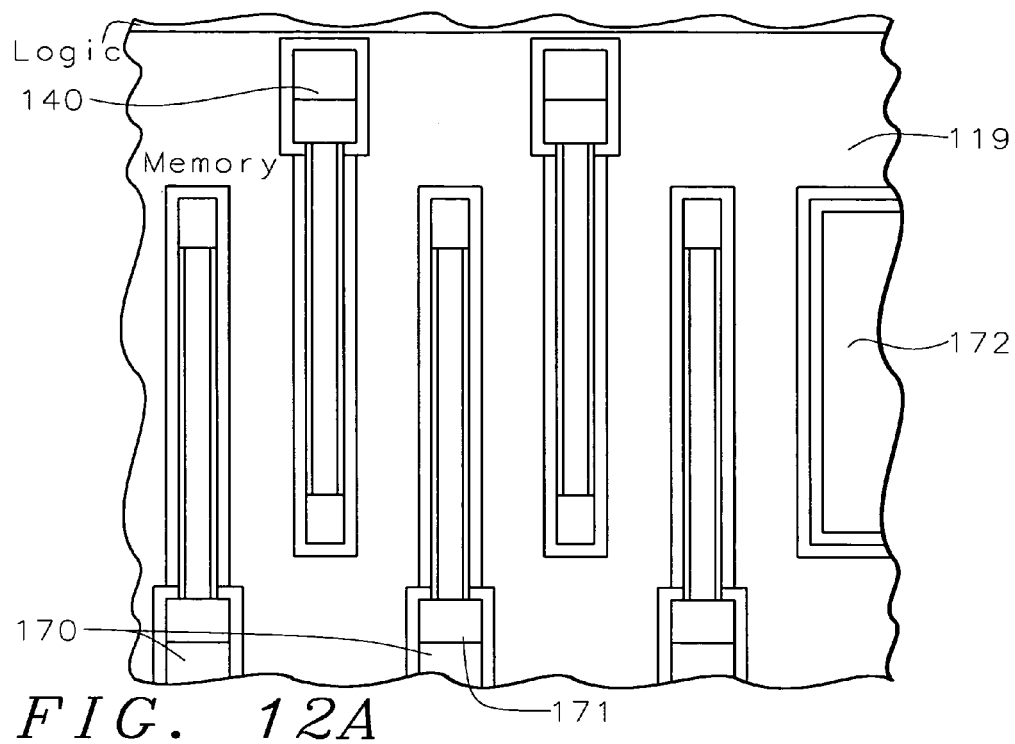
Figure 12B:
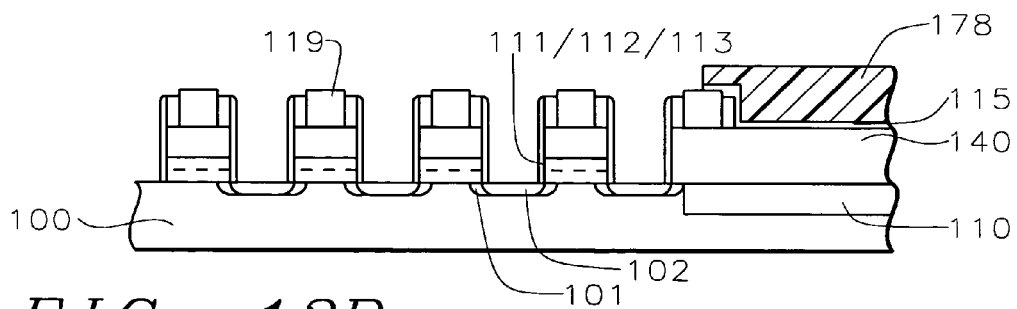
Figure 12C:
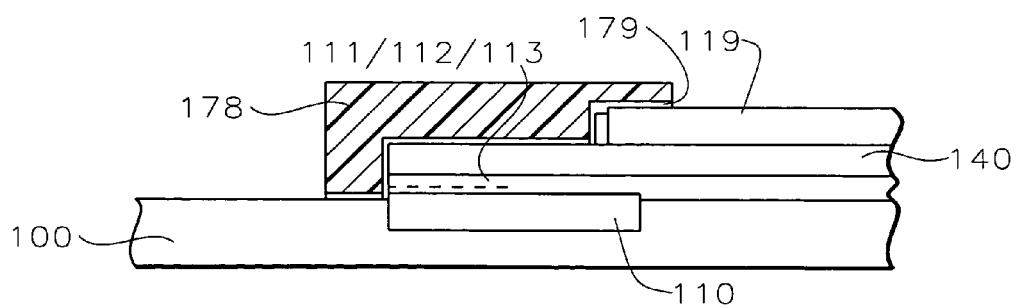

Referring to FIGS. 12A, 12B, and 12C, an oxide film 115 is deposited to a thickness of between about 30 and 60 nm and vertically etched to form an insulation of the control gate to the subsequent raised diffusion 141 and source/drain offset. The control gate contact area 170, diffusion contact area 171 and the word gate contact area 172 are masked with photoresist 178 to retain the oxide 115. There is retained oxide 179 on the cap nitride as shown. It would be etched out at oxide cap CMP process, otherwise it becomes a mask at the word gate opening process. FIGS. 12B1, 12C1, 12B2, 12C2, 12A3, 12B3 and 12C3 explain an option not to leave the oxide 115 on the cap nitride 119 after the spacer etch. The photoresist 178 is patterned over the oxide 115 to cover the control gate contact area 170, diffusion contact area 171 and word gate contact area 172 as shown in FIG. 12B1 and FIG. 12C1, as the pattern edge is placed on the cap nitride 119. The resist is ashed back until the pattern edge comes to off cap nitride as shown in FIG. 12B2 and FIG. 12C2. Pad areas are covered with the resist but no resist remains on the cap nitride. Then, the exposed oxide 115 is vertically etched to leave the spacer oxide and pad protects. Source/drain implant 103 is an option in case the dopant provided from the raised polysilicon is not enough. It can be adjusted appropriately.

Figure 13A:
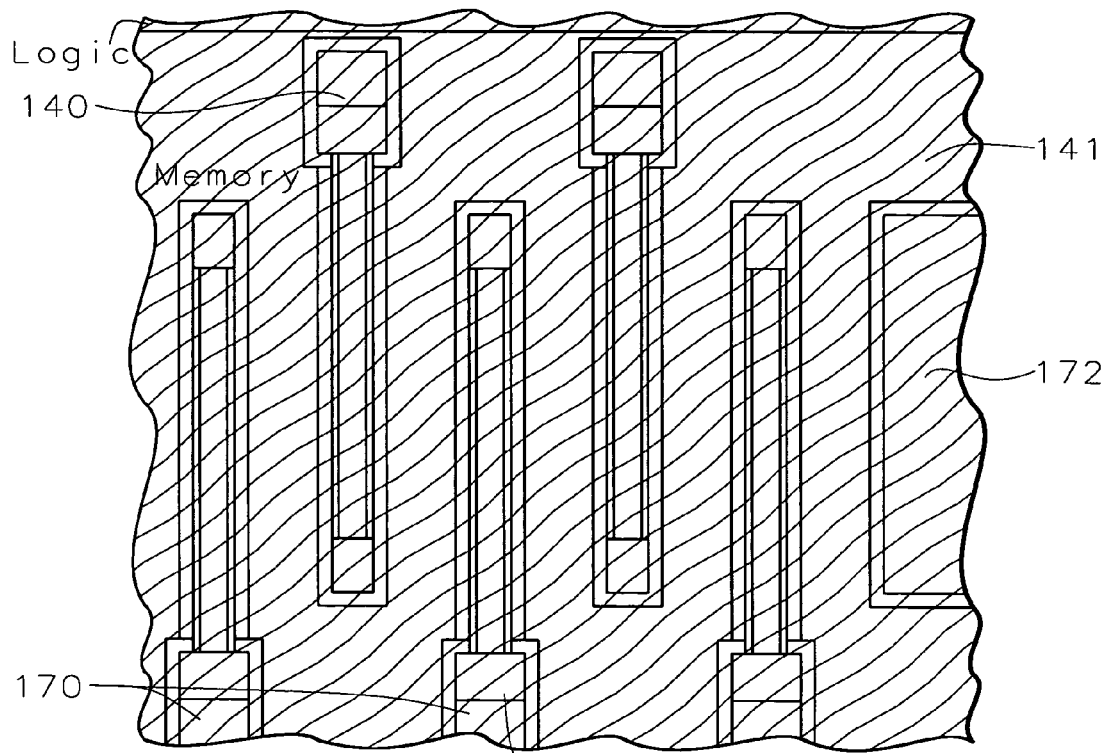
Figure 13B:
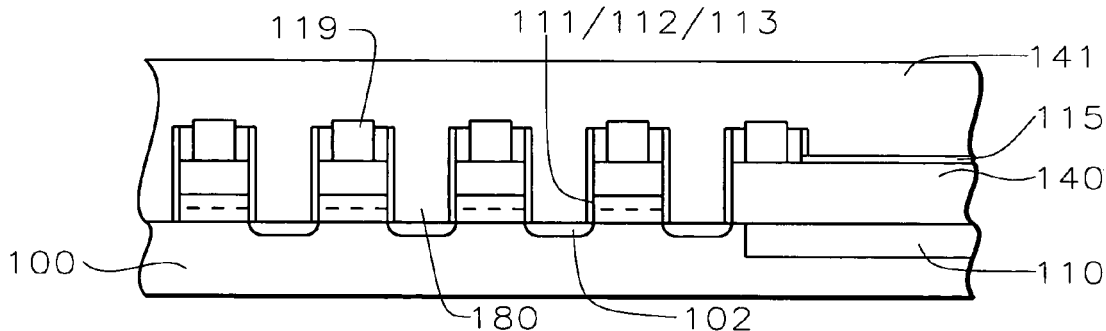
Figure 13C:
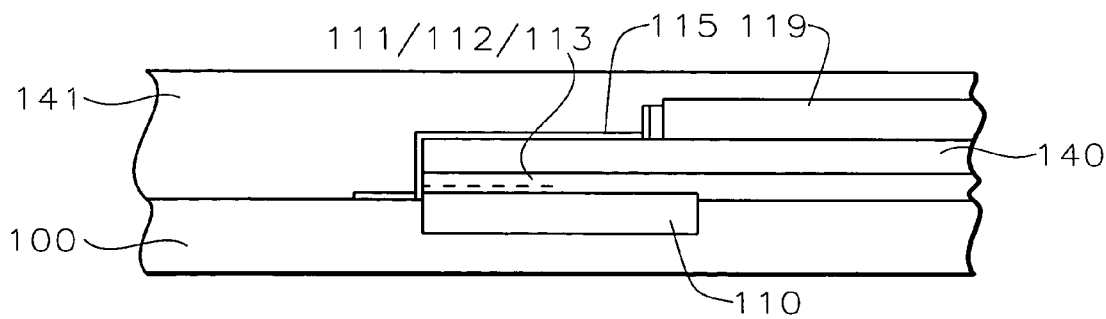
Figure 14A:
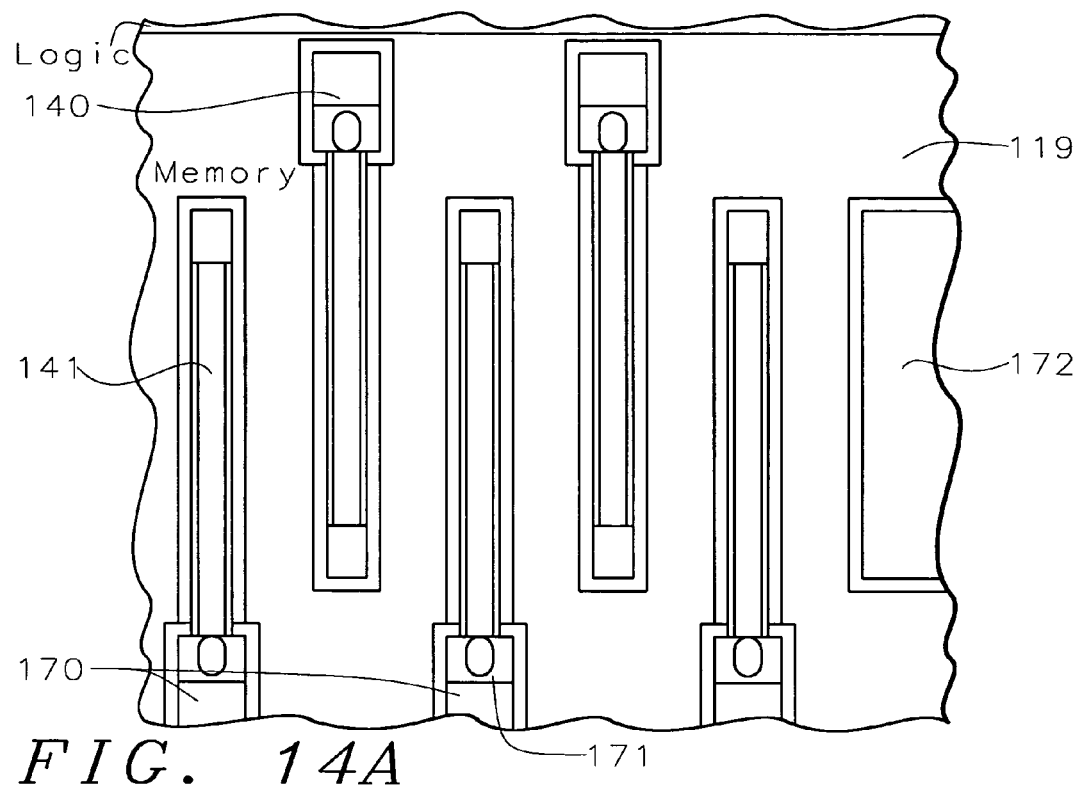
Figure 14B:
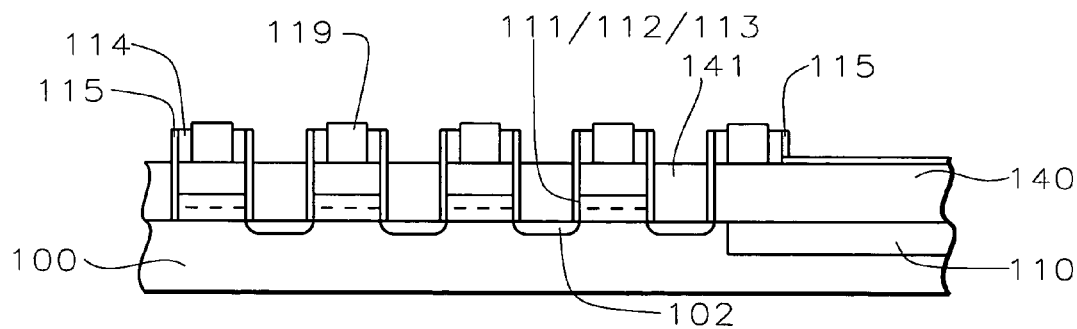
Figure 14C:
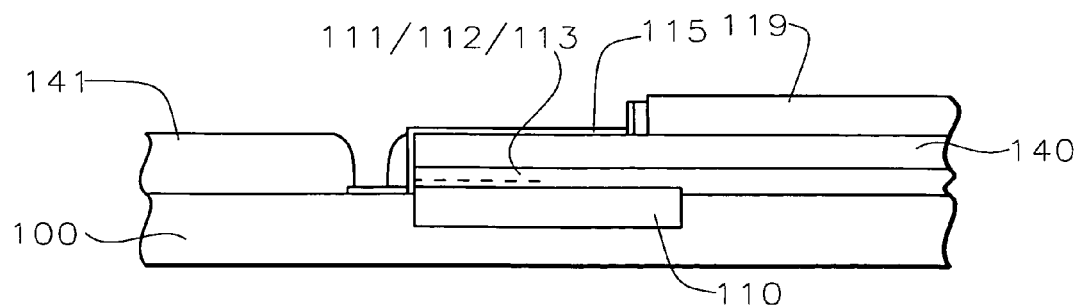
Figure 15A:
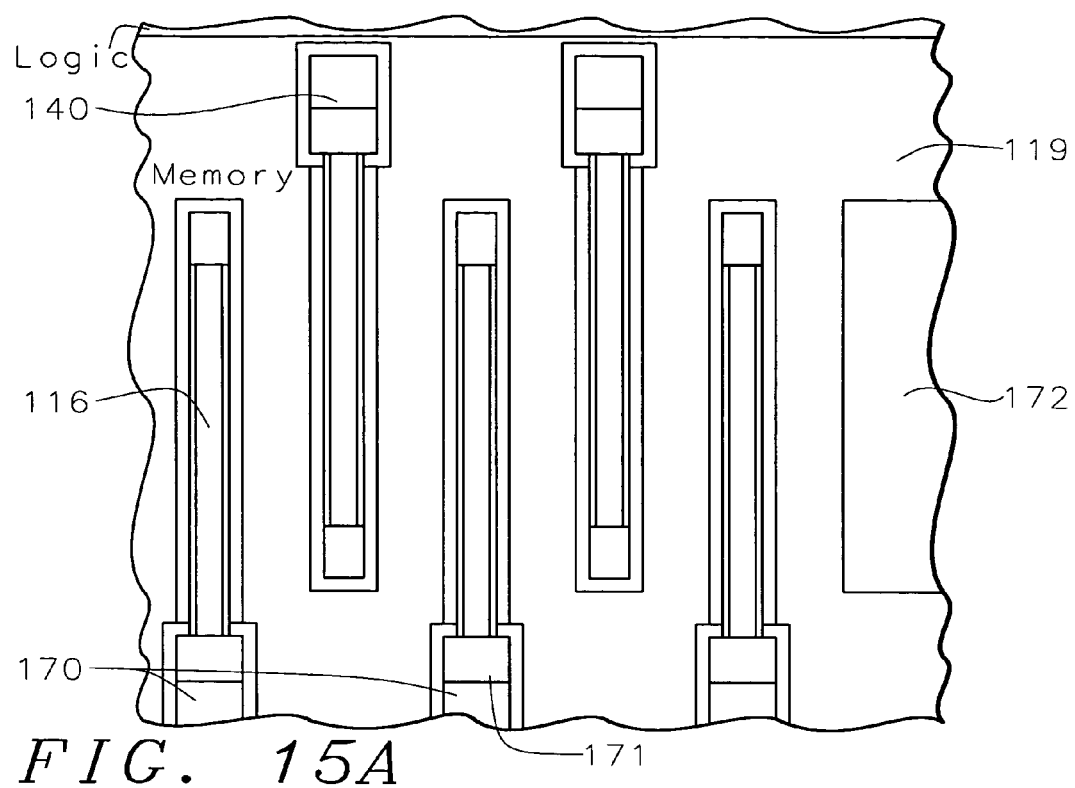
Figure 15B:
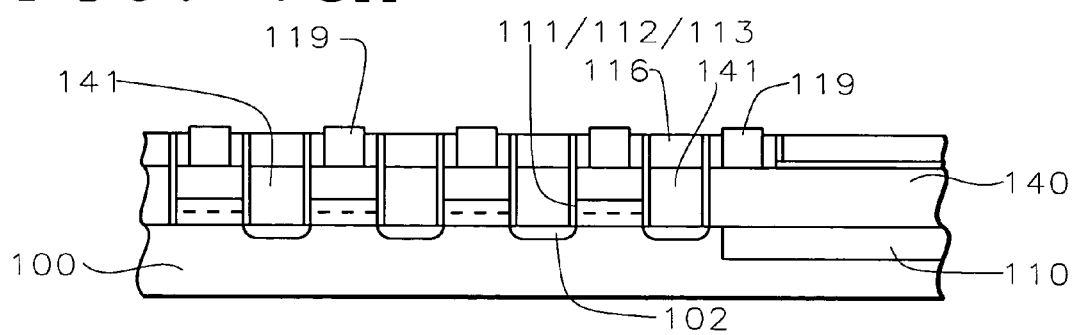
Figure 15C:
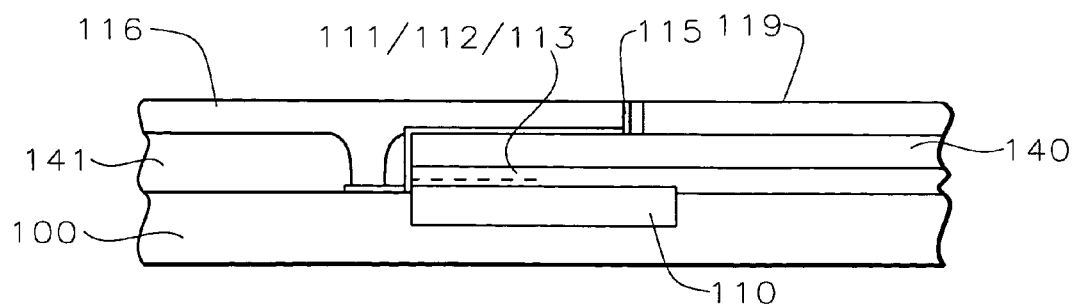

Referring now to FIGS. 13A, 13B, and 13C, polysilicon 141 with a thickness of between about 100 nm and 200 nm is deposited to plug the trench 180 between the gates. The contact areas 170, 171, 172 are comparably large to plug the polysilicon 141 so they are covered with oxide 115 to prevent etch in. The polysilicon 141 is vertically etched to recess by 50 to 100 nm from the top of the cap nitride 119 as shown in FIGS. 14A, 14B, and 14C. An n-type specie is doped by ion implant after the polysilicon recess. About 50 to 150 nm of oxide 116 is deposited and etched down with vertical ion etching or CMP to planarize the top surface, as shown in FIGS. 15A, 15B, and 15C.

Figure 16A:
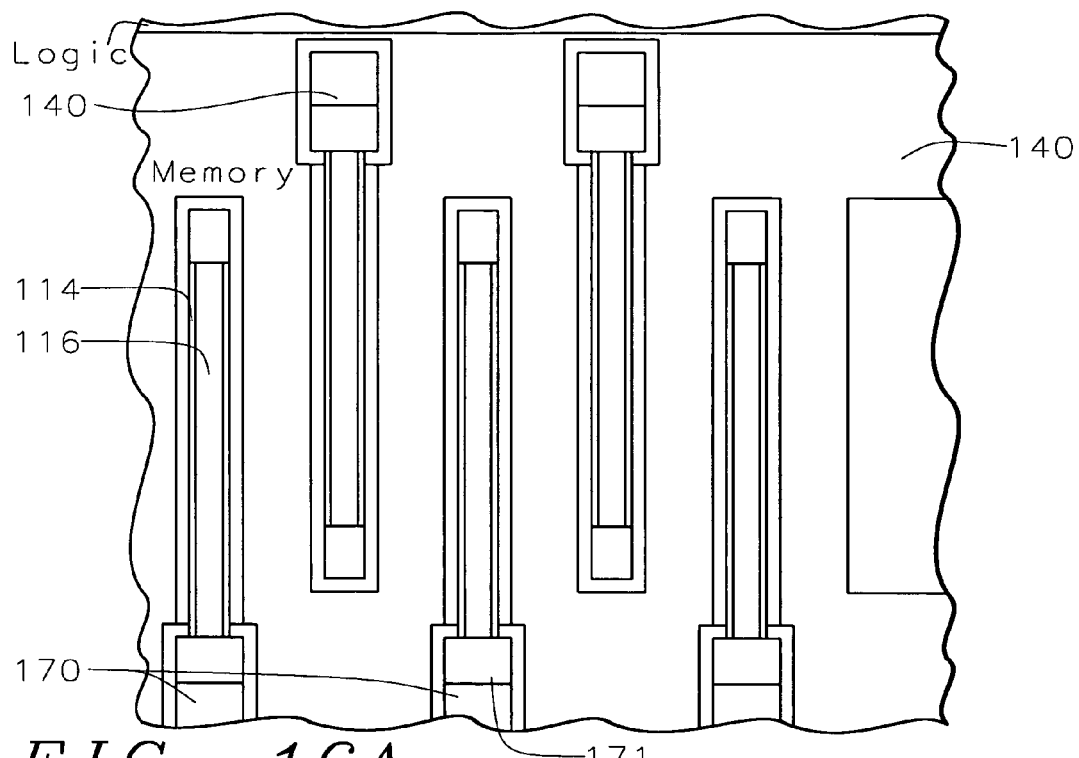
Figure 16B:
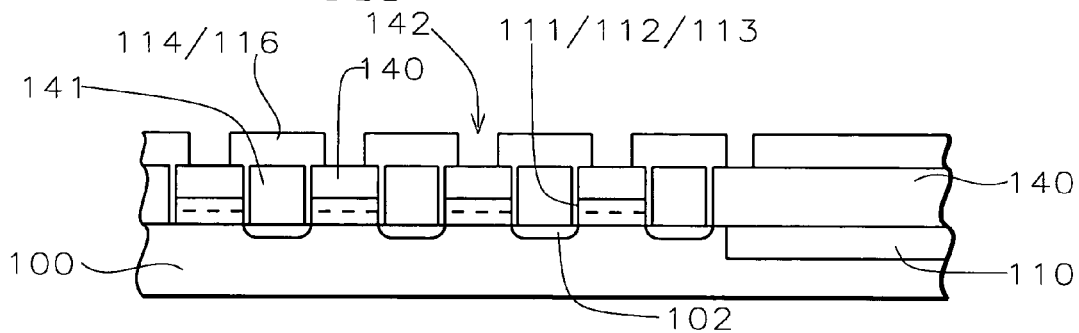
Figure 16C:
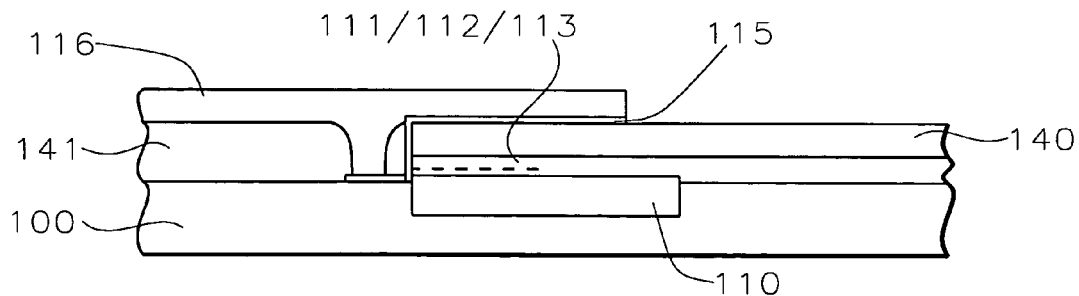

Referring now to FIGS. 16A, 16B, and 16C, the remaining cap nitride 119 is removed with a wet etch or CDE (Chemical Down Flow Etching). The control gate 140, the raised diffusion and logic gate 141 are covered with oxide 114 and 116. The word gate trench 142 in between the control gates and logic area are now exposed for etching.

Figure 17A:
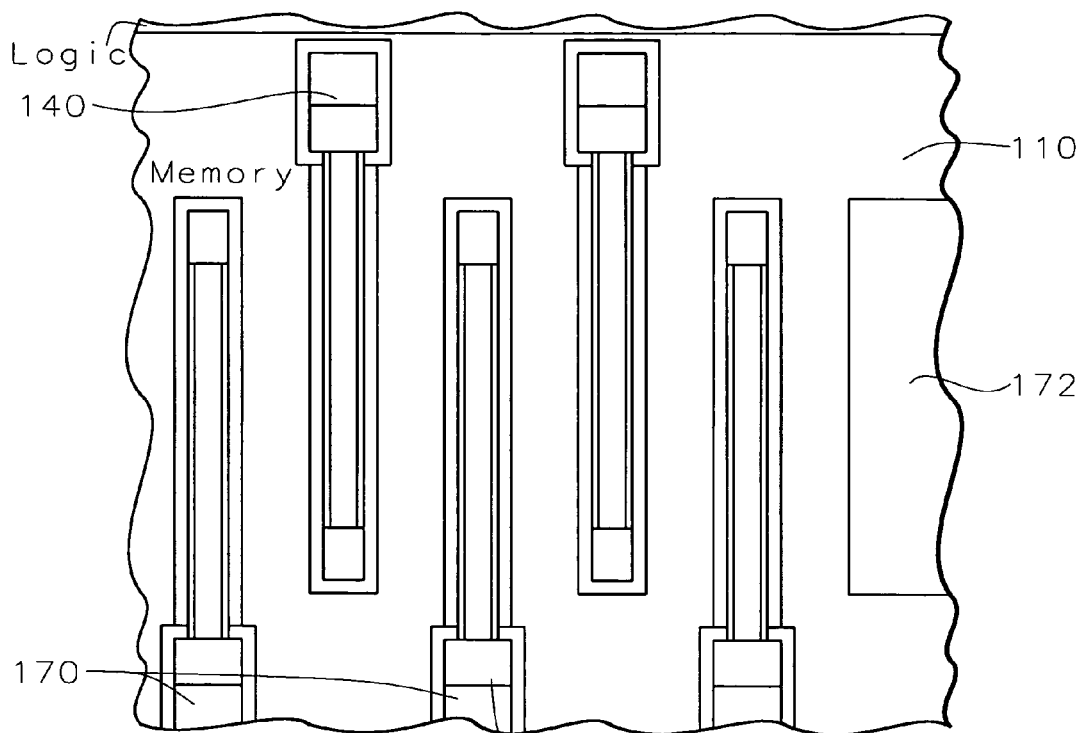
Figure 17B:
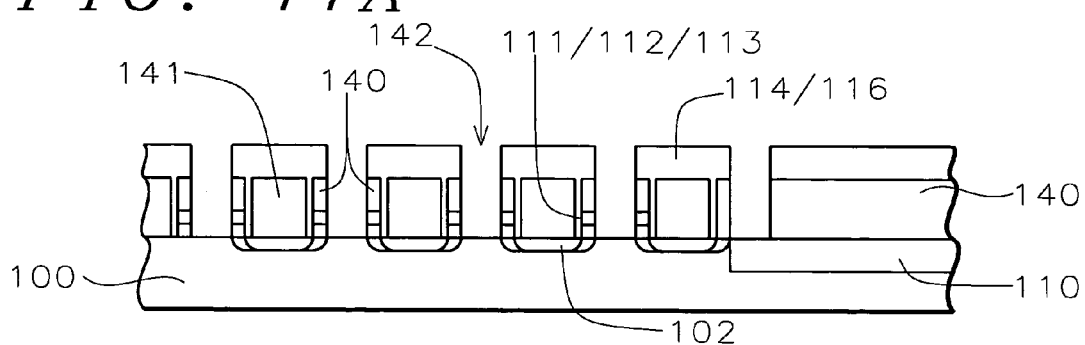
Figure 17C:
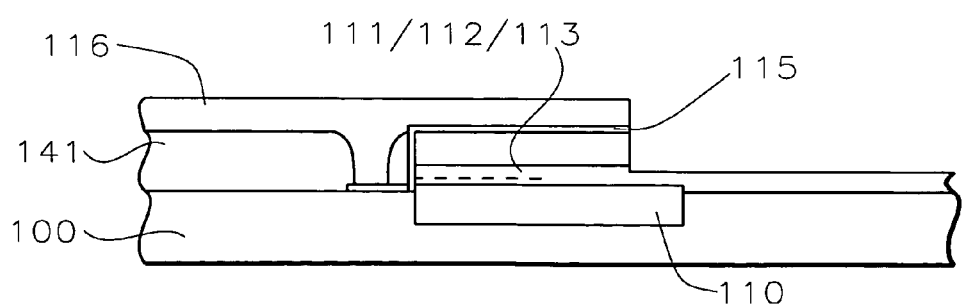

Referring to FIGS. 17A, 17B, and 17C, the vertical polysilicon etching is allowed without photoresist mask. The polysilicon 140 other than that covered by the oxide 114 over the control gate and 116 over the raised diffusions is etched out. The remaining ONO and the exposed logic gate oxide are gently removed. Therefore ONO memory storage is defined self-aligned to the overlying control gate 140 as shown in FIG. 17B. About 20 to 40 nm of oxide 118 is deposited and vertically etched to assure isolation between the control gate 140 and the word gate 142. A step word gate is sometimes preferred to reduce punch through leakage arising from a short channel. A step word gate lower than the control gate is formed by etching the substrate lightly in this process step as an option as shown in FIG. 17B1.

Figure 18A:
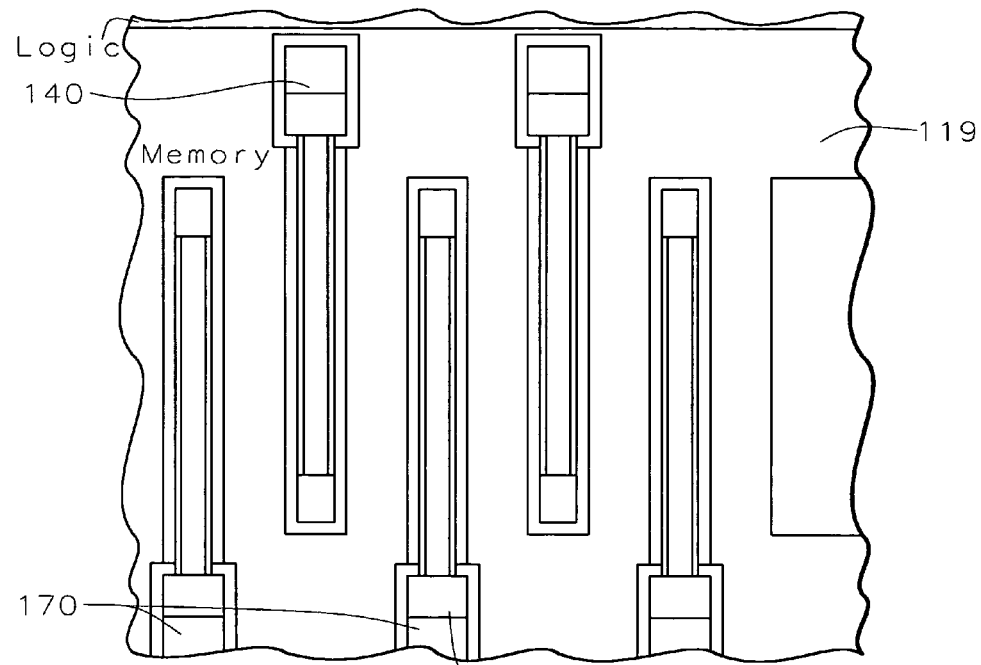
Figure 18B:
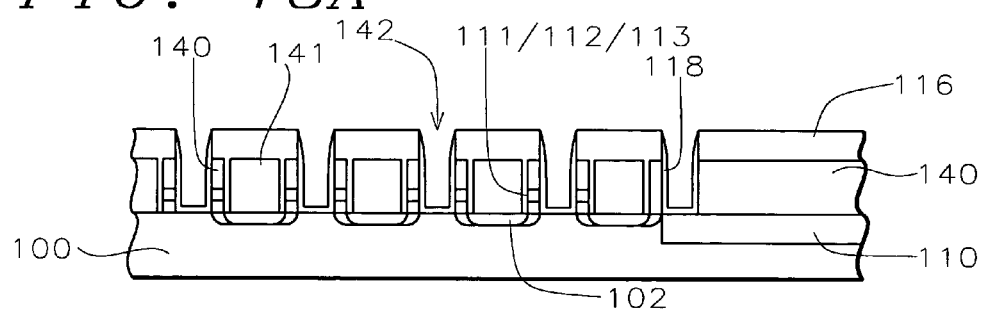
Figure 18C:
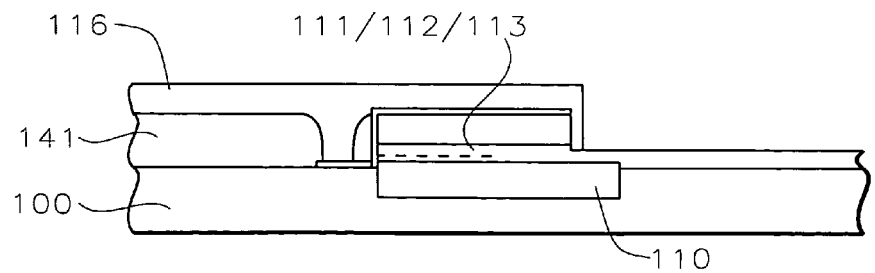

The word gate oxide 118 is grown over the channel area with a thickness of about 3 to 15 nm, as shown in FIGS. 18A, 18B, and 18C. The logic gate is wrapped with oxide. The control gate slope is positive and the word gate trench opening is also positive. It is convenient to fill and/or etch out the polysilicon in the trench.

Figure 19A:
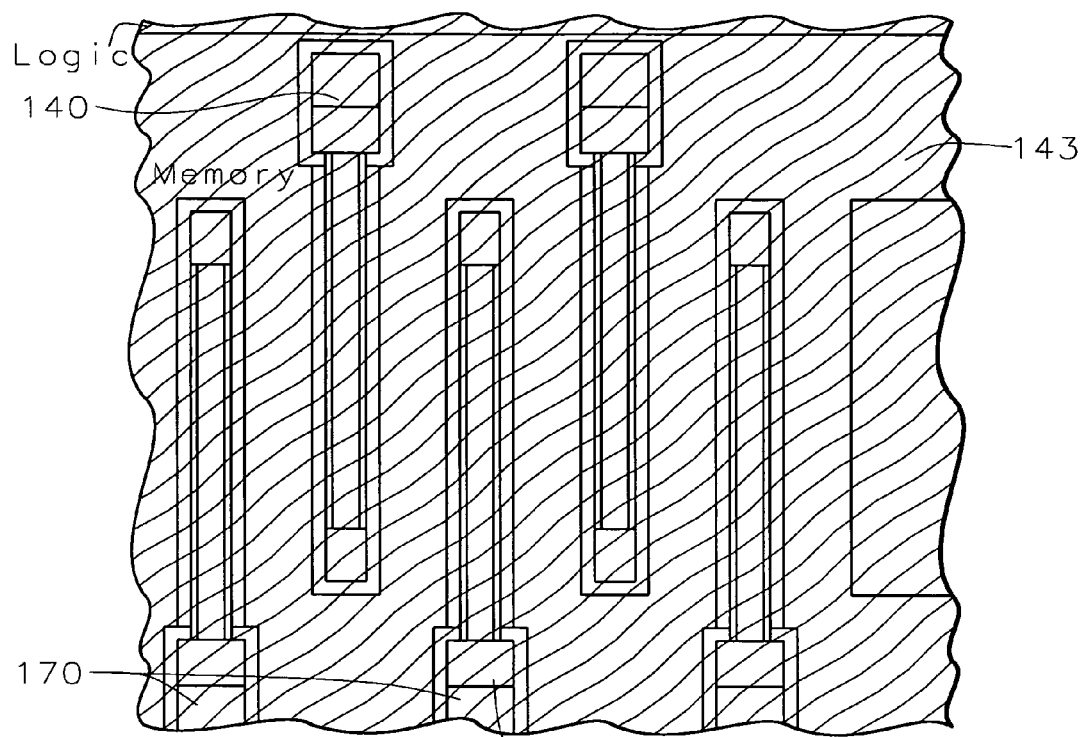
Figure 19B:
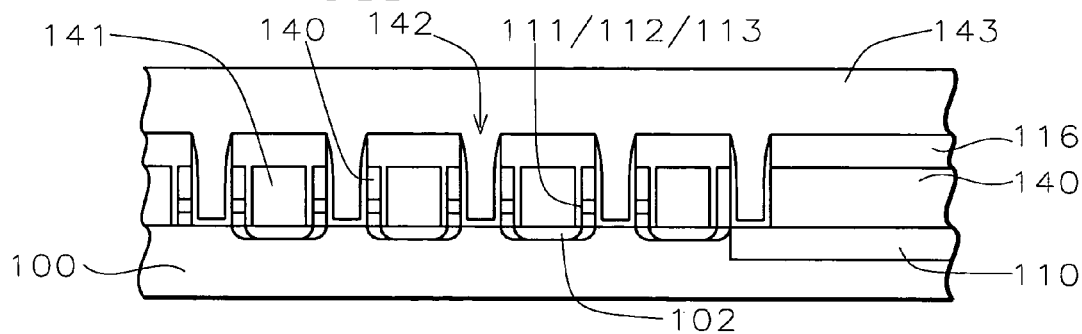
Figure 19C:
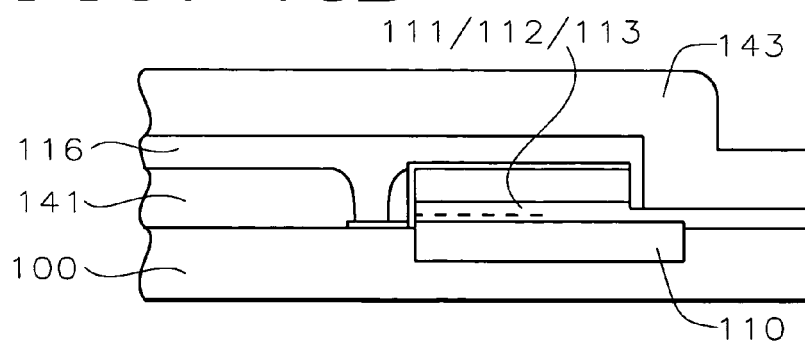
Figure 20A:
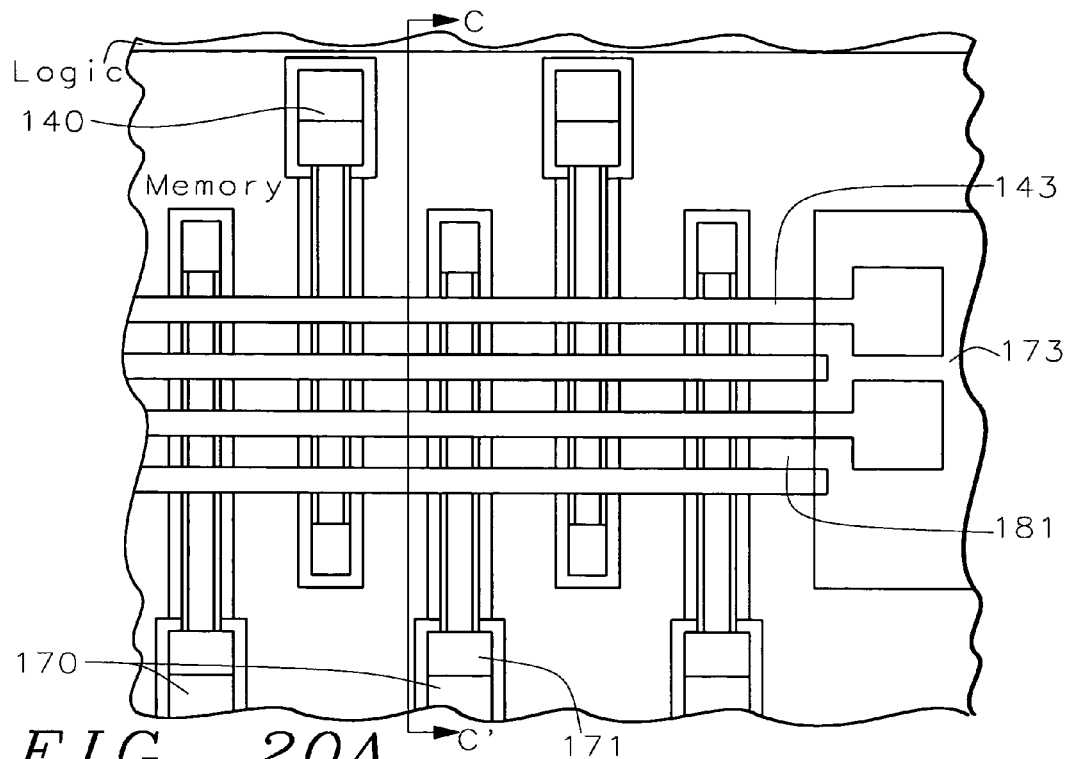
Figure 20B:
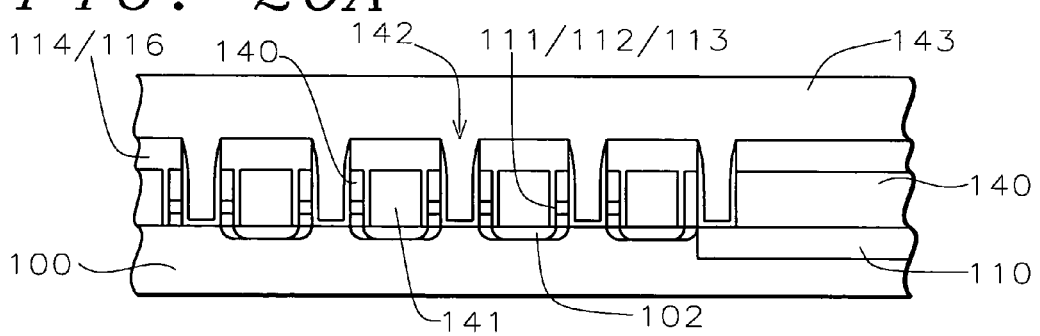
Figure 20C:
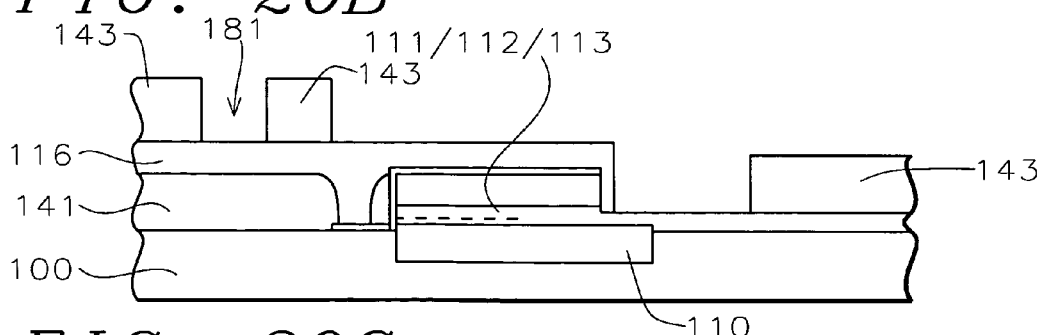

Referring to FIGS. 19A, 19B, and 19C, another polysilicon layer 143 is deposited to fill the word gate trench 142 to the thickness about 80 to 150 nm. The word line 143 is patterned horizontally, crossing the word gate trench 142 by a conventional lithography. The polysilicon under the space 181 between the word lines in FIG. 18A is etched out as shown in FIGS. 18B and 18C.

Then the word line 143 including word line contact pad 172 is completed. During the word line process, the logic area is masked with photoresist. A field implant of B or $BF_2$ with a dose about 1E14 is allowed to isolate individual memory cells. It is followed by the conventional logic process. The word line space 180 is plugged by a logic spacer. The word line 143 may see logic salicidation.

There are three more variations in the fabrication method of the second embodiment. The $1^{st}$ variation is to define the CG hard mask 114 after cap nitride strip as shown in FIG. 21 instead of the step after cap nitride mask described in FIG. 10B. CG mask 114 does not have to be oxide.

Figure 22A:
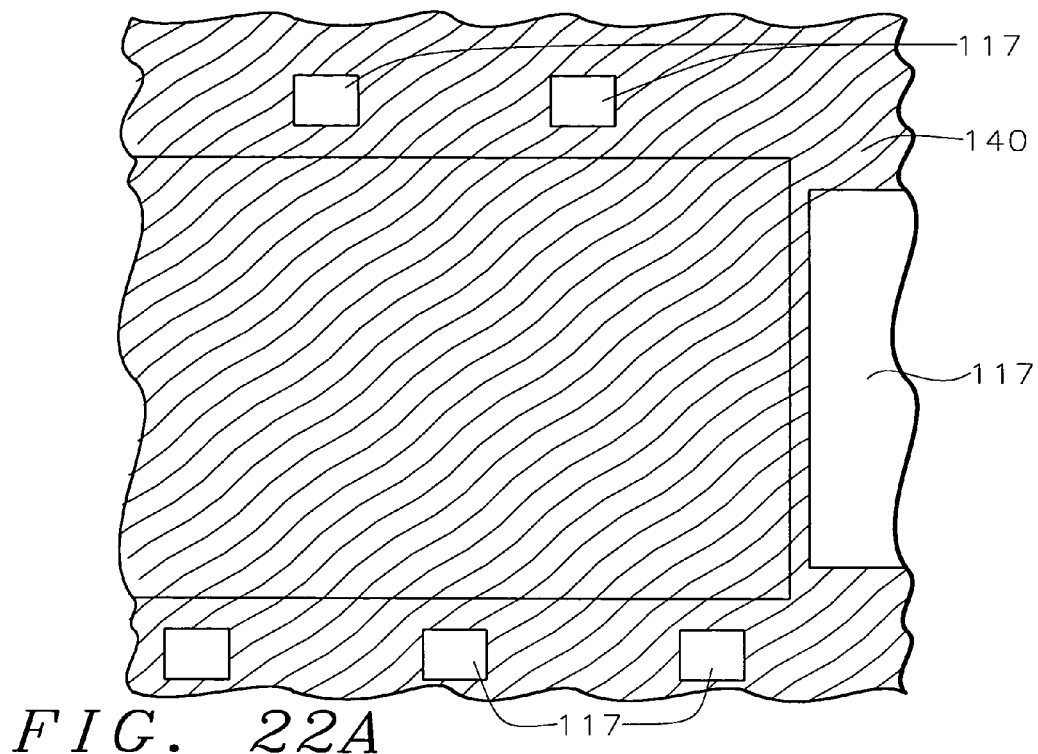
Figure 22B:
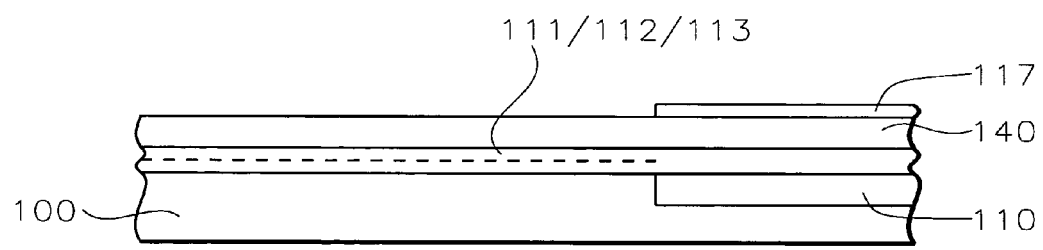
Figure 22C:
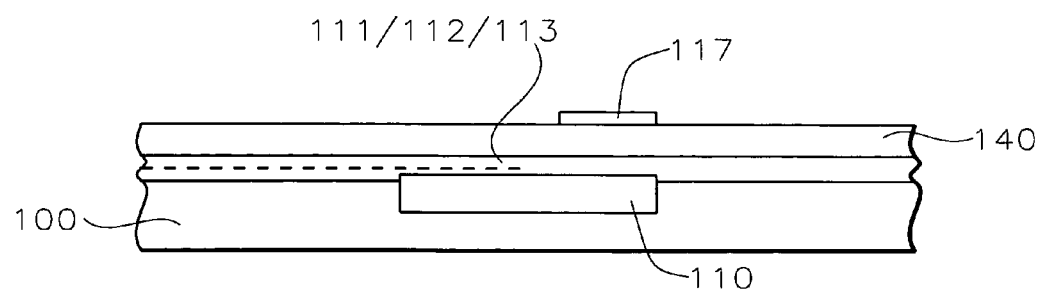

The $2^{nd}$ variation is to adapt thick oxide protection 117 on the contact covers for the control gate and the word line after depositing the $1^{st}$ polysilicon 140 as shown in FIGS. 22A, 22B, and 22C. The photoresist process in FIG. 11B is not necessary with the thick oxide.

Another option is to define the logic gate with CG polysilicon 140 instead of the word line polysilicon 143. The logic area is covered with photoresist at word gate trench etching.

Figure 23A:
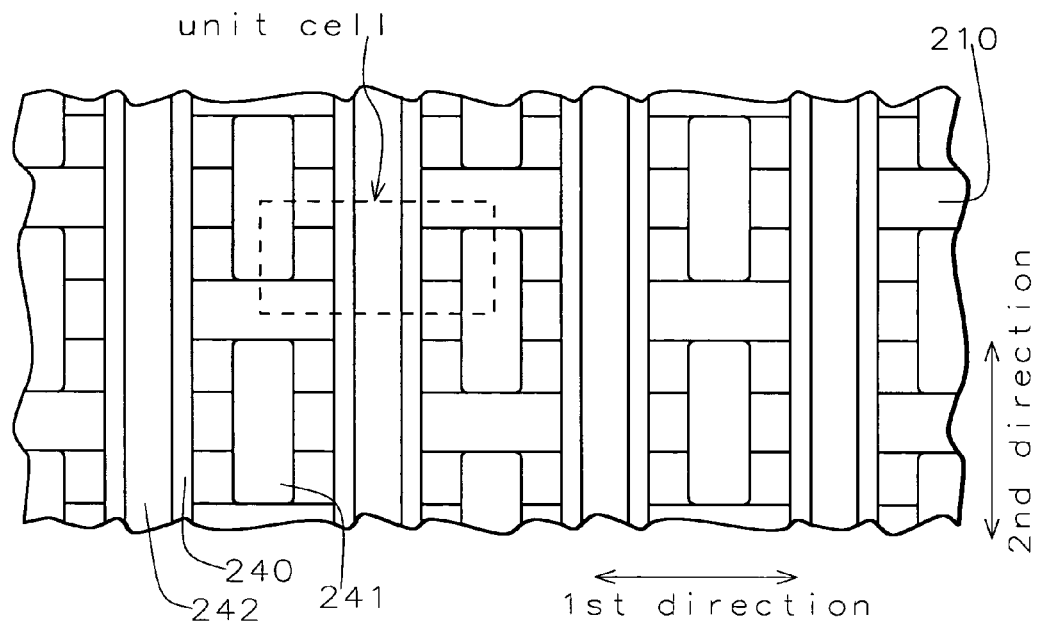
FIG. 23A is a top view of an enlarged portion of the third preferred embodiment cell structure of the present invention.
Figure 23B:
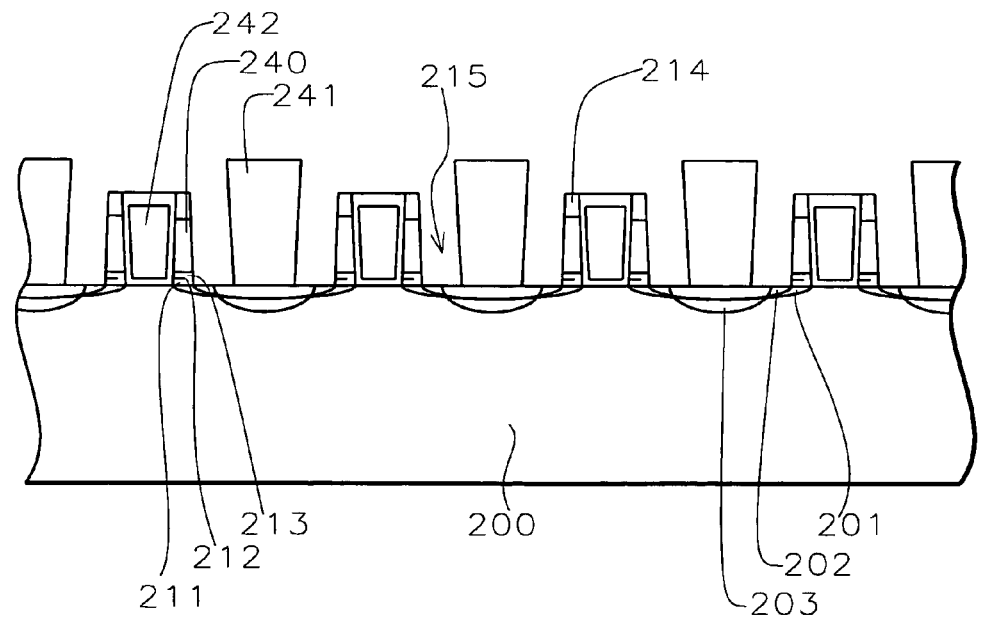
FIG. 23B is a cross-sectional representation of an enlarged portion of the third preferred embodiment cell structure of the present invention.
Figure 24:
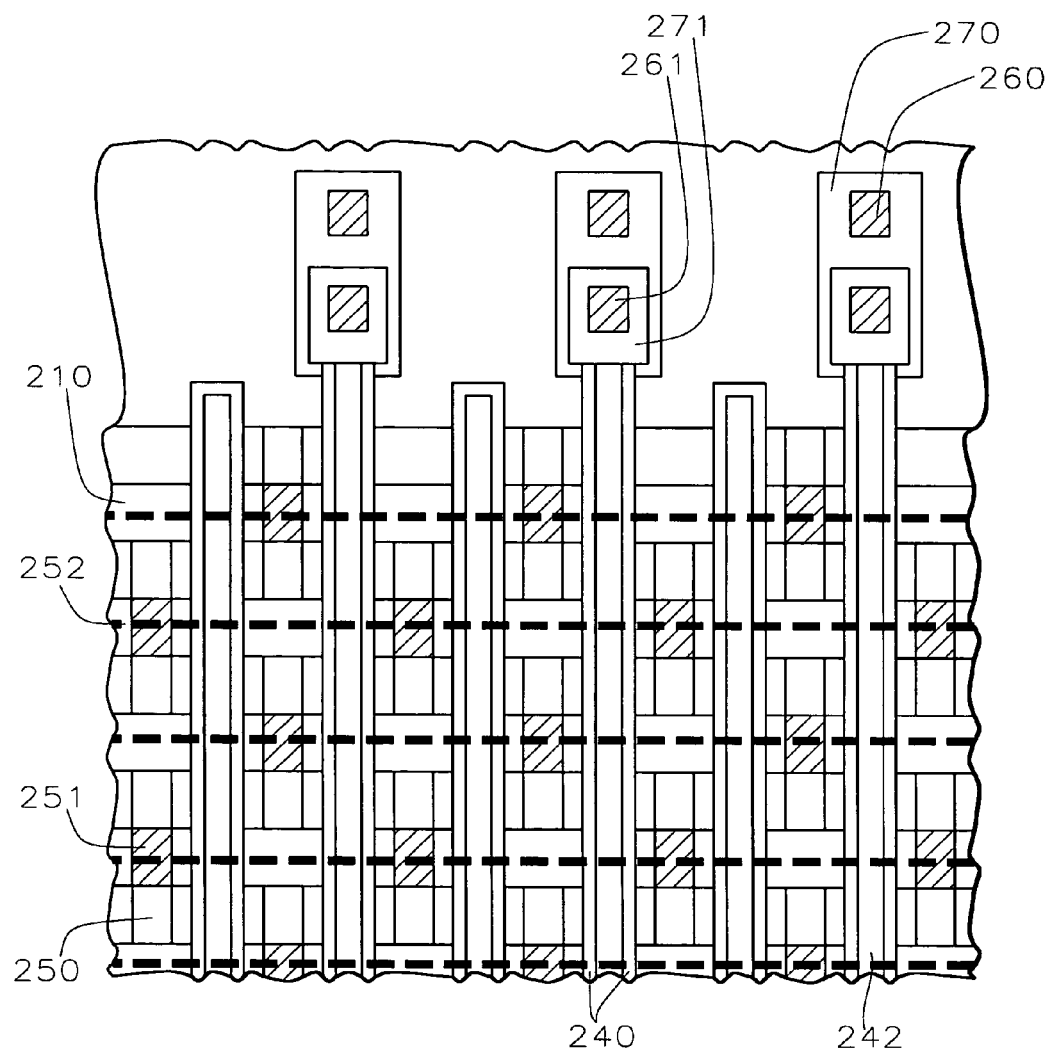
FIG. 24 is a top view representation of the third preferred embodiment array structure of the present invention.

The device cross-sectional structure of the third embodiment along the $1^{st}$ direction is shown in FIG. 23B as well as the top view in FIG. 23A. The array architecture is shown in FIG. 24. The cell structure is a modified structure of the second embodiment for a metal bit application. A unit cell is bounded by STI 210 in the second direction and by both sides of diffusions shared by adjacent unit cells in the first direction. The diffusion area 202 also isolated by the STI is connected to an adjacent diffusion alternately by local wiring 241.

The local wire is shared by 4 memory elements under the control gate. The word gate 242 and the control gate 240 run together along the $2^{nd}$ direction. The word gate becomes the word line. The local wiring 241 is connected to $1^{st}$ metal 252 through bit line contact 251 as shown in FIG. 24. The $1^{st}$ metal is designated as a bit line so that the architecture was named as metal bit architecture. The word gate contact 261 and its cover 271 are placed on the end of word line 242, likewise placing the bit line contact 161 and its cover 171 in the second embodiment. The placement of the control gate is identical with the second embodiment.

Figure 25A:
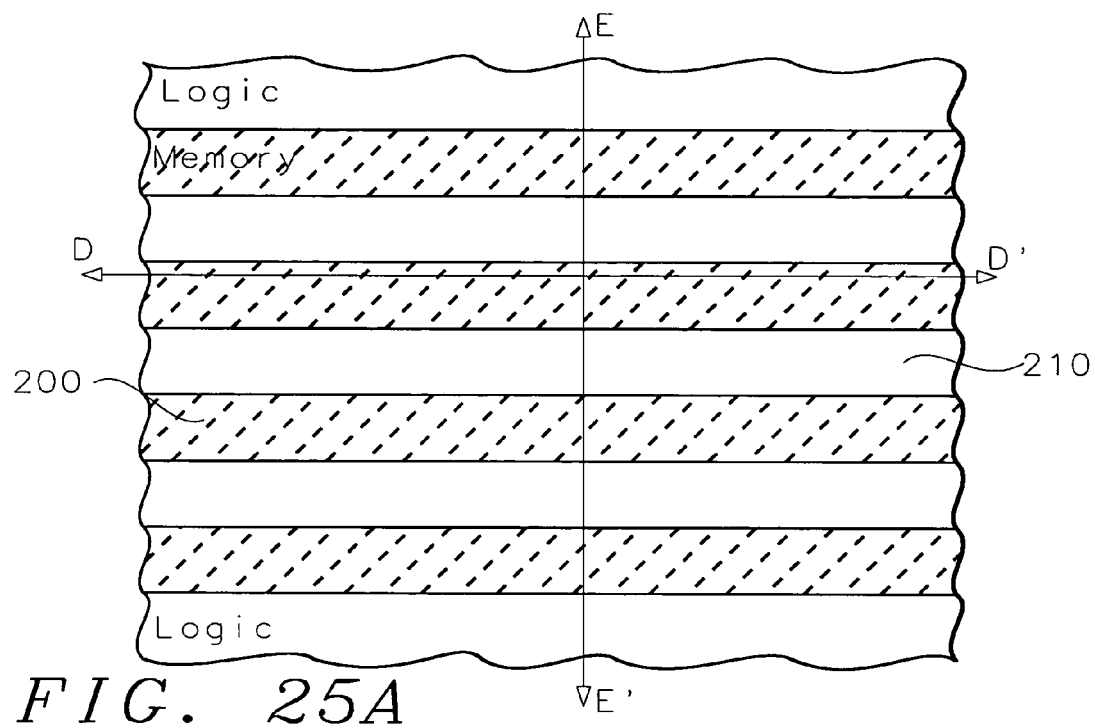
Figure 25B:
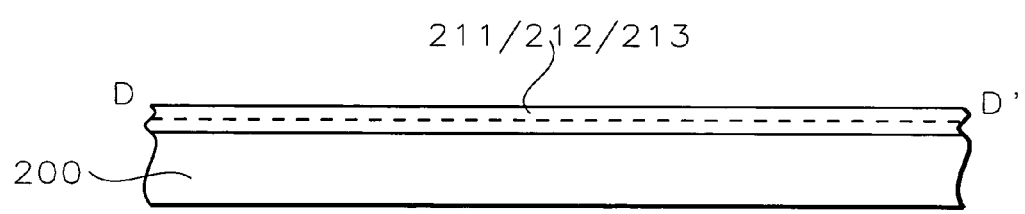
Figure 25C:
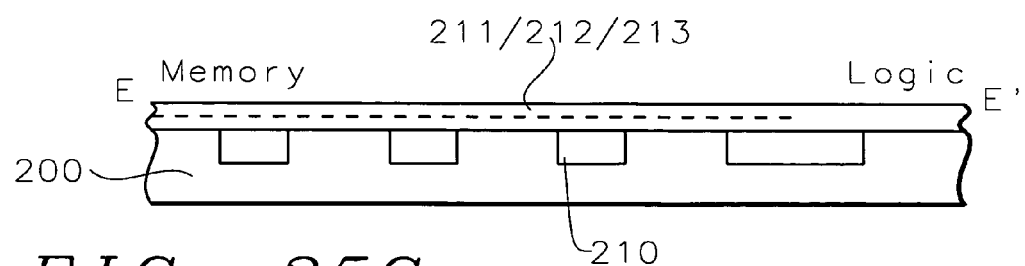

The fabrication method of the third embodiment is mostly derived from the second embodiment. It is mainly different from the second embodiment in process sequence to define the word gate prior to the diffusion. Referring to FIG. 25A, the memory active area is defined by straight STI 210 using a conventional process to isolate the memory cell along the $2^{nd}$ direction. STI is also created in memory-logic boundary and contact area of the word line and the control gate as shown in FIGS. 25A, B and C. The process steps through ONO formation, gate oxide formation, deposition of the control gate polysilicon 240, cap nitride 219 deposition, cap nitride mask, and oxide CG mask formation to the control gate polysilicon are copied from the second embodiment as shown in FIG. 9 to FIG. 11.

Figure 26A:
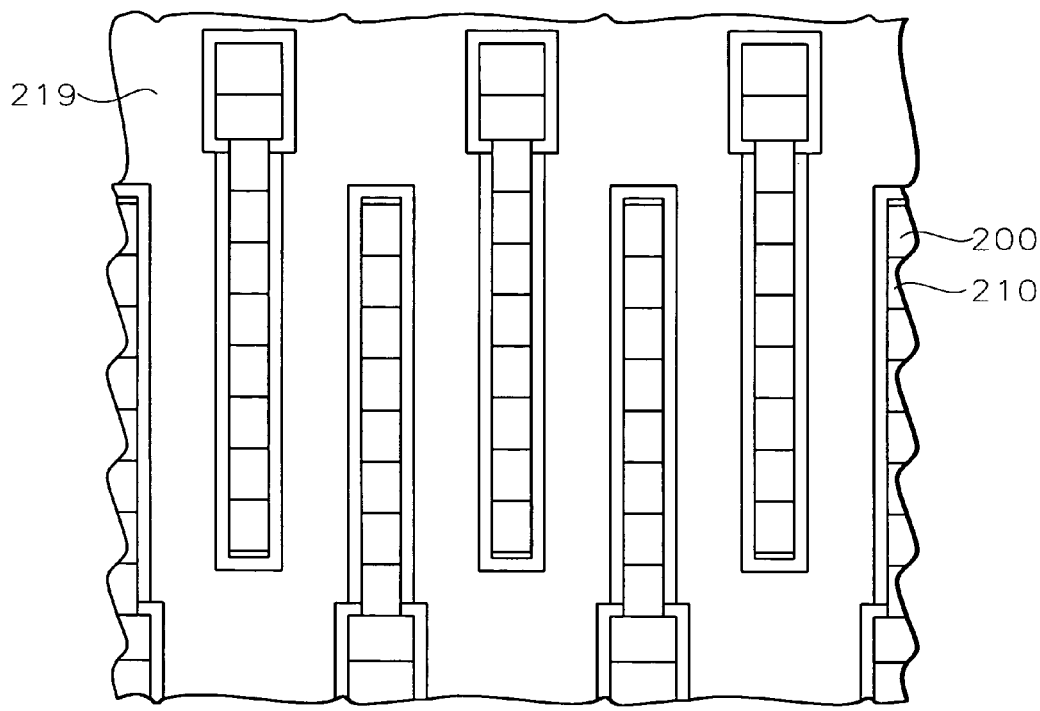
Figure 26B:
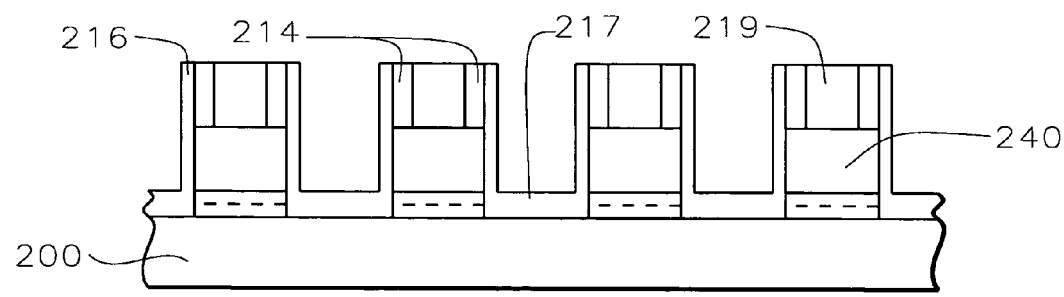
Figure 26C:
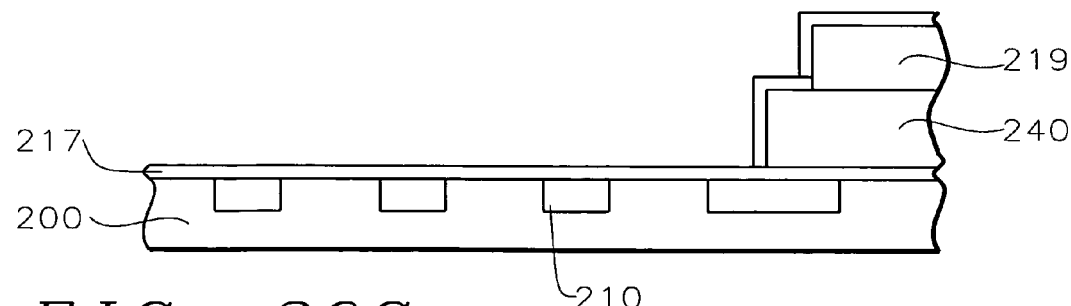

Referring to FIGS. 26A, B and C, CG-word isolation 216 is formed on the control gate polysilicon and the word gate oxide 217 is grown after the $1^{st}$ CG polysilicon etching likewise as described in the second embodiment.

Figure 27A:
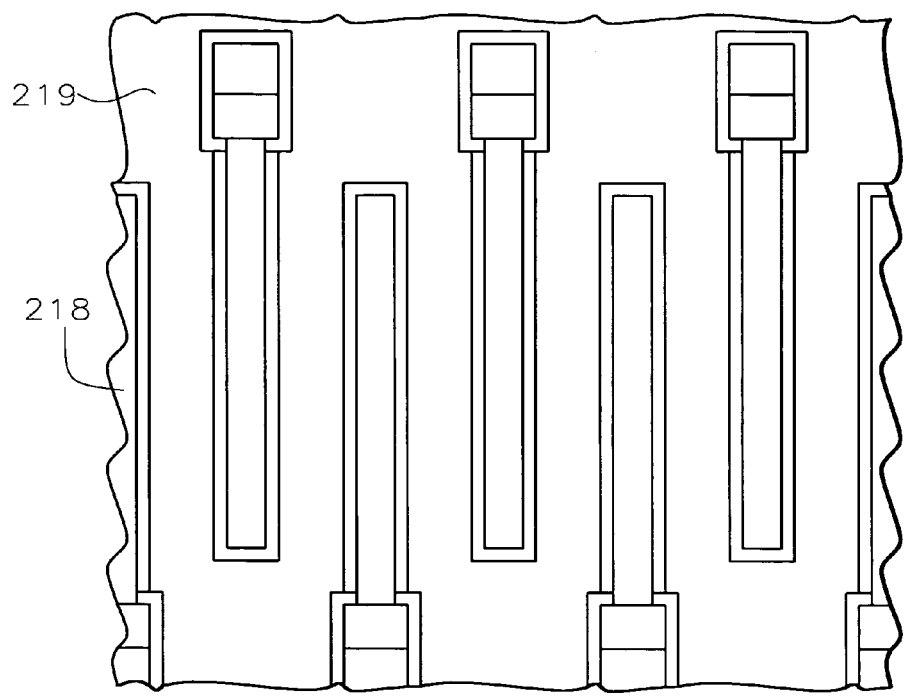
Figure 27B:
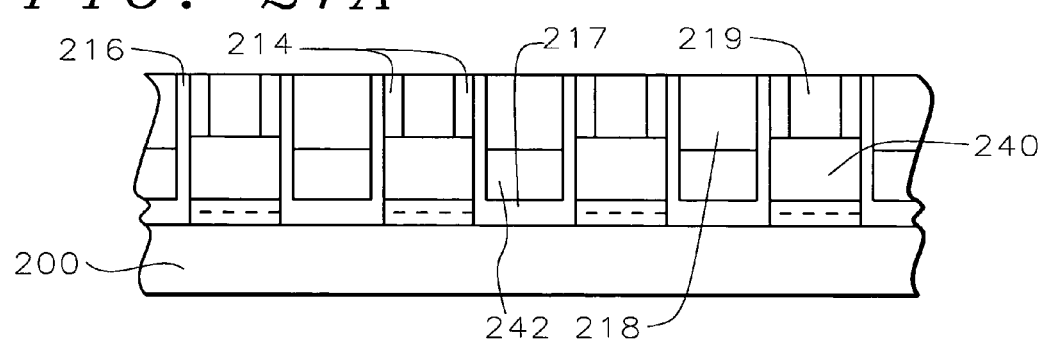
Figure 27C:
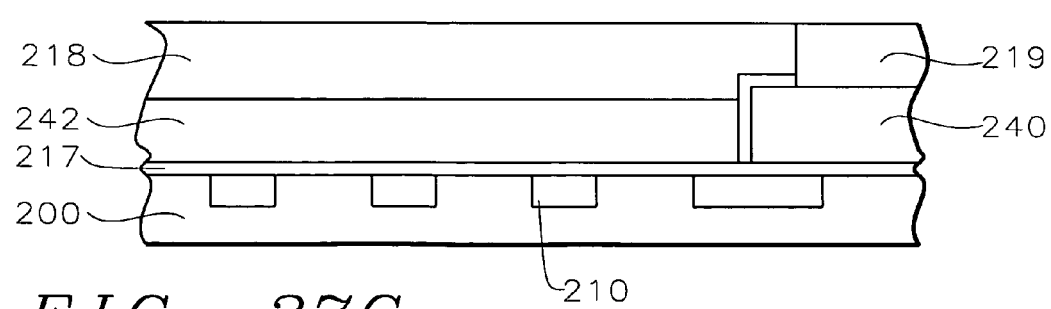

Referring to FIGS. 27A, B and C, the word gate polysilicon 242 is deposited to be plugged in the word gate trench. The polysilicon is recessed down as in the raised diffusion process in the second embodiment. The oxide 218 is deposited and planarized by CMP or etching back.

Figure 28A:
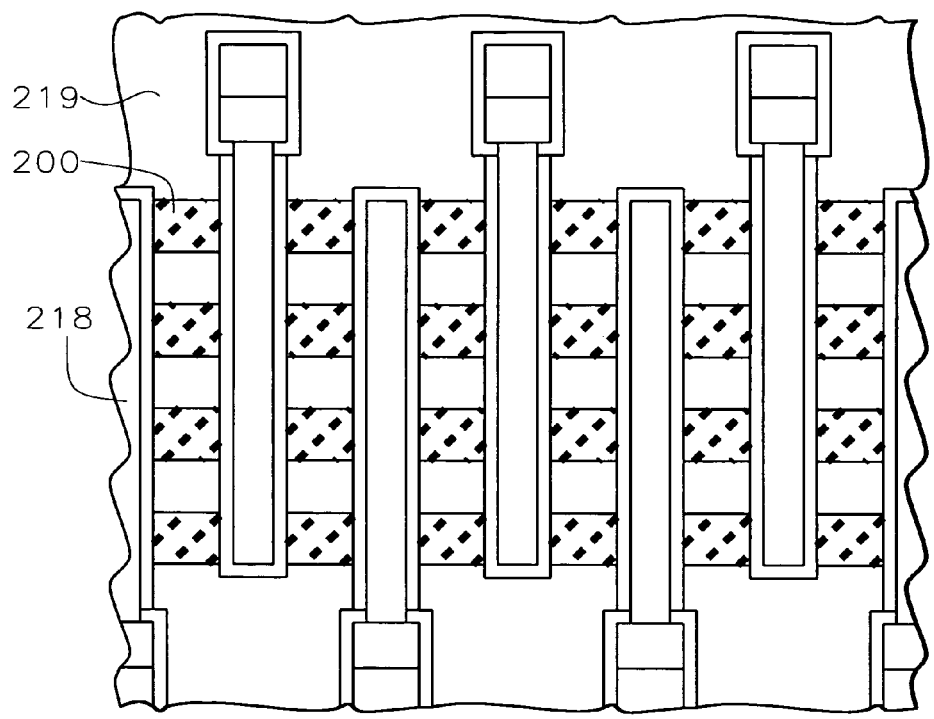
Figure 28B:
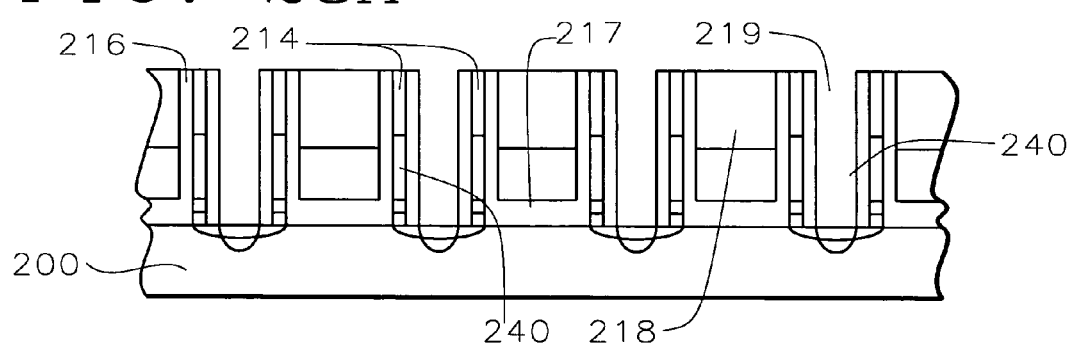
Figure 28C:
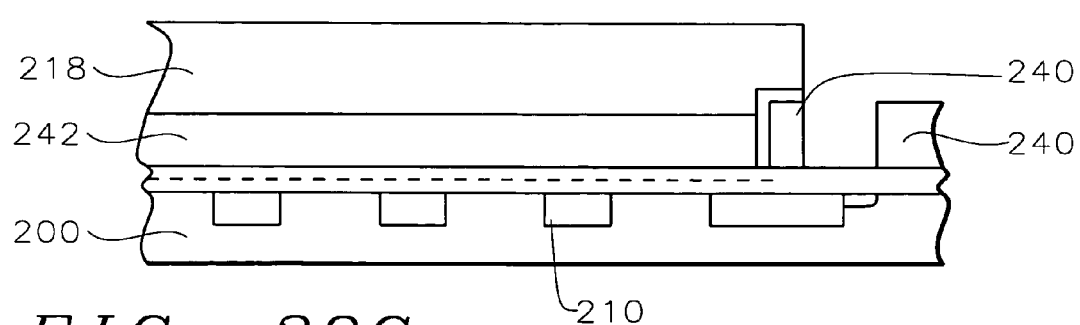

Referring to FIGS. 28A, B, and C, cap nitride 219 is stripped by wet etching or dry etching and polysilicon 240 under the cap nitride is exposed. The photoresist is patterned on the logic area polysilicon. The polysilicon 240 is vertically etched to ONO. ONO is subsequently gently etched out. The CG channel implant and LDD implant are allowed with the same conditions as in the second embodiment, then followed by memory spacer 215 and memory source/drain implant 203.

Figure 29A:
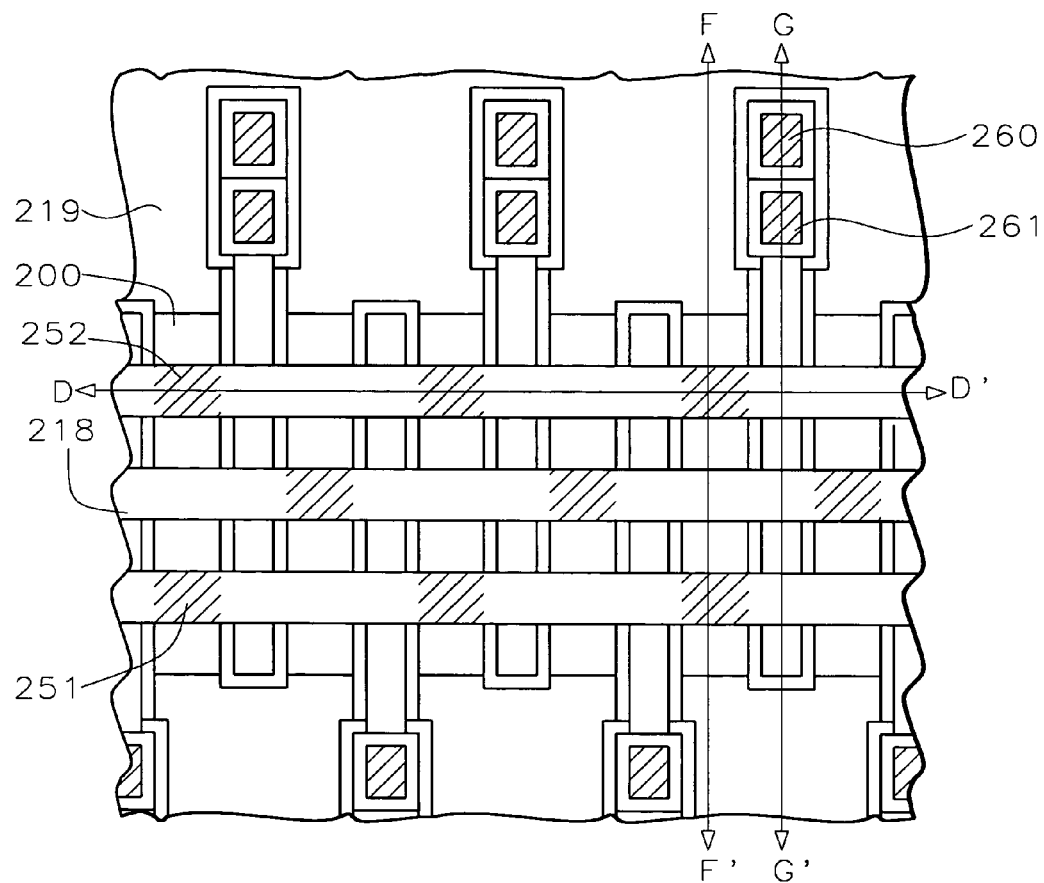
Figure 29B:
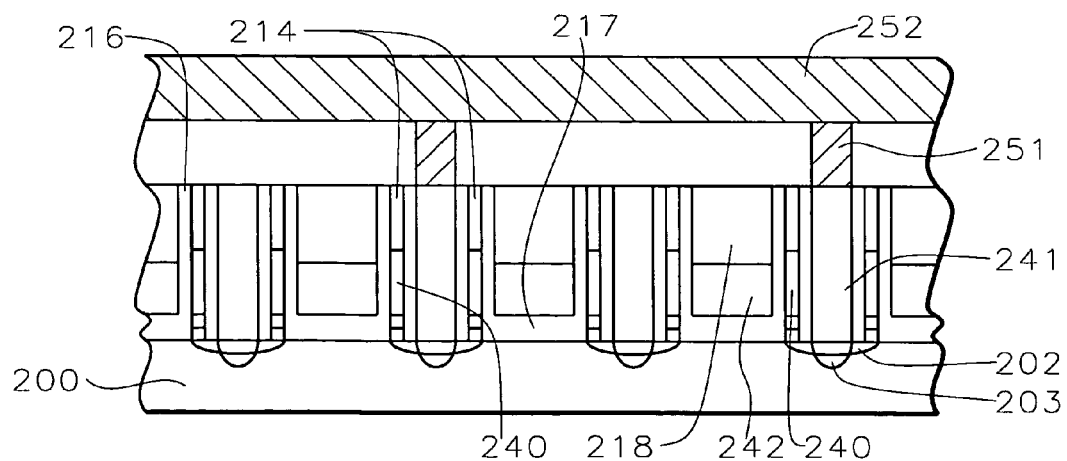

Referring to FIGS. 29A, B, C and C1, FIG. 29C is a cross section along word gate polysilicon 240 (cross-section G-G') and FIG. 29 C1 is along the word gate space (cross-section F-F'). After oxide planarization, adjacent every pair of diffusions are connected together by local wiring 250 as shown in FIG. 29C1. The bit contact 251 is paced on the center of the local wiring 250. The bit contacts are connected by the $1^{st}$ metal 252. The control gate contact 260 and the word contact 261 are placed at the end of the word line as shown in FIGS. 29A and C. The third embodiment is therefore completed.

Figure 30:
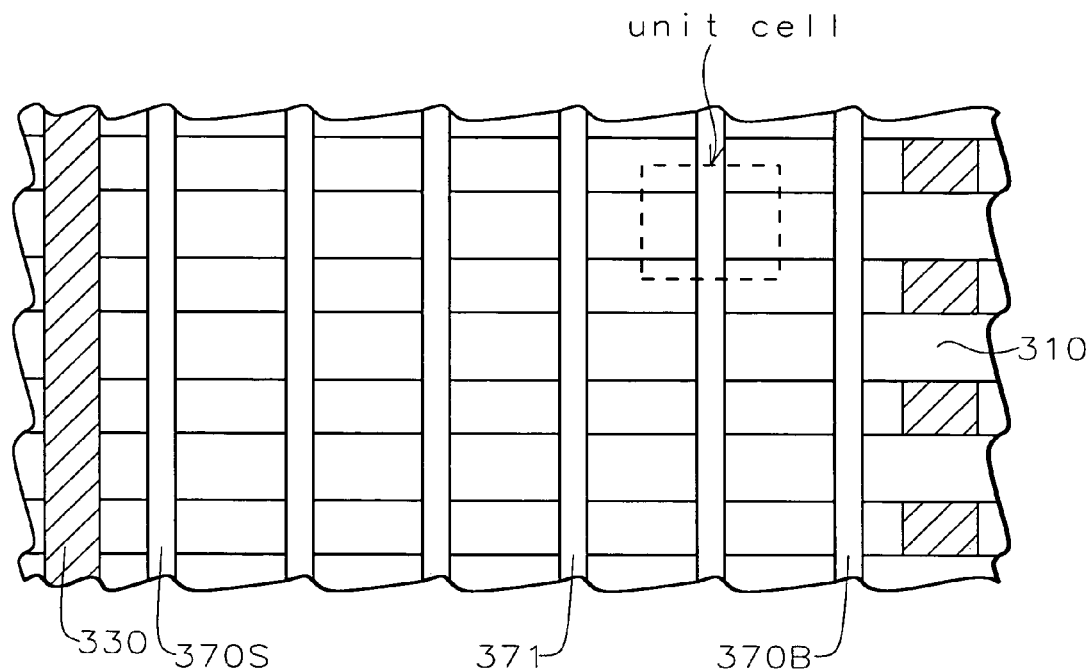
FIG. 30 is a top view of an enlarged portion of the fourth preferred embodiment cell structure of the present invention.
Figure 31:
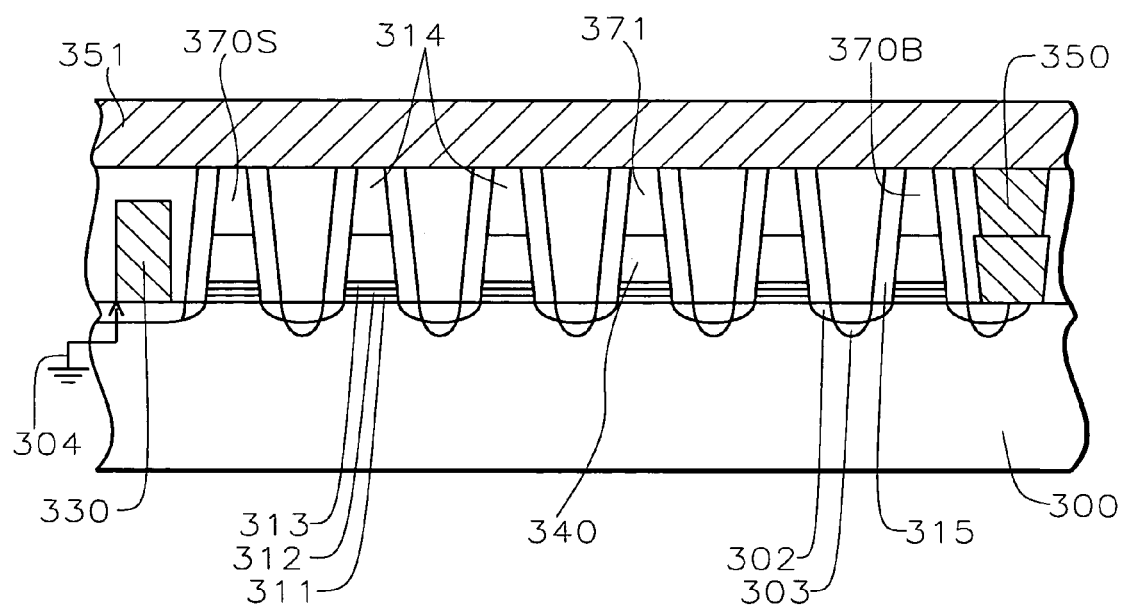
FIG. 31 is a cross-sectional representation of an enlarged portion of the fourth preferred embodiment cell structure of the present invention.

A top view and a cross sectional structure of the fourth embodiment are shown in FIG. 30A and FIG. 30B. It is simply replacing the floating gate in the conventional NAND by nitride 312 besides reducing the cell size. The memory cell structure is of subtracting the word gate 242 in FIG. 23B of the third embodiment and forming a diffusion area instead. The unit cell is shown in FIG. 30 as a rectangular dotted line. It consists of a half of a diffusion area combining memory LDD 302 and source/drain 303, a control gate with underlying ONO 311/312/313 as a memory storage and the other half of the diffusion area along the channel direction. Crossing direction is bounded by conventional STI 310. The oxide sidewall mask 314 defines the width of the control gate and underlying ONO to between about 30 nm and 60 nm. It is much smaller than the control gate width of the conventional NAND. The direction across the channel is bounded by STI along the channel. The array structure follows NAND with the only difference being replacing the floating gate by nitride. The bit lines run along the active area isolated by STI lines. The control gate lines are across the bit lines. An operation block is defined as a (n bit lines×m control gate lines) matrix. The control gate lines 370B, 370S at both ends of the block are assigned as gates to select a block to be operated. Two adjacent blocks share a diffusion area in between either as a common source line adjacent to the select gate 370S or a data bit adjacent to the other select gate 370B connecting to a bit line 351 through a contact 350. The control gate mask 314 is a sidewall image. The sidewall image loops around. The looping mask is separated into two lines by cutting it at both ends. The adjacent control gate lines of adjacent loops are cut at the control edge cut 381 alternately each end. The control gate contact cover 380 is placed on the out side of edge cut 381.

Two device operation methods of the fourth embodiment are provided, utilizing F-N tunneling through the top oxide. The first method is for program to eject electrons from the nitride and for erase to inject electrons into the nitride with the voltage condition as shown in FIG. 32A1 and FIG. 32A2. The common source line is always grounded. The program operation is allowed by applying a high voltage on a gate and a low voltage on a channel of a selected memory cell to eject electrons stored in the nitride through the top oxide. Memory cell Vt (threshold voltage) shift is controlled by a difference of provided voltages on the gate and the channel. The difference is adjusted by the channel voltage provided from the bit line or the gate voltage and enables the multi level memory cell with controllable Vt at 4 or 8 levels. A memory cell is selected by a bit line 351 in FIG. 30, a control gate line 371 and a pair of selected gates 370B at the bit side and 370S at the source side. The selected bit line voltage is adjusted between 0 to 3V to control the Vt at multi level. 6V is provided on the bit side select gate and unselected control gates to pass the bit line voltage under the gates. The selected control gate is controlled at 13V. The difference between 13V on the gate and the bit line voltage passing through to the channel shifts the cell Vt to the required voltage level. The difference between the unselected cell gate and the channel does not shift the Vt. 4V is provided to unselected bit lines to lower the voltage difference between the selected gate and the unselected bit line to prevent programming. The erase operation is allowed on the whole block. All the control gates are connected to −13V and the pair of select gates and substrates are connected to 0V to inject F-N electrons into the nitride through the top oxide.

The second operation method of the fourth embodiment is for program to inject electrons into the nitride and for erase to eject electrons from the nitride with the voltage condition as shown in FIG. 32B1 and FIG. 32B2. The program operation is allowed by applying a low voltage on a gate and a high voltage on a channel of a selected memory cell to inject electrons into the nitride through the top oxide. The memory cell is selected by a bit line, a control gate line and a pair of selected gates at the bit side and at the source side. The selected bit line voltage is adjusted between 0 to 3V to control the Vt shift. 6V is provided on the bit side select gate and all the control gates to pass the bit line voltage under the gates, followed by lowering the selected control gate to −13V to inject electrons. The difference between 10V on the gate and the channel voltage passed from to the bit line shifts the memory cell Vt to the required voltage level. The difference between the unselected cell gate and the channel is too small to shift the Vt. 4V is provided to the unselected bit lines to lower the voltage difference between the selected gate and the unselected bit line to prevent programming. The erase operation is allowed on the whole block. All the control gates are raised to 13V, the bit select gate is 0V to shut down the bit voltage, and the source select gate is opened with 6V to pass 0V to the channels.

Figure 33A:
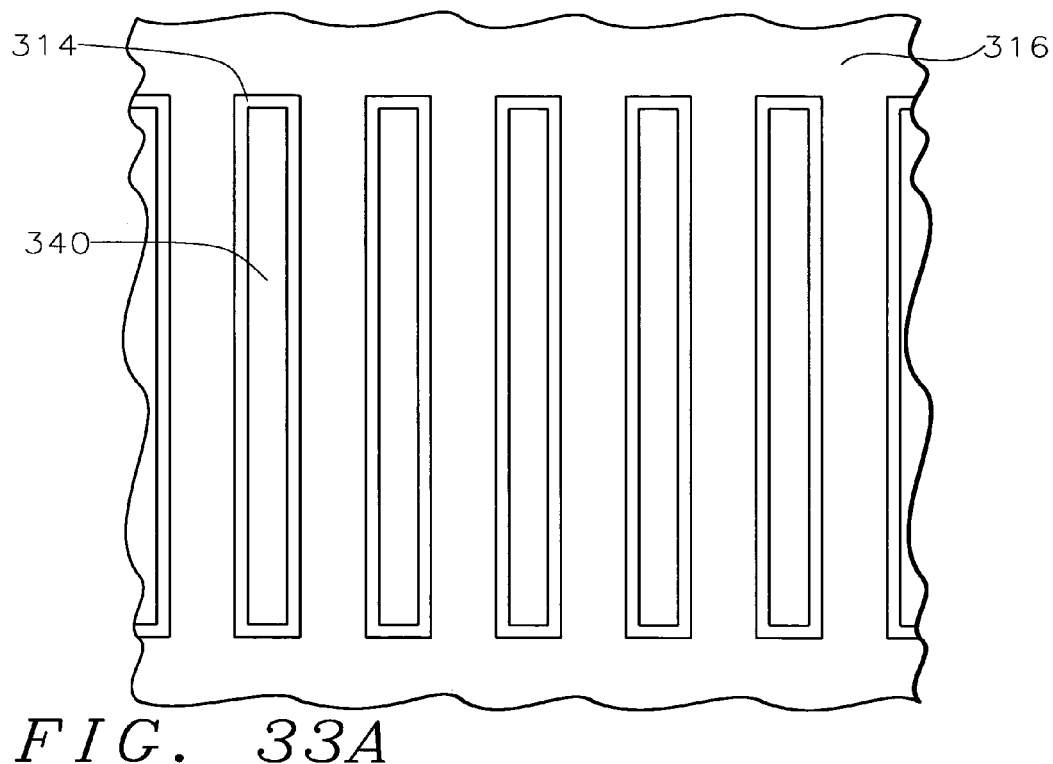
Figure 33B:
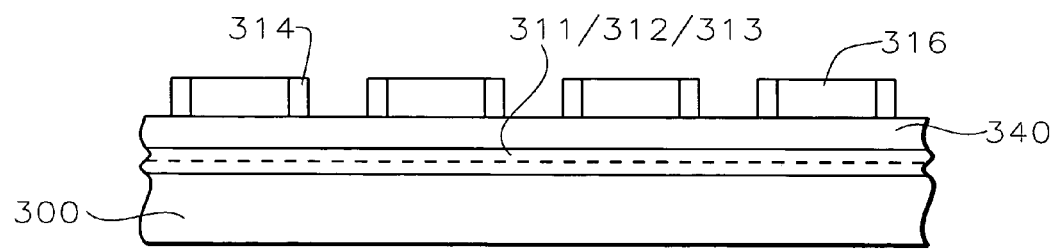
Figure 33C:
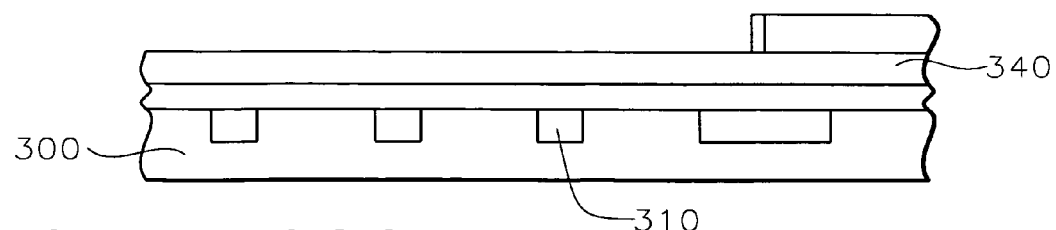

The fabrication method of the fourth embodiment is featured to skip the word gate process in the third embodiment. Referring to FIGS. 33A, B, and C, the process steps through to sidewall oxide mask are common with the third embodiment. ONO stack film, bottom oxide 311/nitride 312/top oxide 313, the control gate polysilicon 340, and cap nitride 316 are deposited with STI 310 running horizontally in the memory array. The cap nitride is patterned as crossing the STI with conventional lithography and vertical etching to polysilicon 340. CG oxide 314 is deposited and vertically etched to form the control gate mask. Though it was followed by vertical polysilicon etching in the third embodiment, the polysilicon etching is skipped at this step in the fourth embodiment.

Figure 34A:
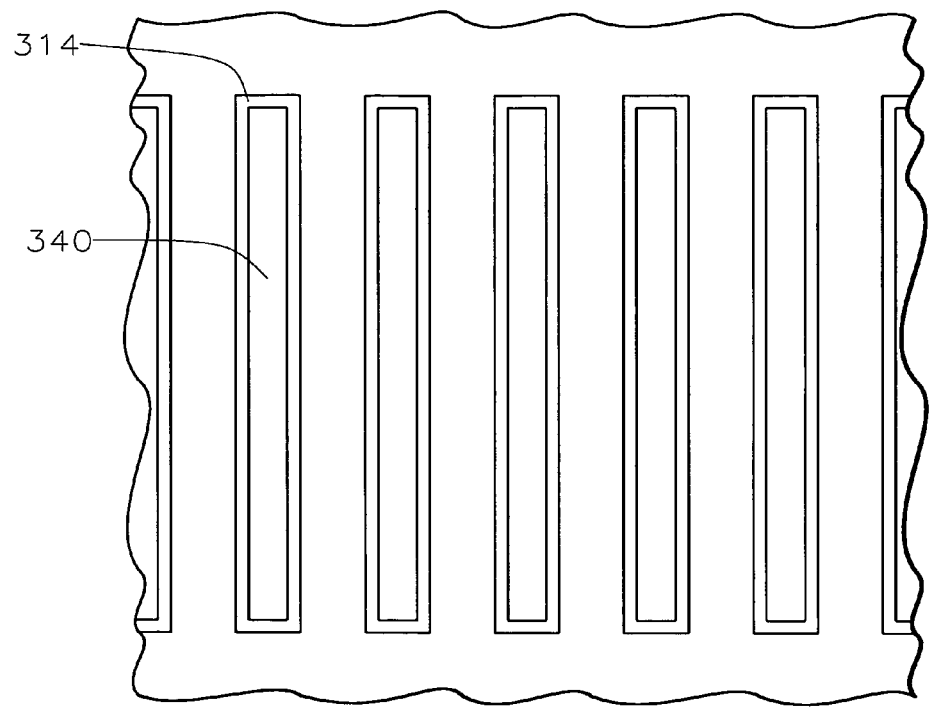
Figure 34B:
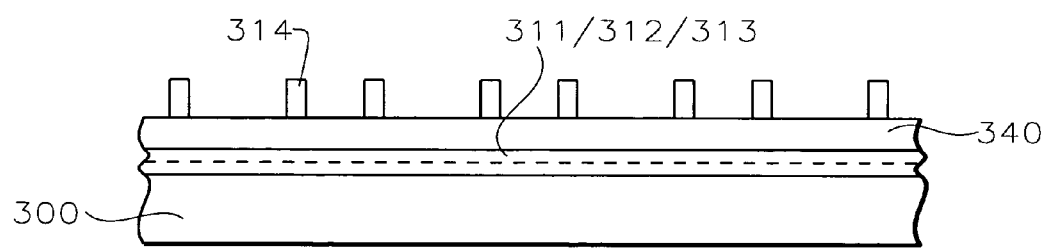
Figure 34C:
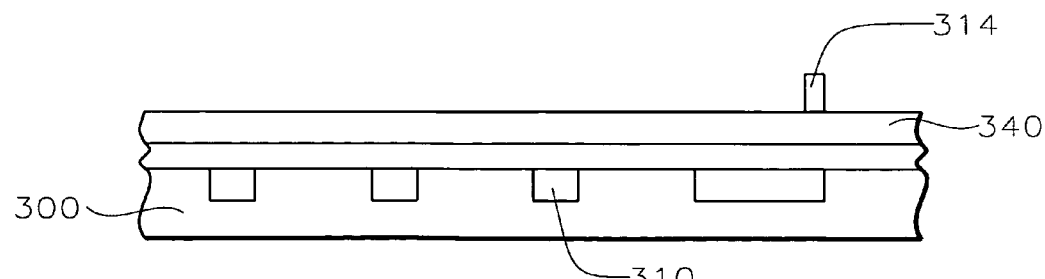
Figure 35A:
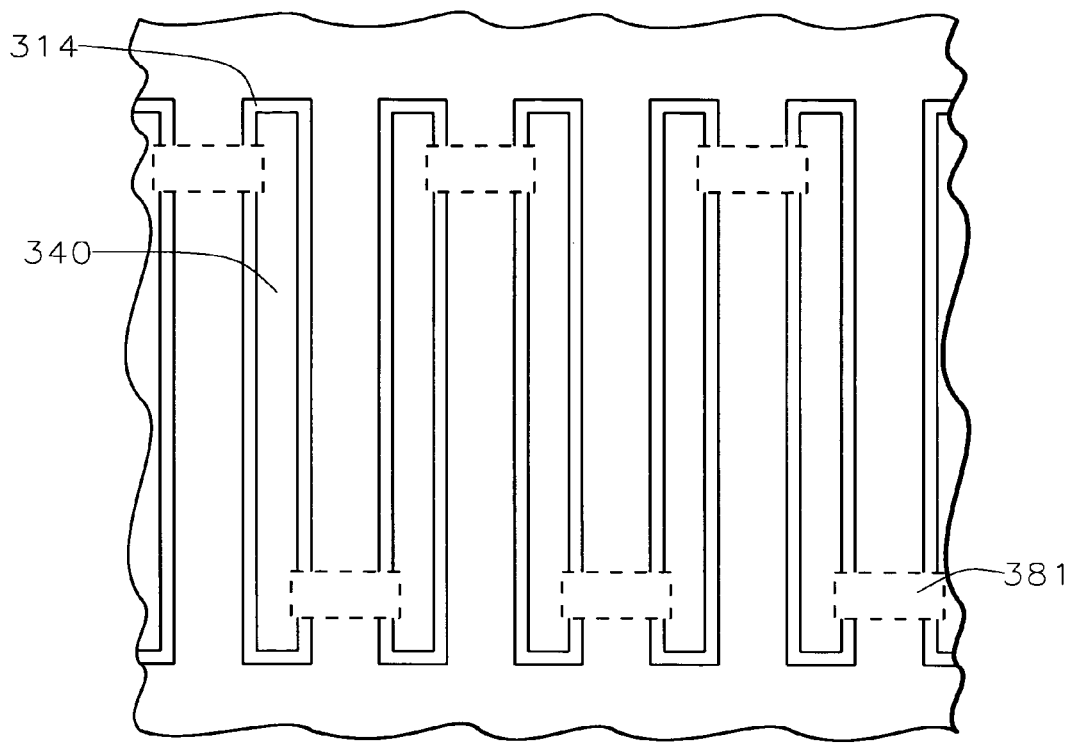
Figure 35B:
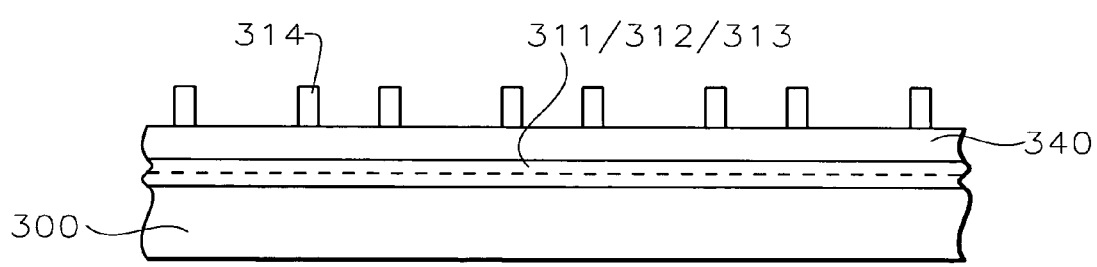
Figure 35C:
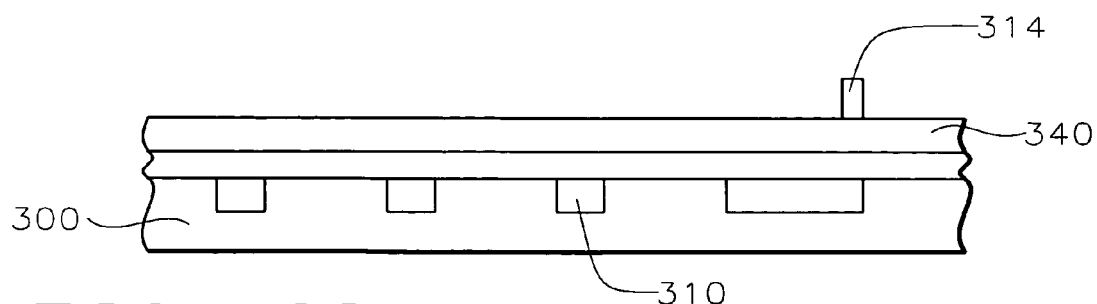

Referring to FIGS. 34A, B, and C, the cap nitride 316 is stripped. There remains only the looped oxide mask on the control gate polysilicon. Referring to FIGS. 35A, B, and C, the looped mask is selectively cut at both ends of a block into two lines using photoresist mask opening the area 381. Adjacent control lines of adjacent loops are cut alternately.

Figure 36A:
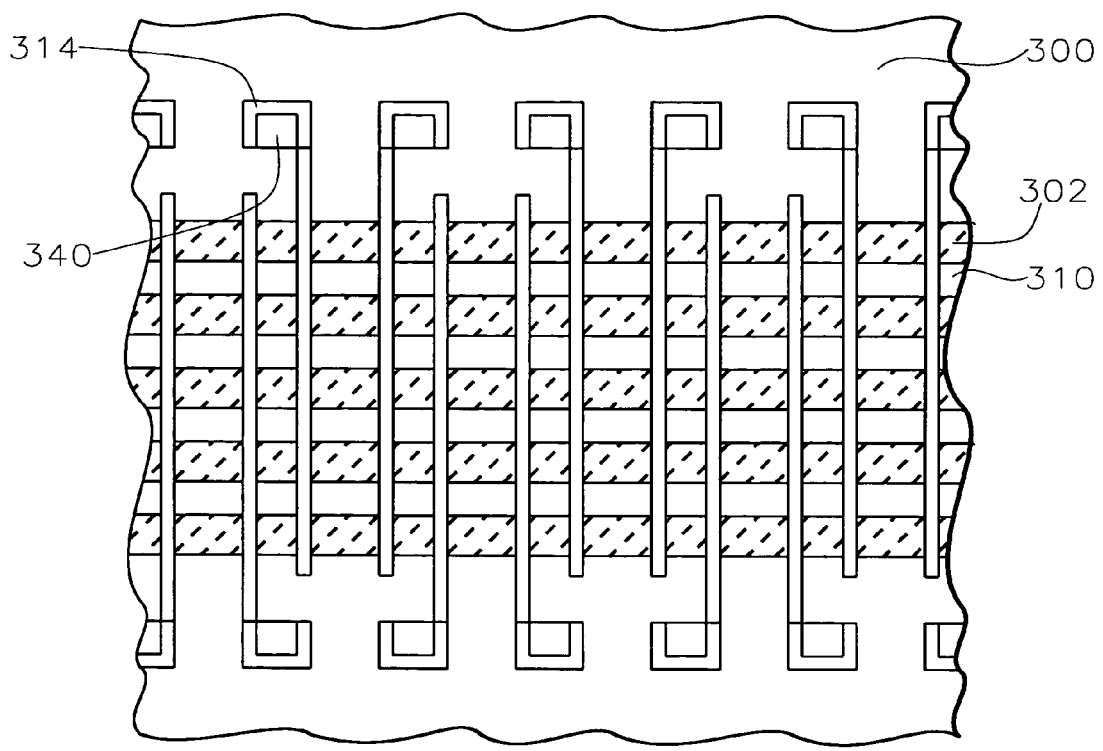
Figure 36B:
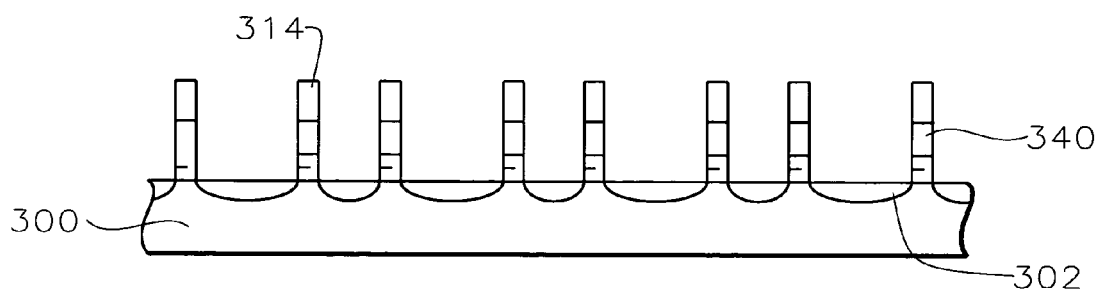
Figure 36C:
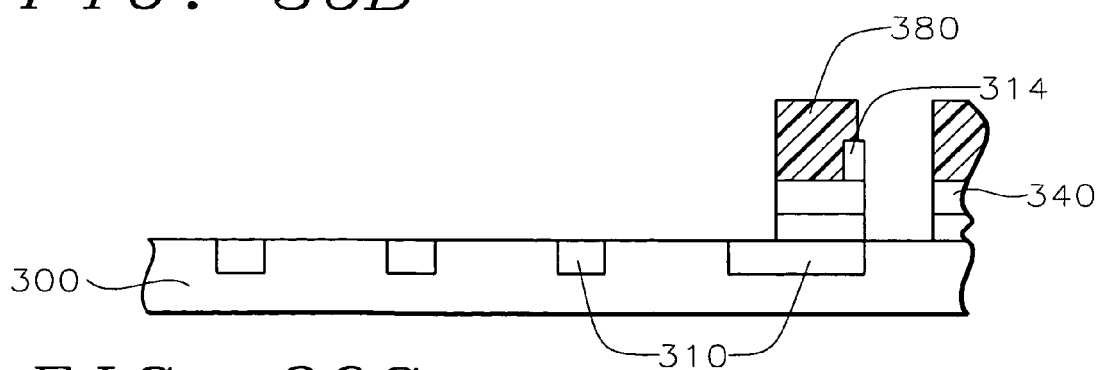

Referring to FIGS. 36A, B, and C, a photoresist mask for the control gate contact cover 380 and logic gate is printed on the polysilicon. The polysilicon 340 is vertically etched out with the sidewall oxide mask 314 and the photoresist mask to top oxide 313 surface. Nitride 312 and bottom oxide 311 is gently stripped out. LDD is implanted with the same conditions as in the second embodiment. The angled channel implant in the second and third embodiments may not be necessary.

Figure 37A:
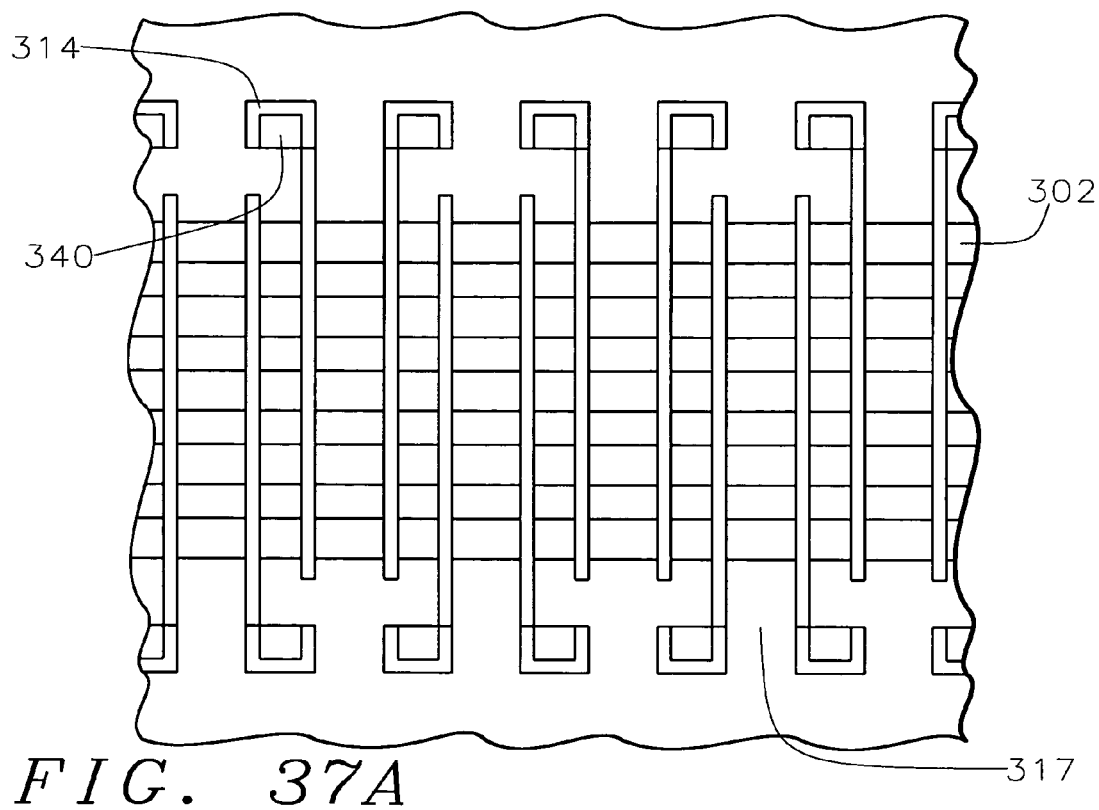
Figure 37B:
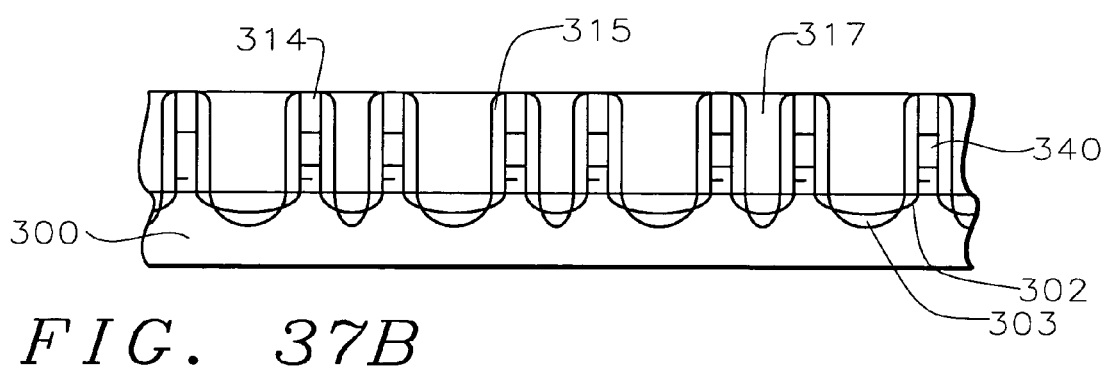
Figure 37C:
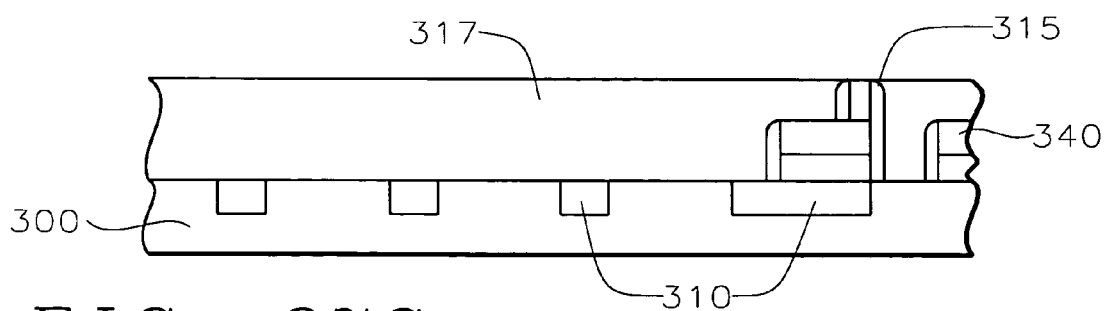

Referring to FIGS. 37A, B, and C, the spacer dielectric film 315 such as nitride is deposited and vertically etched to define source/drain offset 302. The Source/Drain is implanted. Oxide 317 is deposited to plug the source/drain canyon and planarized with CMP.

Figure 38A:
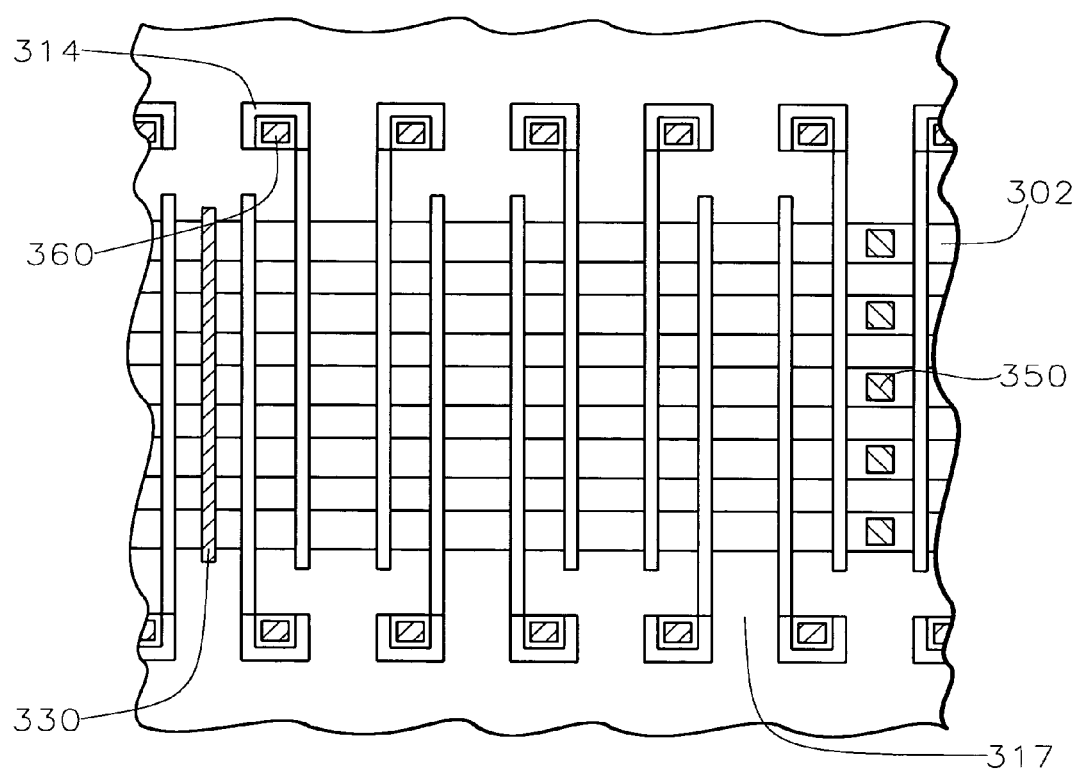
Figure 38B:
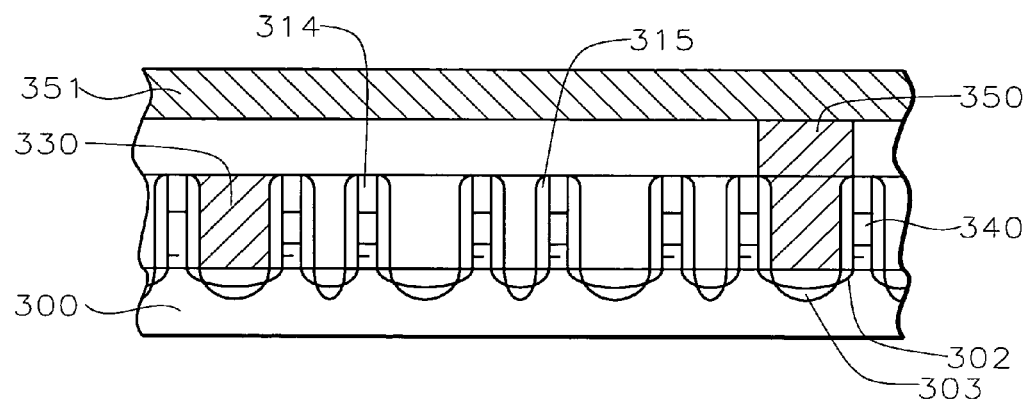
Figure 38C:
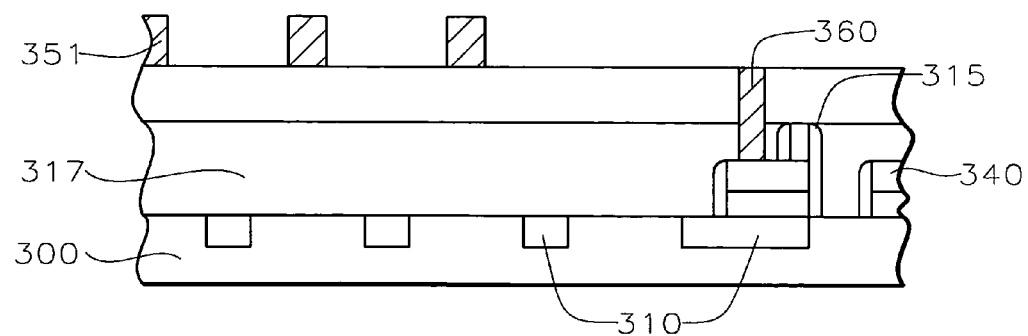

Referring to FIGS. 38A, B, and C, the common source lines 330 to connect underlying diffusion area and bit contact 350 are formed by a tungsten damascene process, individually or simultaneously. Another oxide is deposited. The bit line contact 350 and the control gate contact 360 are formed by a conventional contact process. The first metal 351 connects the bit contact along the bit line. It is followed by the conventional interconnection process and completed.

Figure 39A:
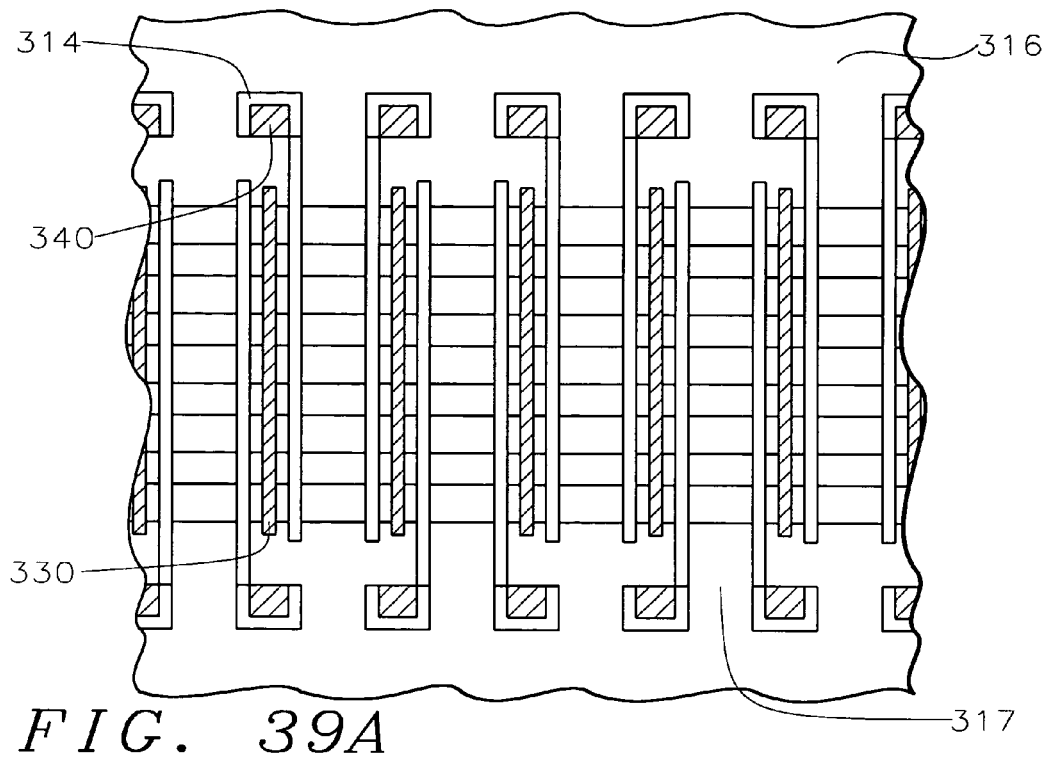
Figure 39B:
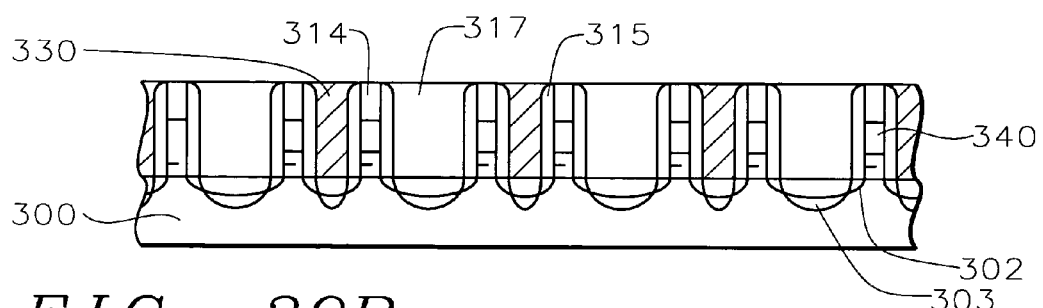
Figure 39C:
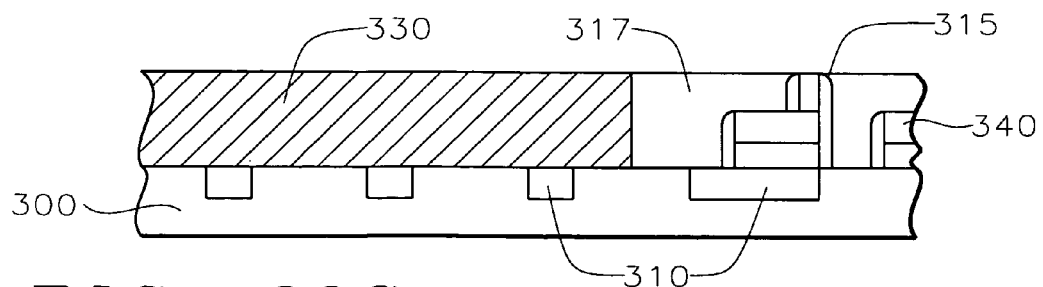
Figure 40A:
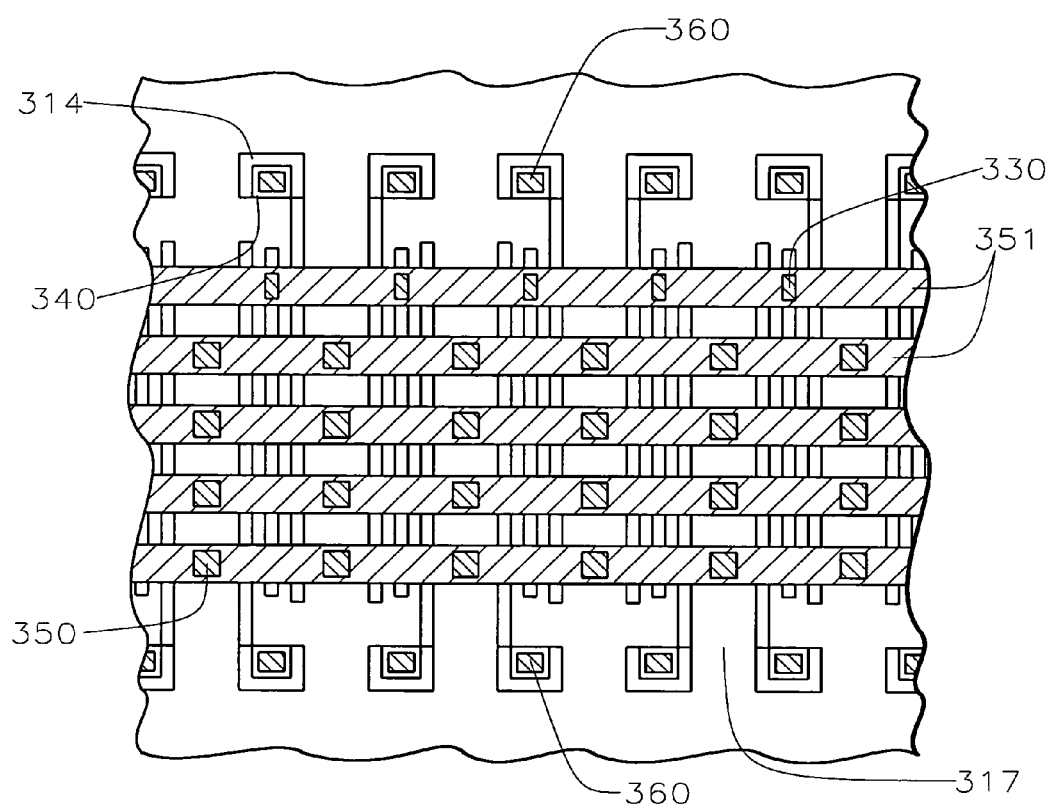
Figure 40B:
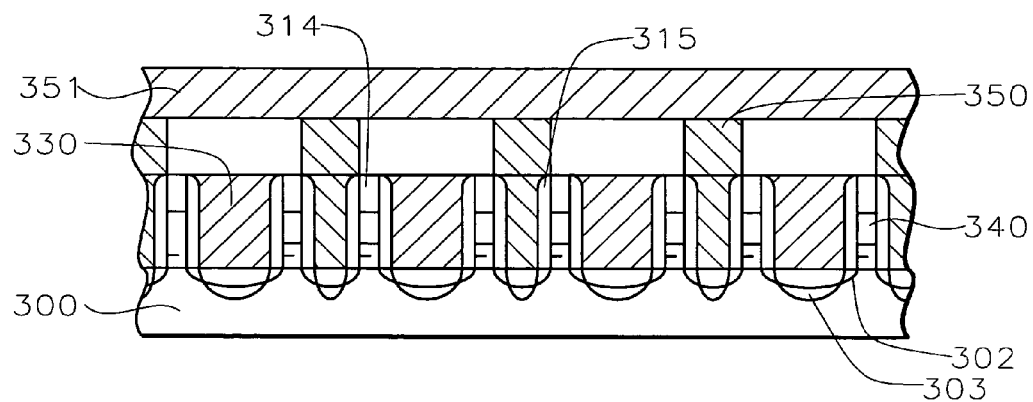
Figure 40C:
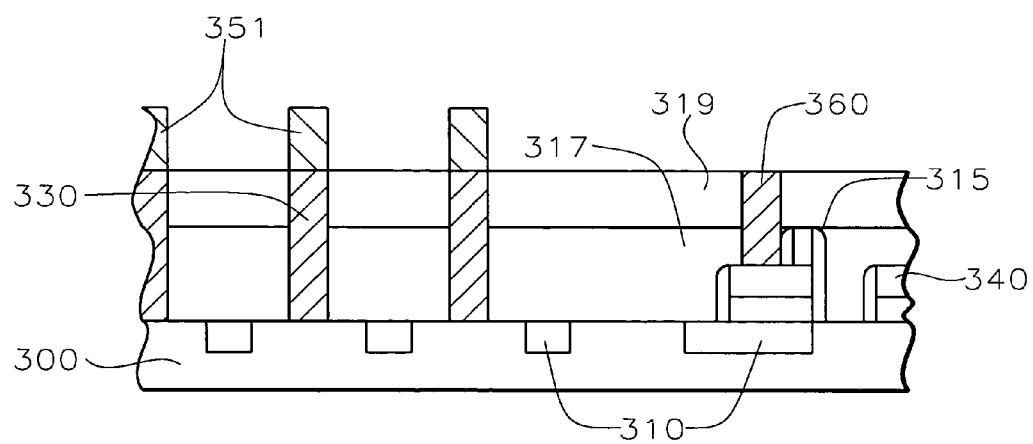

The fifth embodiment in this invention is to modify the fourth embodiment to NOR application to access the individual bit randomly. It may only modify the arrangement of the common source lines 330 formed by local wiring and the bit contacts 350 as shown in FIGS. 39A,B,C and FIGS. 40A,B, C. The diffusion areas on one side of the control gate 340 are connected together with a local contact to make it a common source line. The diffusion areas on the other side are connected to the bit line through the bit contact. An individual memory cell is addressed by selecting a bit line and control gate.

After FIGS. 37A, B, C, trenches 330 are opened in every other oxide 317 between adjacent control gates with conventional lithography and vertical etching to diffusion area 303. Titanium nitride and tungsten are filled in the trench. The excess TiN and Tungsten are removed by CMP to form the common source lines 330. Another oxide 319 is deposited on the planarized surface. The bit contacts 350 are opened over the bit diffusion adjacent to the source lines together with the control gate contact 360 and logic contacts. The bit contacts are connected with $1^{st}$ metal bit line 351.

Figure 41:
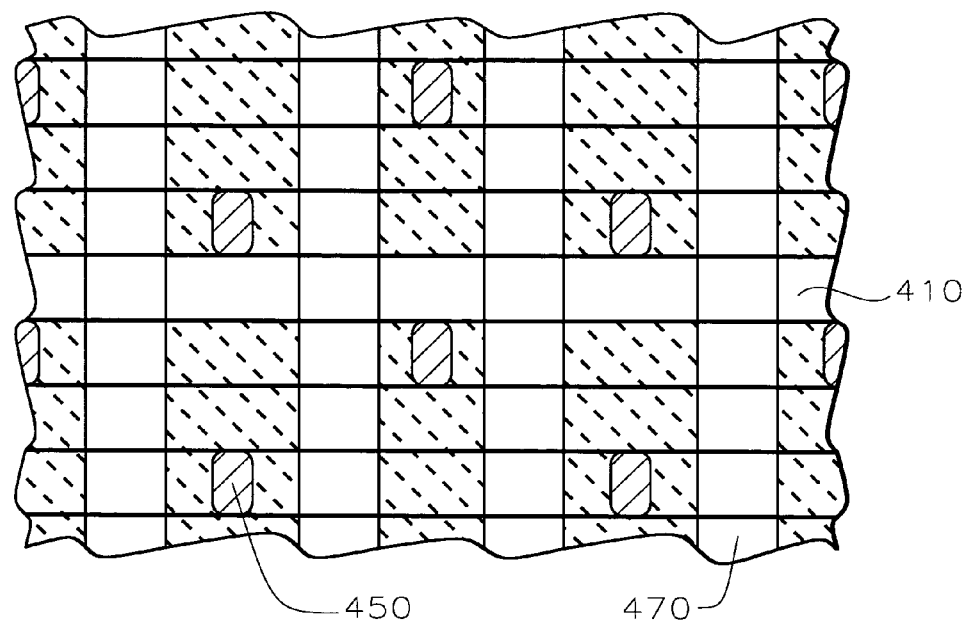
FIG. 41 is a top view of an enlarged portion of the sixth preferred embodiment cell structure of the present invention.

The sixth embodiment is a single gate MONOS as shown in FIG. 41. The memory cell structure is close to NROM. The memory cells have dual memory storage over the p-n junction 401 at each edge of the channel. The cell isolation is STI, different from field implant isolation adapted in NROM. It doesn't have the buried diffusion in NROM. It is derived by only replacing the gate oxide of a conventional MOS FET by ONO 411/412/413.

Figure 42:
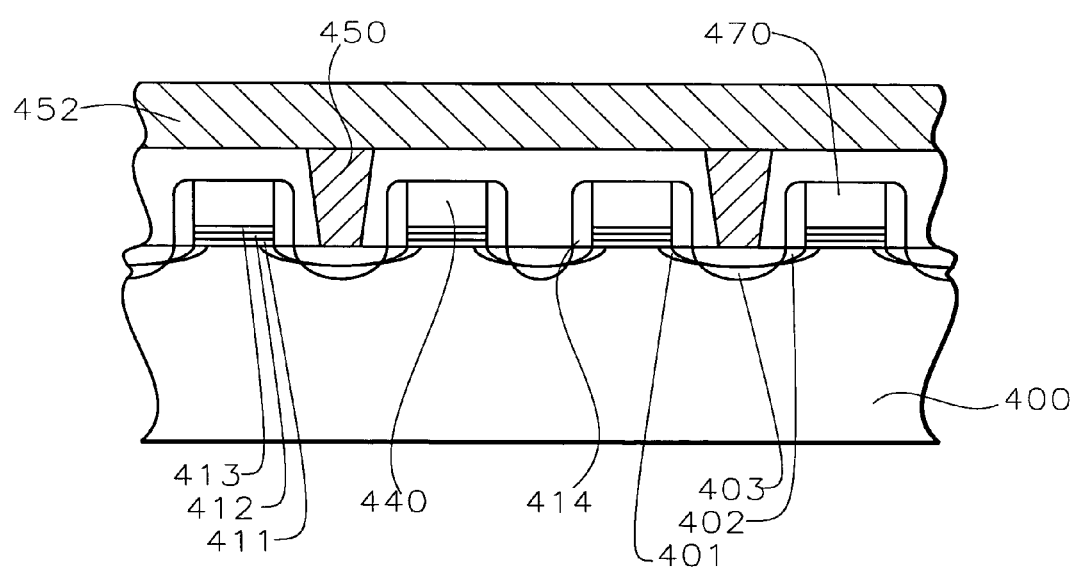
FIG. 42 is a cross-sectional representation of an enlarged portion of the sixth preferred embodiment cell structure of the present invention.

The array structure of the sixth embodiment is shown in FIG. 41 and FIG. 42. The control gate 440 and underlying ONO run crossing STI 410 and active area 400. The bit line 452 also crosses the control gate.

The diffusion area is bounded by the STI 410 and the control gate. Every other diffusion is connected to the bit line through contact 450. The $2^{nd}$ structure is shown in FIG. 41 and FIG. 42. Two metal bit lines are in one STI/Active pitch. Though the active area is wider than prior embodiments and affected by area penalty, the fabrication is simpler than others. It needs only one extra mask compared to base CMOS technology.

Figure 43:
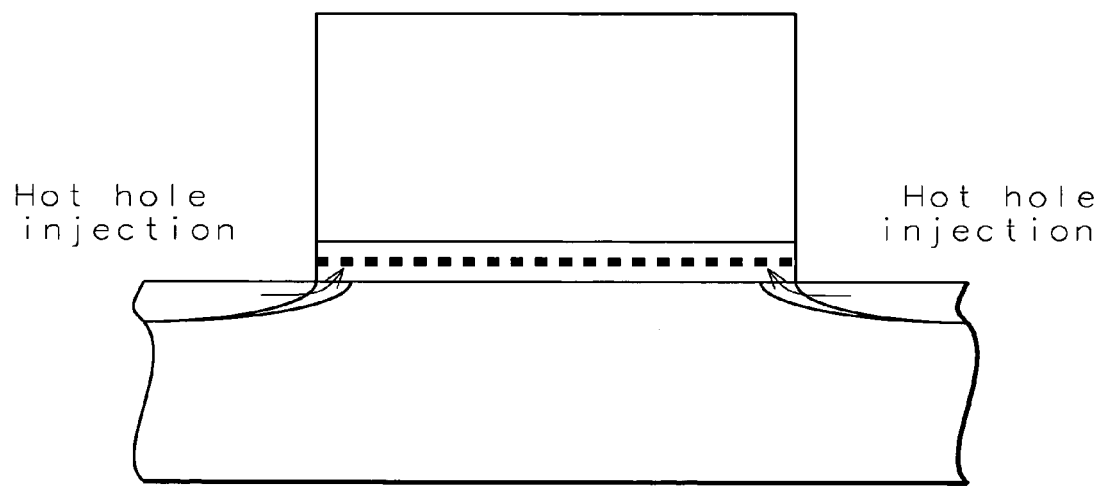
FIG. 43 is a cross-sectional representation of the cell operation of the sixth preferred embodiment of the present invention.
Figure 44:
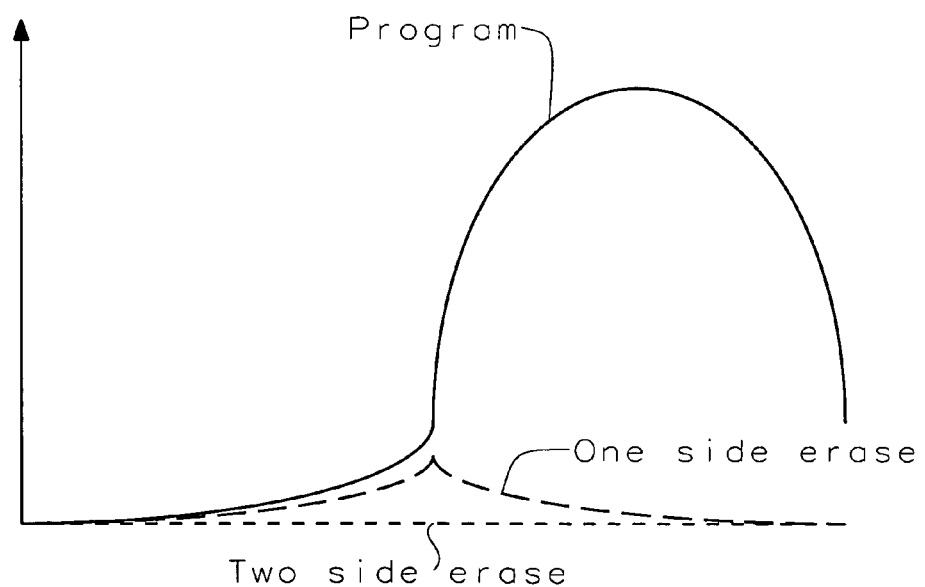
FIG. 44 is a graphical representation of the cell operation of the sixth preferred embodiment of the present invention.

Program operation adapts electron injection into the nitride with channel hot electrons to store the electrons in each side independently. Erase operation is either with hot hole injection or F-N ejection. There arises a concern about enduring the program-erase cycles with this structure. Remaining electrons in the middle of the channel that are out neutralized by hot holes are accumulated during the cycle. The control gate Vt is going up. It is one of the solutions to inject hot holes from not only one side but also from the other side of the channel as shown in FIGS. 43 and 44.

While the invention has been particularly shown and described with reference to the preferred embodiments thereof, it will be understood by those skilled in the art that various changes in form and details may be made without departing from the spirit and scope of the invention.

What is claimed is:

1. A method of device operation of a twin MONOS memory comprising:
   polysilicon word gates having polysilicon control gates on sidewalls of said word gates having an L-shaped oxide-nitride-oxide (ONO) layer between said polysilicon word gates and said polysilicon control gates and underlying said control gates wherein said nitride portion of said ONO layer underlying said control gates provides memory storage;
   wherein said method of device operation comprises:
      performing one hot hole erasure after every n cycles of channel hot electron (CHE) programming and Fowler-Nordheim (F-N) erasure wherein electrons injected by said CHE programming are not perfectly erased by said F-N erasure and remaining said electrons are accumulated with said cycles and wherein said hot holes are generated by band to band transition by applying a negative bias on said word gate and are injected into said nitride portion of said ONO layer not only directly under one of said control gates but also at a corner of said L-shaped ONO layer wherein said hot holes neutralize accumulated said electrons within said nitride portion of said ONO layer at said corner of said L-shaped ONO layer.

2. The operation method according to claim 1 wherein said n is 100 to 1000 cycles.

3. The operation method according to claim 1 wherein the control gate channel length is within the several hole mean free path.

* * * * *

UNITED STATES PATENT AND TRADEMARK OFFICE
CERTIFICATE OF CORRECTION

| | |
|---|---|
| PATENT NO. | : 7,382,662 B2 |
| APPLICATION NO. | : 11/409247 |
| DATED | : June 3, 2008 |
| INVENTOR(S) | : Seiki Ogura, Kimihiro Satoh and Tomoya Saito |

It is certified that error appears in the above-identified patent and that said Letters Patent is hereby corrected as shown below:

Title Page, Inventors, (75) replace first inventor, "Seiki Ogura, Wappingers Falls, NY (US)" with -- Seiki Ogura, Hopewell Junction, NY (US) --.

Column 6, Line 32-35, delete "FIG. 9C to FIG. 20C show cross-sectional views along B-B' of FIG. 9A of the process flow proposed in the second preferred embodiment of this invention." and replace with --FIGS. 9C to FIGS. 20C and 22C show cross-sectional views along B-B' of FIG. 9A of the process flow proposed in the second preferred embodiment of this invention. --.

Signed and Sealed this

Twenty-first Day of October, 2008

JON W. DUDAS
*Director of the United States Patent and Trademark Office*